US008581309B2

(12) United States Patent
Yamazaki et al.

(10) Patent No.: US 8,581,309 B2
(45) Date of Patent: Nov. 12, 2013

(54) SEMICONDUCTOR DEVICE

(75) Inventors: Shunpei Yamazaki, Setagaya (JP); Atsuo Isobe, Isehara (JP); Hiromichi Godo, Atsugi (JP); Yutaka Okazaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 89 days.

(21) Appl. No.: 13/277,489

(22) Filed: Oct. 20, 2011

(65) Prior Publication Data
US 2012/0032236 A1    Feb. 9, 2012

Related U.S. Application Data

(63) Continuation of application No. 12/209,739, filed on Sep. 12, 2008, now Pat. No. 8,044,464.

(30) Foreign Application Priority Data

Sep. 21, 2007   (JP) ................................. 2007-244821

(51) Int. Cl.
*H01L 27/092* (2006.01)
(52) U.S. Cl.
USPC .................... 257/255; 257/351; 257/E27.062
(58) Field of Classification Search
USPC .................... 257/255, 351, E27.062
See application file for complete search history.

(56) References Cited

U.S. PATENT DOCUMENTS

| | | | |
|---|---|---|---|
| 4,472,729 A | 9/1984 | Shibata et al. | |
| 4,933,298 A | 6/1990 | Hasegawa | |

(Continued)

FOREIGN PATENT DOCUMENTS

| | | |
|---|---|---|
| JP | 05-090117 A | 4/1993 |
| JP | 07-297377 A | 11/1995 |

(Continued)

OTHER PUBLICATIONS

Jung et al., "Highly Cost Effective and High Performance 65nm $S^3$ (Stacked Single-crystal Si) SRAM Technology with $25F^2$, $0.16um^2$ Cell and Doubly Stacked Sstft Cell Transistors for Ultra High Density and High Speed Applications," 2005 Symposium on VLSI Technology Digest of Technical Papers, pp. 220-221.

(Continued)

*Primary Examiner* — Long Pham
(74) *Attorney, Agent, or Firm* — Eric J. Robinson; Robinson Intellectual Property Law Office, P.C.

(57) ABSTRACT

An object is to realize high performance and low power consumption in a semiconductor device having an SOI structure. In addition, another object is to provide a semiconductor device having a high performance semiconductor element which is more highly integrated. A semiconductor device is such that a plurality of n-channel field-effect transistors and p-channel field-effect transistors are stacked with an interlayer insulating layer interposed therebetween over a substrate having an insulating surface. By controlling a distortion caused to a semiconductor layer due to an insulating film having a stress, a plane orientation of the semiconductor layer, and a crystal axis in a channel length direction, difference in mobility between the n-channel field-effect transistor and the p-channel field-effect transistor can be reduced, whereby current driving capabilities and response speeds of the n-channel field-effect transistor and the p-channel field-effect can be comparable.

24 Claims, 24 Drawing Sheets

(56) References Cited

U.S. PATENT DOCUMENTS

| | | |
|---|---|---|
| 5,028,976 A | 7/1991 | Ozaki et al. |
| 5,422,302 A | 6/1995 | Yonehara et al. |
| 5,643,801 A | 7/1997 | Ishihara et al. |
| 5,877,034 A | 3/1999 | Ramm et al. |
| 5,976,953 A | 11/1999 | Zavracky et al. |
| 6,037,635 A | 3/2000 | Yamazaki |
| 6,372,609 B1 | 4/2002 | Aga et al. |
| 6,380,046 B1 | 4/2002 | Yamazaki |
| 6,380,558 B1 | 4/2002 | Yamazaki et al. |
| 6,424,020 B1 | 7/2002 | Vu et al. |
| 6,645,826 B2 | 11/2003 | Yamazaki et al. |
| 6,717,180 B2 | 4/2004 | Yamazaki et al. |
| 6,821,826 B1 | 11/2004 | Chan et al. |
| 6,908,797 B2 | 6/2005 | Takano |
| 7,015,505 B2 | 3/2006 | Yamazaki et al. |
| 7,052,974 B2 | 5/2006 | Mitani et al. |
| 7,105,394 B2 | 9/2006 | Hachimine et al. |
| 7,132,686 B2 | 11/2006 | Yamazaki et al. |
| 7,199,024 B2 | 4/2007 | Yamazaki |
| 7,298,009 B2 | 11/2007 | Yan et al. |
| 7,312,487 B2 | 12/2007 | Alam et al. |
| 7,332,384 B2 | 2/2008 | Buchholtz et al. |
| 7,476,577 B2 | 1/2009 | Yamazaki et al. |
| 7,923,781 B2 | 4/2011 | Ohnuma |
| 7,982,250 B2 | 7/2011 | Yamazaki et al. |
| 2002/0179905 A1 | 12/2002 | Colavito et al. |
| 2004/0217433 A1 | 11/2004 | Yeo et al. |
| 2005/0260800 A1 | 11/2005 | Takano |
| 2006/0049430 A1 | 3/2006 | Kasai et al. |
| 2006/0125013 A1 | 6/2006 | Rim |
| 2009/0050941 A1 | 2/2009 | Yamazaki et al. |

FOREIGN PATENT DOCUMENTS

| | | |
|---|---|---|
| JP | 10-326895 A | 12/1998 |
| JP | 11-163363 | 6/1999 |
| JP | 2000-124092 | 4/2000 |
| JP | 2003-234474 A | 8/2003 |
| JP | 2003-249661 A | 9/2003 |
| JP | 2003-273240 | 9/2003 |
| JP | 2005-039171 A | 2/2005 |

OTHER PUBLICATIONS

Hayashi, et al., "A New Three Dimensional IC Fabrication Technology, Stacking Thin Film Dual-CMOS Layers," IEDM 1991, pp. 657-660.

157  162  151  159

158  165

166

167

168  169

SEMICONDUCTOR DEVICE

BACKGROUND OF THE INVENTION

1. Field of the Invention

The present invention relates to semiconductor devices having a so-called SOI (silicon on insulator) structure in which a semiconductor layer is provided on an insulating surface.

2. Description of the Related Art

As an alternative to an integrated circuit using a silicon wafer which is manufactured by thinly slicing a single-crystal semiconductor ingot, an integrated circuit using a semiconductor substrate which is referred to as a silicon on insulator (hereinafter also referred to as "SOI") in which a thin single-crystal semiconductor layer is provided on an insulating surface has been developed. The integrated circuit using an SOI substrate has attracted attention as a semiconductor integrated circuit which reduces parasitic capacitance between a transistor and the substrate and improves the performance of a semiconductor integrated circuit.

As a method for manufacturing SOI substrates, a hydrogen ion implantation separation method is known (e.g., see Reference 1: Japanese Published Patent Application No. 2000-124092). A hydrogen ion implantation separation method is a method by which hydrogen ions are implanted into a silicon wafer to form a microbubble layer at a predetermined depth from the surface, and the microbubble layer is used as a cleavage plane to bond a thin silicon layer to another silicon wafer. In addition to performing heat treatment for separation of a silicon layer, it is necessary to perform heat treatment in oxidizing atmosphere in order to form an oxide film on the silicon layer, to remove the oxide film, and then to perform heat treatment at from 1000 to 1300° C. to increase bonding strength.

On the other hand, a semiconductor device in which an insulating substrate such as high heat resistance glass is provided with a silicon layer is disclosed (e.g., see Reference 2: Japanese Published Patent Application No. H11-163363). This semiconductor device has a structure in which the entire surface of a crystallized glass having a distortion point of 750° C. or more is protected by an insulating silicon film, and a silicon layer obtained by a hydrogen ion implantation separation method is fixed to the insulating silicon film.

SUMMARY OF THE INVENTION

Microfabrication has been a road map for technical development in a field of semiconductor devices, and thus, the field of the semiconductor devices has been developed. So far, as the semiconductor devices are miniaturized, higher speed operation can be realized, and thus low power consumption has been achieved.

However, there is a need for achieving higher performance and lower power consumption of semiconductor devices without depending on only a microfabrication technique.

In a transistor in which the above-described SOI substrate is used, carrier mobility of a p-channel transistor is lower compared to carrier mobility of an n-channel transistor. When carrier mobility is different between the n-channel transistor and the p-channel transistor, the current driving capability is different between the n-channel transistor and the p-channel transistor each having the same area. Therefore, the response speed is also different between the n-channel transistor and the p-channel transistor.

In order to make the response speed of the p-channel transistor comparable to that of the n-channel transistor, it is necessary to make a channel width of the p-channel transistor wider than a channel width of the n-channel transistor. Therefore, an area occupied by the n-channel transistor and an area occupied by the p-channel transistor become unbalanced. As a result, there is a space unnecessary for a circuit arrangement and semiconductor devices have been prevented from being highly integrated.

Accordingly, it is an object to achieve higher performance and lower power consumption in semiconductor devices having an SOI structure. In addition, it is another object to provide semiconductor devices including more highly integrated and higher performance semiconductor elements.

A plurality of semiconductor elements such as n-channel field-effect transistors and p-channel field-effect transistors which include a semiconductor layer which is separated from a semiconductor substrate and is bonded to a supporting substrate having an insulating surface are stacked with an insulating layer interposed therebetween.

In the present invention, by controlling a distortion caused to a channel formation region of a semiconductor layer, a plane orientation of the semiconductor layer, and a crystal axis in a channel length direction, difference in mobility between an n-channel field-effect transistor and a p-channel field-effect transistor which are included in a semiconductor device is reduced, and current driving capabilities and switching speeds of the n-channel field-effect transistor and the p-channel field-effect transistor are more comparable to each other. Therefore, an area occupied by the n-channel field-effect transistor and an area occupied by the p-channel field-effect transistor can be nearly comparable, whereby efficiency of circuit design is improved and smaller semiconductor devices with higher integration and higher performance can be provided.

The distortion is caused to the channel formation region of the semiconductor layer by forming an insulating film over the semiconductor layer, and the distortion caused to the channel formation region of the semiconductor layer can be controlled to be either a compressive distortion or a tensile distortion depending on which stress the insulating film has, a compressive stress or a tensile stress. In the present invention, the distortion is caused to the channel formation region of the semiconductor layer at least in a channel length direction.

By causing a distortion appropriate to a conductivity type of a field-effect transistor in a channel length direction of a semiconductor layer, mobility of the field-effect transistor can be improved. For example, when a p-channel field-effect transistor is a distortion transistor in which a compressive distortion is caused to a channel formation region of a semiconductor layer, mobility can be improved.

Since a semiconductor layer which is separated and transferred from a semiconductor substrate is used, a crystal plane orientation and a crystal axis of a channel length direction in the field-effect transistor can be controlled by selecting a semiconductor substrate. By employing an appropriate crystal plane orientation and an appropriate crystal axis, the carrier effective mass is decreased and mobility of the field-effect transistor can be improved. Therefore, higher performance field-effect transistor can be realized.

The term "channel length" used herein means a length (width) of a channel formation region in a direction parallel to a direction in which carriers flow. The term "channel width" used herein means a length (width) of a channel formation region in a direction perpendicular to a direction in which carriers flow.

A semiconductor layer in a lower layer and a semiconductor layer in an upper layer which are stacked with a gate insulating layer, an insulating layer, an insulating film in the upper layer, and the like interposed therebetween are electrically connected by a wiring layer which penetrates the gate insulating layer, an interlayer insulating layer, and the insulating layer in the upper layer. In the case where the semiconductor layer in the lower layer and the semiconductor layer in the upper layer are stacked so as to be overlapped with each other, the wiring layer may be formed to penetrate the semiconductor layer in the upper layer and to be in contact with the semiconductor layer in the lower layer. If semiconductor layers are stacked closely so as to be overlapped with each other, higher integration of the semiconductor device can be achieved.

Since a high performance semiconductor element can have a stacked structure, a semiconductor device can be more highly integrated. Accordingly, the circuit area of the more highly integrated semiconductor device is decreased and wiring capacitance is reduced. Therefore, low power consumption can be realized.

After formation of a semiconductor element in the lower layer, an interlayer insulating layer which covers the semiconductor element in the lower layer is formed and an insulating layer which is bonded to a semiconductor layer in the upper layer is formed over the interlayer insulating layer. Therefore, a bond between the semiconductor layer of the semiconductor element in the upper layer and the insulating layer is facilitated, whereby the reliability of the semiconductor device and the yield can be improved.

In addition, when the semiconductor layers of field-effect transistors are bonded to different insulating layers, parasitic capacitance of the semiconductor layers or parasitic capacitance of gate electrode layers of the field-effect transistors can be reduced.

A mode of a semiconductor device according to the present invention is a semiconductor device including a substrate having an insulating surface; a first field-effect transistor having a first semiconductor layer, a first gate insulating layer, and a first gate electrode layer, over the substrate having the insulating surface; a first insulating film which covers the first field-effect transistor; an interlayer insulating layer over the first insulating film; a second field-effect transistor having a second semiconductor layer, a second gate insulating layer, and a second gate electrode layer, over the interlayer insulating layer; and a second insulating film which covers the second field-effect transistor, and which have a stacked structure. The first semiconductor layer of the first field-effect transistor is bonded to the first insulating layer formed between the first semiconductor layer and the substrate having the insulating surface and is provided over the substrate having the insulating surface. The second semiconductor layer of the second field-effect transistor is bonded to the second insulating layer provided over the interlayer insulating layer and is provided over the first field-effect transistor. In the case where the conductivity type of the first field-effect transistor is an n-type and the conductivity type of the second field-effect transistor is a p-type, the second insulating film has a compressive stress.

In n-channel and p-channel semiconductor layers, it is preferable that a plane orientation of a surface which is parallel to an insulating surface be {110} and a crystal axis in a channel length direction be <110>. This is because difference in mobility between the n-channel field-effect transistor and the p-channel field-effect transistor can be reduced.

Higher performance and lower power consumption can be achieved in semiconductor devices having an SOI structure. In addition, efficiency of circuit design is improved so that a circuit area is decreased, whereby smaller semiconductor devices can be provided and semiconductor devices including more highly integrated and higher performance semiconductor elements can be provided.

DETAILED DESCRIPTION OF THE INVENTION

Embodiment Mode

Figure 1A:
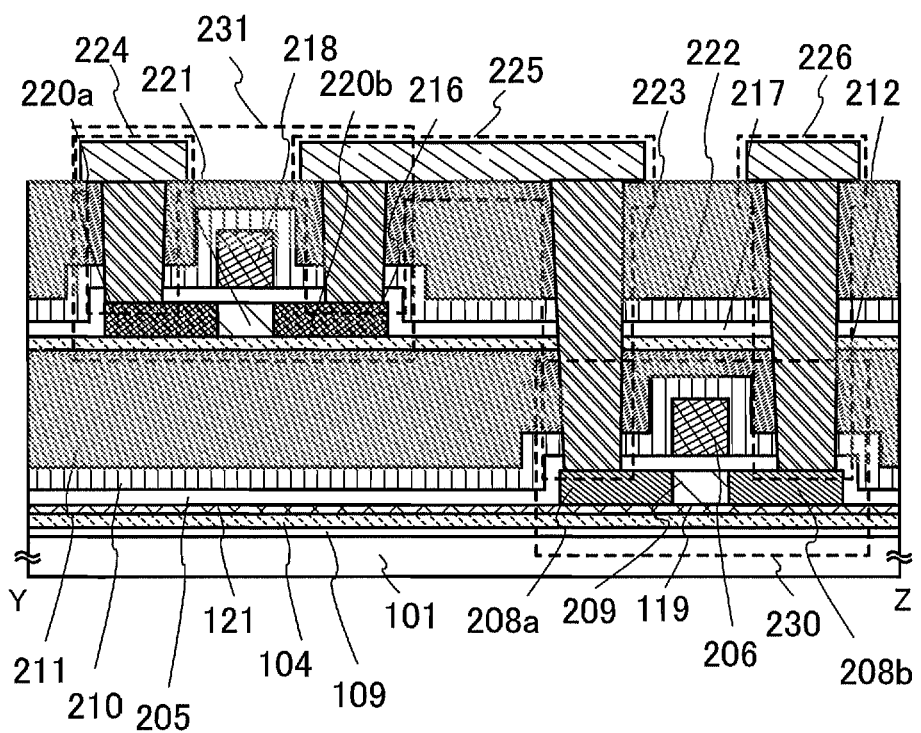
FIGS. 1A and 1B illustrate a semiconductor device of the present invention.

Embodiment modes of the present invention are described in detail with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiment modes to be given below. Note that in a structure of the present invention described below, like portions or portions having like functions in different drawings are denoted by the like reference numerals and repeated description thereof is omitted.

(Embodiment Mode 1)

A method for manufacturing a semiconductor device of the present invention is described with reference to FIGS. 1A and 1B, FIGS. 2A and 2B, FIGS. 3A to 3D, and FIGS. 4A to 4D. This embodiment mode describes a complementary metal oxide semiconductor (CMOS) as an example of semiconductor devices which include more highly integrated and higher performance semiconductor elements.

In this embodiment mode, semiconductor elements having a semiconductor layer which is separated from a semiconductor substrate and is bonded to a supporting substrate having an insulating surface are stacked with an insulating layer interposed therebetween. The semiconductor element which is to be stacked includes a semiconductor element having a semiconductor layer in which a distortion is caused to a channel formation region by an insulating film. A single-crystal semiconductor substrate is preferably used as the semiconductor substrate, and a single-crystal semiconductor layer is preferably formed as the semiconductor layer which is separated from the semiconductor substrate and is bonded to the supporting substrate.

FIG. 1A illustrates a semiconductor device of this embodiment mode. A blocking layer 109, an insulating layer 104, a protective layer 121, a field-effect transistor 230, an insulating film 210, an interlayer insulating layer 211, an insulating layer 212, a field-effect transistor 231, an insulating film 222, and an interlayer insulating layer 223 are formed over a supporting substrate 101 having an insulating surface. The field-effect transistor 230 and the field-effect transistor 231 are thin film transistors which include a thin semiconductor layer. The field-effect transistor 230 includes a semiconductor layer 119 which includes impurity regions 208a and 208b, which are a source region and a drain region, and a channel formation region 209, a gate insulating layer 205, and a gate electrode layer 206. The field-effect transistor 231 includes a semiconductor layer 216 which includes impurity regions 220a and 220b, which are a source region and a drain region, and a channel formation region 221, a gate insulating layer 217, and a gate electrode layer 218. A wiring layer 226 is formed to be in contact with the impurity region 208b. A wiring layer 224 is formed to be in contact with the impurity region 220a. A wiring layer 225 which is formed to be in contact with the impurity region 208a and the impurity region 220b electrically connects the field-effect transistor 230 and the field-effect transistor 231.

Figure 23:
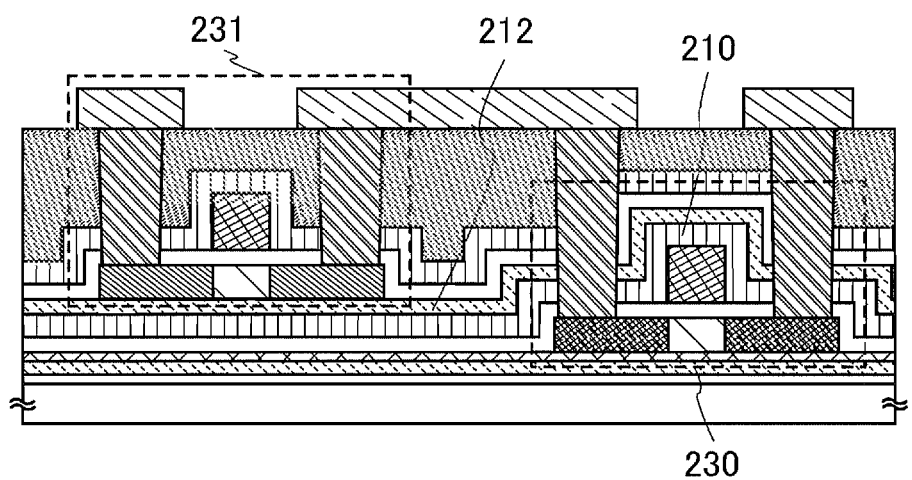
FIG. 23 illustrates a semiconductor device of the present invention.

Although FIG. 1A illustrates an example of a semiconductor device in which the interlayer insulating layer 211 is formed over the field-effect transistor 230 in order to planarize irregularities due to the field-effect transistor 230, it is not necessary to form the interlayer insulating layer 211 as in a semiconductor device illustrated in FIG. 23. In the semiconductor device illustrated in FIG. 23, the insulating layer 212 which is bonded to the semiconductor layer 216 is formed to be in contact with the insulating film 210 over the field-effect transistor 230.

Figure 1B:
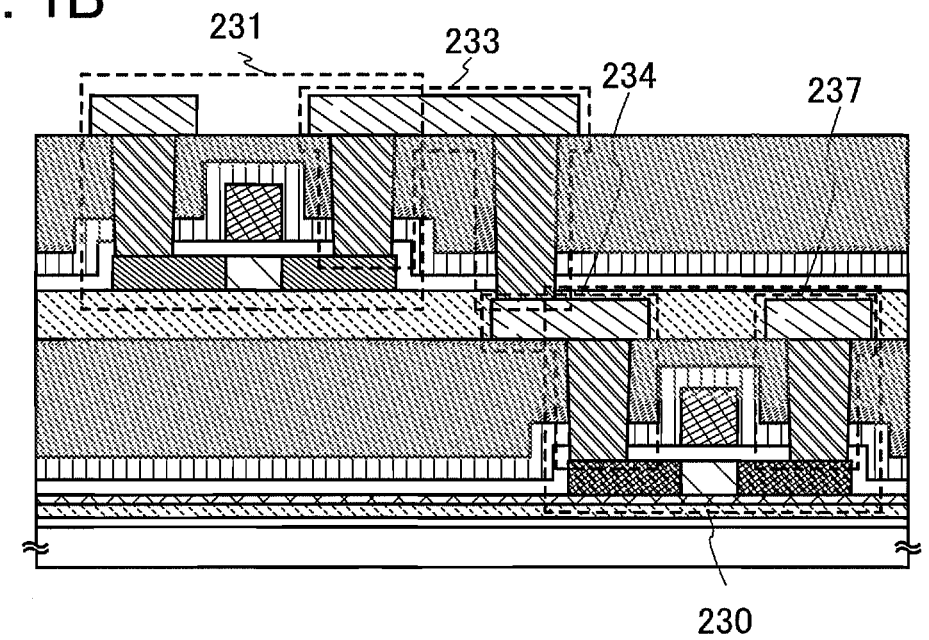

FIG. 1A illustrates an example of a semiconductor device in which the wiring layer 225 and the wiring layer 226 are formed in an opening (a contact hole) which successively penetrates the gate insulating layer 205, the insulating film 210, the interlayer insulating layer 211, the insulating layer 212, the gate insulating layer 217, the insulating film 222, and the interlayer insulating layer 223. FIG. 1B illustrates another example of electrical connection between the field-effect transistor 230 and the field-effect transistor 231.

Figure 2A:
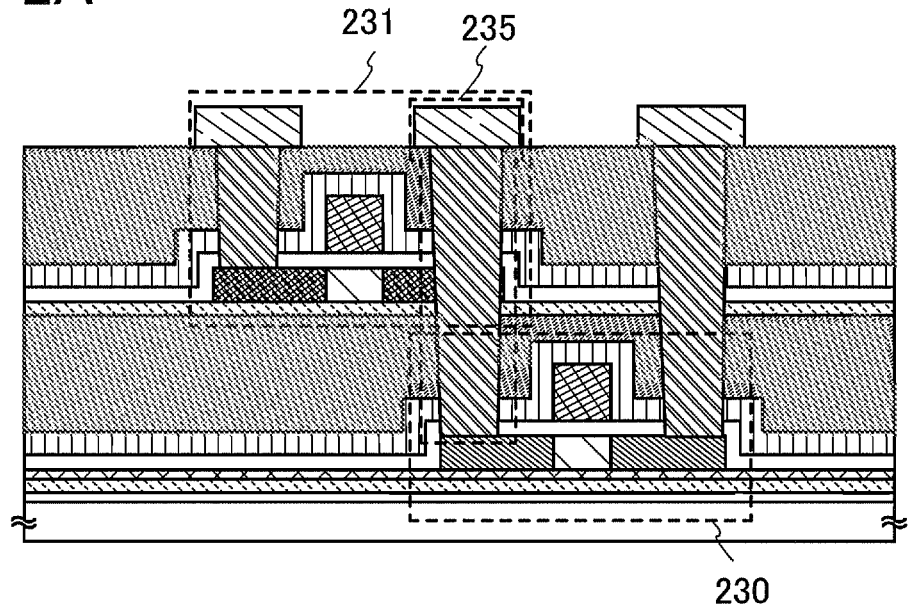
FIGS. 2A and 2B illustrate a method for manufacturing a semiconductor device of the present invention.
Figure 2B:
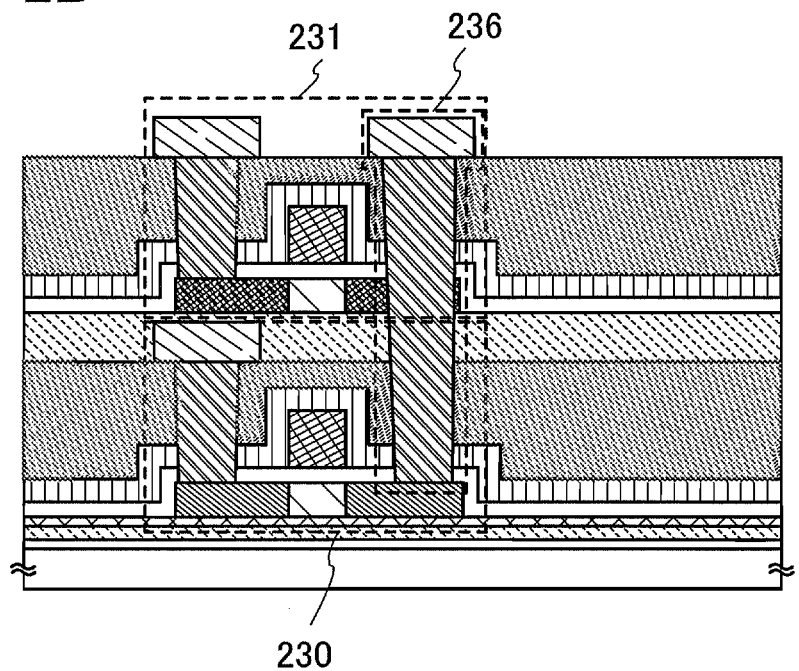

The wiring layers 224, 225, and 226 have a stacked structure in which wiring layers 240a, 240b, 240c, and 240d which are embedded wiring layers are formed to fill openings which are contact holes and then wiring layers 241a, 241b, and 241c are formed over the embedded wiring layers. The wiring layers may include a barrier metal film or a seed film in the openings. Wiring layers 233, 235, and 236 in FIG. 1B and FIGS. 2A and 2B are wiring layers having a stacked structure similar to the wiring layers 224, 225, and 226.

Figure 21A:
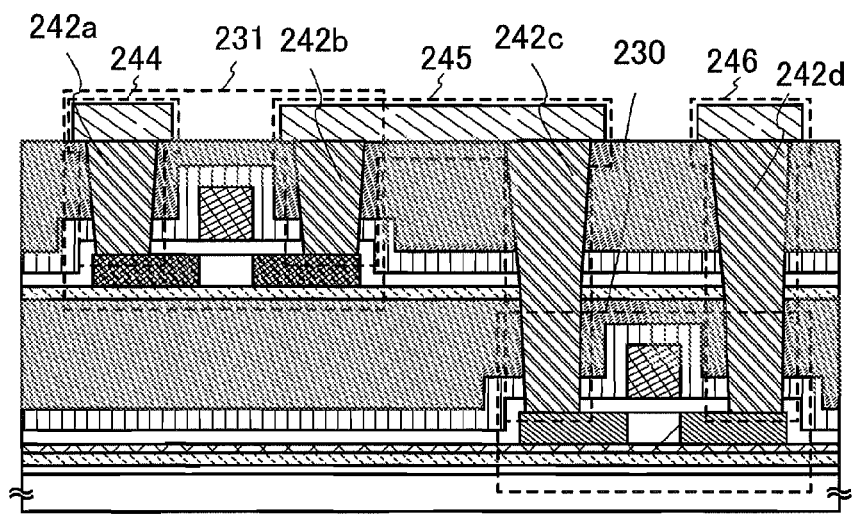
FIGS. 21A and 21B illustrate a semiconductor device of the present invention.

In the case where a contact hole which penetrates a plurality of layers is formed, a side surface of the contact hole may have a plurality of taper angles. For example, in the case where an etching process includes a plurality of steps which employ different etching gasses, taper angles and diameters of an opening may be varied depending on the etching conditions. FIG. 21A illustrates an example in which a wiring layer is formed in a contact hole having a plurality of taper angles. In a semiconductor device in FIG. 21A, contact holes in which wiring layers 242c and 242d which are embedded wiring layers connected to the wiring layers 245 and 246 are formed has a first opening which is formed in the gate insulating layer 205, the insulating film 210, the interlayer insulating layer 211, and the insulating layer 212; and a second opening which is formed in the gate insulating layer 217, the insulating film 222, and the interlayer insulating layer 223. The first opening and the second opening are different in shape and the taper angle of the second opening is larger than that of the first opening.

Figure 21B:
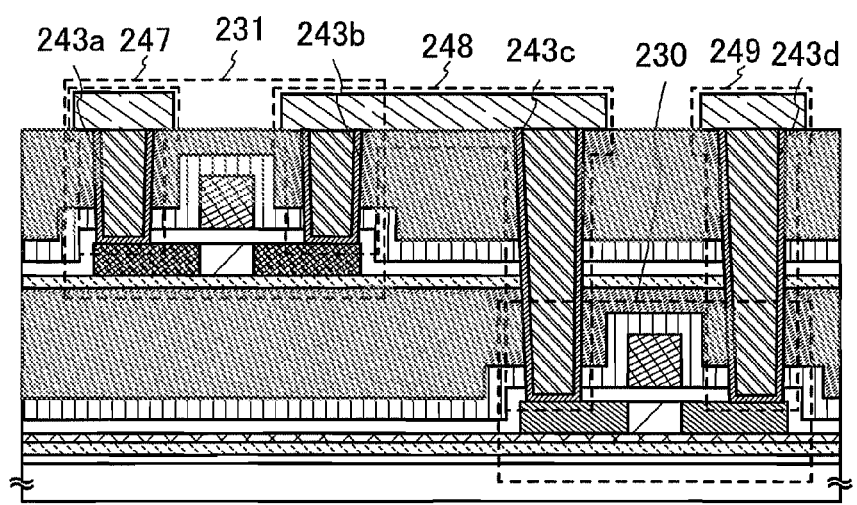

The wiring layer may include a barrier metal film or a seed film in the openings. An example in which a barrier metal film is formed is illustrated in FIG. 21B. In a semiconductor device in FIG. 21B, barrier metal films 243a, 243b, 243c, and 243d are in contact with the side and bottom surfaces of contact holes.

A semiconductor device in FIG. 1B is an example in which after the interlayer insulating layer 211 which covers the field-effect transistor 230 is formed, openings which reach the impurity regions 208a and 208b are formed in the gate insulating layer 205, the insulating film 210, and the interlayer insulating layer 211, and wiring layers 234 and 237 which are connected to the impurity regions 208a and 208b, respectively, are formed. The wiring layer 233 which is formed to be in contact with the impurity region 220b of the field-effect transistor 231 and the wiring layer 234 electrically connects the field-effect transistor 231 in the upper layer and the field-effect transistor 230 in the lower layer. In the case of FIG. 1B, another interlayer insulating layer may be formed over the wiring layers 234 and 237 to planarize irregularities due to the wiring layers 234 and 237 before the insulating layer 212 is formed. In FIG. 1B, the insulating layer 212 is formed to be thick so as to serve as an interlayer insulating layer.

Further, the order of stacking layers of n-channel and p-channel field-effect transistors which are included in a semiconductor device is not limited. FIG. 1A illustrates an example in which the field-effect transistor 230 which is an n-channel field-effect transistor including n-type impurity regions as the impurity regions 208a and 208b is formed in the lower layer and the field-effect transistor 231 which is a p-channel field-effect transistor including p-type impurity regions as the impurity regions 220a and 220b is formed in the upper layer. On the other hand, FIG. 1B illustrates an example in which the field-effect transistor 230 which is a p-channel field-effect transistor including p-type impurity regions as the impurity regions 208a and 208b is formed in the lower layer and the field-effect transistor 231 which is an n-channel field-effect transistor including n-type impurity regions as the impurity regions 220a and 220b is formed in the upper layer.

In this embodiment mode, the field-effect transistor 231 is a distortion transistor in which a distortion is caused to the channel formation region of the semiconductor layer 216 by the insulating film 222. The distortion can be caused to the channel formation region of the semiconductor layer by forming an insulating film over the semiconductor layer. Further, the distortion caused to the channel formation region of the semiconductor layer can be controlled to be either a compressive distortion or a tensile distortion depending on which stress the insulating film has, a compressive stress or a tensile stress.

By causing a distortion appropriate to the conductivity type in the channel length direction of the semiconductor layer of the p-channel field-effect transistor which has low mobility, mobility of the p-channel field-effect transistor can be improved, and difference in mobility with the n-channel field-effect transistor can be reduced. When the p-channel field-effect transistor is a distortion transistor in which a compressive distortion is caused to the channel formation region of the semiconductor layer, mobility can be improved.

Therefore, in the semiconductor device of FIG. 1A, since the field-effect transistor 231 is a p-channel transistor, an insulating film which has a compressive stress may be used as the insulating film 222.

Figure 24:
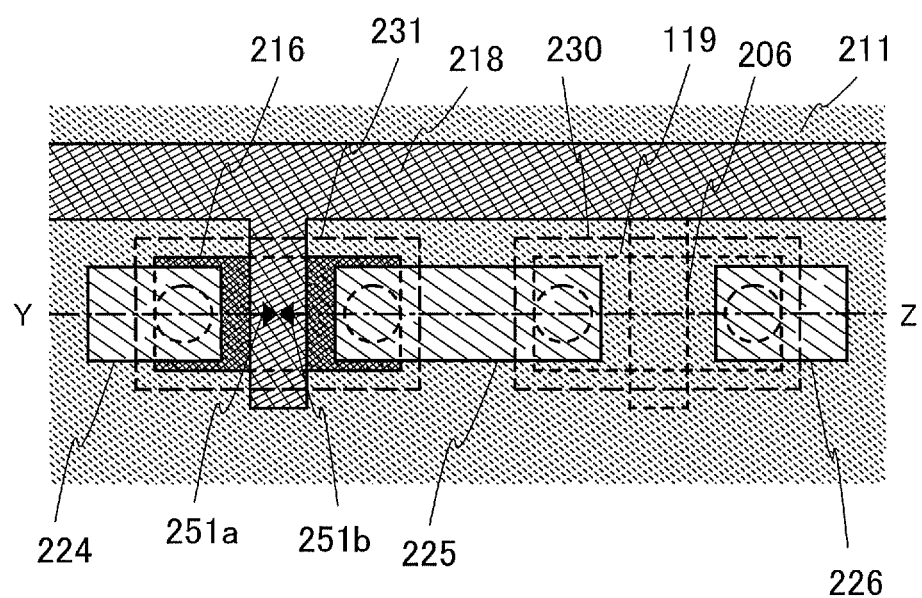
FIG. 24 illustrates a semiconductor device of the present invention.

FIG. 24 is a plan view of the semiconductor device in FIG. 1A, and FIG. 1A is a cross-sectional view of the semiconductor device taken along a line Y-Z in FIG. 24. Note that in FIG. 24, the insulating film 222 and the interlayer insulating layer 223 are omitted, and the field-effect transistor 230 under the insulating layer 212 is indicated by a dotted line. FIG. 24 schematically illustrates a stress which is applied to the channel formation region of the semiconductor layer 216 by arrows. A strong distortion is not particularly caused to the semiconductor layer 119 of the field-effect transistor 230 which is an n-channel field-effect transistor. On the other hand, a compressive distortion in a direction indicated by an arrow 251a and an arrow 251b is caused to the channel formation region 221 of the semiconductor layer 216 of the field-effect transistor 231 which is a p-channel field-effect transistor due to a compressive stress of the insulating film 222. In this manner, a compressive distortion is particularly caused to a p-channel field-effect transistor in order to improve mobility, whereby difference in mobility between the n-channel field-effect transistor and the p-channel field-effect transistor can be reduced. In addition, a distortion may also be caused to the n-channel field-effect transistor in a direction in which mobility is suppressed (a tensile distortion or a compressive distortion).

The insulating film 210 and the insulating film 222 can be formed by a CVD method (a plasma CVD method or a thermal CVD method), a sputtering method, or the like, and a stress can be controlled by the formation conditions (a reaction gas, pressure, temperature, high-frequency electric power, etc.). A nitride film can be used as the insulating films 210 and 222, for example, a silicon nitride film, a silicon nitride film including oxygen (also referred to as a silicon nitride oxide film), or the like may be used. In this embodiment mode, as the insulating film 222, a silicon nitride film which is formed under conditions which make the silicon nitride film have a desired compressive stress is used.

In addition, when an insulating layer which relieves a stress is used as an insulating layer which is provided between an upper insulating film and a lower insulating film, a semiconductor layer can be prevented from being influenced by an insulating film which is in a different level. Therefore, mobility of a distortion transistor can be controlled more precisely, less separation of a thin film occurs due to difference in stress, and adverse influences on adhesiveness of a thin film due to difference in stress can be reduced, whereby the reliability of the semiconductor device can be improved. As an insulating layer which relieves a stress, an oxide film or the like can be used. For example, a silicon oxide film or a silicon oxide film including nitrogen (also referred to as a silicon oxynitride film) may be used. In this embodiment mode, a silicon oxide film is used as the interlayer insulating layer 211.

Further, in the case where field-effect transistors in which distortions are caused in opposing directions are provided in one semiconductor device, a field-effect transistor to which a tensile distortion is caused and a field-effect transistor to which a compressive distortion is caused are provided in different levels, whereby insulating films which have stresses in opposing directions can be provided without being in contact with each other. Therefore, it is not necessary to design a semiconductor device which has a complicated shape and structure, whereby a high performance and high reliable semiconductor device in which a plurality of distortion transistors are highly integrated can be manufactured with high productivity.

A semiconductor layer in a lower layer and a semiconductor layer in an upper layer which are stacked with a gate insulating layer, an interlayer insulating layer, an insulating layer in the upper layer, and the like interposed therebetween are electrically connected to each other by a wiring layer which penetrates the gate insulating layer, the interlayer insulating layer, and the insulating layer in the upper layer. In the case where the semiconductor layer in the lower layer and the semiconductor layer in the upper layer are stacked so as to be overlapped with each other, the wiring layer may be formed to penetrate the semiconductor layer in the upper layer and to be in contact with the semiconductor layer in the lower layer. If semiconductor layers are stacked closely so as to be overlapped with each other, higher integration of the semiconductor device can be achieved.

FIGS. 2A and 2B illustrate semiconductor devices in which a semiconductor layer in the lower layer and a semiconductor layer in the upper layer are stacked so as to be overlapped with each other. In FIG. 2A, the semiconductor layer 119 (the impurity region 208a) in the field-effect transistor 230 which is the semiconductor element in the lower layer and the semiconductor layer 216 (the impurity region 220b) in the field-effect transistor 231 which is the semiconductor element in the upper layer are stacked so as to be overlapped with each other. The wiring layer 235 which electrically connects the field-effect transistor 230 and the field-effect transistor 231 is formed to penetrate the gate insulating layer 205, the insulating film 210, the interlayer insulating layer 211, the insulating layer 212, the semiconductor layer 216 (the impurity region 220b), the gate insulating layer 217, the insulating film 222, and the interlayer insulating layer 223 and to reach the semiconductor layer 119 (the impurity region 208a).

While FIG. 2A illustrates an example in which the semiconductor layer 119 of the field-effect transistor 230 and the semiconductor layer 216 of the field-effect transistor 231 are partially overlapped with each other, they may be substantially overlapped with each other using the same mask as illustrated in FIG. 2B. In the present invention, since difference in mobility between the n-channel field-effect transistor and the p-channel field-effect transistor is reduced and mobility of the n-channel field-effect transistor and the p-channel field-effect transistor are comparable to each other, semiconductor layers of the n-channel field-effect transistor and the p-channel field-effect transistor can have the same size and shape. The larger the area in which the semiconductor layers are overlapped with each other is, the higher integration can be realized. In the semiconductor device in FIG. 2B, the field-effect transistor 230 and the field-effect transistor 231 are stacked to be almost completely overlapped with each other with the interlayer insulating layer interposed therebetween. The wiring layer 236 which electrically connects the field-effect transistor 230 and the field-effect transistor 231 is formed to penetrate the gate insulating layer 205, the insulating film 210, the interlayer insulating layer 211, the insulating layer 212, the semiconductor layer 216 (the impurity region 220b), the gate insulating layer 217, the insulating film 222, and the interlayer insulating layer 223 and to reach the semiconductor layer 119 (the impurity region 208b).

Since a semiconductor device of the present invention has a structure in which semiconductor elements are stacked three dimensionally and are highly integrated, the semiconductor elements can be aligned side by side and in contact with one insulating layer or they can be stacked in above and below with an interlayer insulating layer interposed therebetween and be in contact with different insulating layers. Therefore, arrangement flexibility of semiconductor elements in the semiconductor device is increased, which can lead to further integration and higher performance. As a semiconductor element, not to mention a field-effect transistor, a memory element which uses a semiconductor layer can be employed; accordingly, a semiconductor device which can meet functions required for various applications can be manufactured and provided.

Further, since a semiconductor element which includes a semiconductor layer separated from a single-crystal semiconductor substrate has no leak current due to grain boundaries which are generated in a crystallization step of an amorphous semiconductor layer to form a polycrystalline semiconductor layer, low power consumption of the semiconductor device can be expected. Further, variation in threshold values of semiconductor elements due to variation in crystal orientation is small. In addition, ridges on the semiconductor layer surface, which is caused by laser crystallization of an amorphous semiconductor layer, are negligible; therefore, a gate insulating layer can be thinned.

In addition, a plurality of field-effect transistors may be formed to be in contact with one insulating layer in the same level, and a plurality of the field-effect transistors may have one conductivity type, or a plurality of the field-effect transistors may have different conductivity types, namely they may be n-channel field-effect transistors and p-channel field-effect transistors.

While this embodiment mode describes a stacked structure of two field-effect transistors, a stacked structure of more than two field-effect transistors may be employed. A plurality of semiconductor elements can be stacked by bonding an insulating layer provided over a substrate and a semiconductor layer.

Since the semiconductor layer which is separated and transferred from the semiconductor substrate is used in this embodiment mode, a crystal plane orientation and a crystal axis of a channel length direction in the field-effect transistor can be controlled by selecting a semiconductor substrate. By employing an appropriate crystal plane orientation and an appropriate crystal axis, the carrier effective mass is decreased and mobility of the field-effect transistor can be improved, and whereby higher performance field-effect transistor can be realized.

By controlling a distortion caused to the channel formation region of the semiconductor layer, a plane orientation of the semiconductor layer, and a crystal axis of a channel length direction, difference in mobility between the n-channel field-effect transistor and the p-channel field-effect transistor is reduced, and current driving capabilities and response speeds of the n-channel field-effect transistor and the p-channel field-effect transistor become more comparable to each other. Therefore, an area occupied by the n-channel field-effect transistor and an area occupied by the p-channel field-effect transistor can be nearly comparable, whereby efficiency of circuit design is improved and smaller semiconductor devices with higher integration and higher performance can be provided.

Hereinafter, a method for manufacturing semiconductor devices of this embodiment mode is described with reference to FIGS. 3A to 3D, FIGS. 4A to 4D, FIGS. 5A to 5E, FIGS. 6A to 6D, FIGS. 7A to 7F, and FIGS. 8A to 8D.

First, a method for providing a semiconductor layer over a supporting substrate having an insulating surface from a semiconductor substrate is described with reference to FIGS. 3A to 3D and FIGS. 4A to 4C.

Figure 3A:
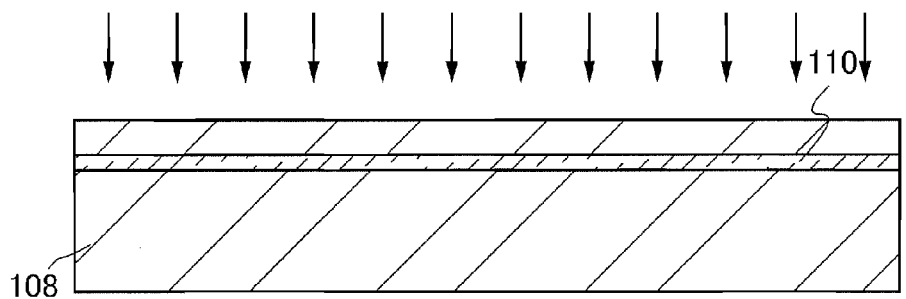
FIGS. 3A to 3D illustrate a method for manufacturing a semiconductor device of the present invention.

A semiconductor substrate 108 illustrated in FIG. 3A is cleaned, and the semiconductor substrate 108 is irradiated with ions that are accelerated by an electric field so as to reach a predetermined depth from the surface of the semiconductor substrate 108 to form a fragile layer 110. Ion irradiation is performed in consideration of the thickness of a semiconductor layer which is to be transferred to a supporting substrate. An accelerating voltage for irradiating the semiconductor substrate 108 with ions is set in consideration of the thickness.

As the semiconductor substrate 108, a semiconductor substrate such as a silicon substrate or a germanium substrate, or a compound semiconductor substrate such as a gallium arsenide substrate or an indium phosphide substrate is used. The semiconductor substrate 108 is preferably a single-crystal semiconductor substrate, but it may be a polycrystalline semiconductor substrate. Further, a semiconductor substrate formed of silicon having a lattice distortion, silicon germanium in which germanium is added to silicon, or the like may be used. Silicon having a distortion can be formed by film formation of silicon on silicon germanium or silicon nitride which has larger lattice constant than silicon. The semiconductor layer which is provided over the supporting substrate can be determined by a semiconductor substrate which is selected to be used as a base.

In addition, the crystal plane orientation of the semiconductor substrate 108 may be selected according to a semiconductor element which is to be formed (a field-effect transistor in this embodiment mode). For example, a semiconductor substrate having a {100} crystal plane orientation, a {110} crystal plane orientation, or the like can be used.

In this embodiment mode, an ion irradiation separation method in which the semiconductor substrate is irradiated with ions of hydrogen, helium, or fluorine so that the ions of hydrogen, helium, or fluorine reach the predetermined depth of the semiconductor substrate, and then, heat treatment is performed and a semiconductor layer of a superficial part is separated is employed; however, a method in which single-crystal silicon is epitaxially grown over porous silicon, and then, a porous silicon layer is separated and released with water jet may be used.

For example, a single-crystal silicon substrate is used as the semiconductor substrate 108, and the surface thereof is treated with dilute hydrofluoric acid so that a natural oxide film is removed as well as contaminant such as dust or the like attaching to the surface, whereby the surface of the semiconductor substrate 108 is cleaned.

The fragile layer 110 may be formed by irradiation with ions by an ion-doping method (hereinafter simply referred to as an "ID method") or an ion implantation method (hereinafter simply referred to as an "II method"). The fragile layer 110 is formed by irradiating the semiconductor substrate 108 with ions of hydrogen, helium, or a halogen typified by fluorine. In the case of irradiation with fluorine ions as a halogen element, $BF_3$ may be used as a source gas. Note that an ion implantation method herein means a method in which a semiconductor is irradiated with an ionized gas on which mass separation is performed.

For example, when an ion implantation method is employed, mass separation is performed on an ionized hydrogen gas and $H^+$ ions are selectively accelerated. $H^+$ ions are implanted deeper into a semiconductor substrate compared with other ions having different masses with the same energy and a broad concentration profile is obtained.

In an ion doping method, without mass separation of an ionized gas, plural kinds of ion species are generated in plasma and are accelerated, and then a semiconductor substrate is doped with the accelerated ion species. In the case where the semiconductor substrate is doped with hydrogen ions including $H^+$ ions, $H_2^+$ ions, and $H_3^+$ ions, the proportion of $H_3^+$ ions is 50% or more, for example, in general, the proportion of $H_3^+$ ions is 80% and the proportion of other ions ($H^+$ ions and $H^{2+}$ ions) is 20%. Here, an ion doping also includes adding only $H_3^+$ ions as ion species. In such a case, since the mass is large, a large amount of $H_3^+$ ions can be shallowly added to a semiconductor substrate by the same acceleration energy and a steep concentration profile is obtained.

In the case where the single-crystal silicon substrate is irradiated with halogen ions such as fluorine ions by an ion irradiation method, fluorine which is used for irradiation knocks out (expels) silicon atoms in silicon crystal lattices, so that blank portions are formed effectively to make microvoids in the fragile layer. In this case, the volume of the microvoids formed in the fragile layer is changed by heat treatment at a relatively low temperature, and a thin single-crystal semiconductor layer can be formed by separation along the fragile layer. After irradiation with fluorine ions, irradiation with hydrogen ions may be performed so that hydrogen may be contained in the voids. It is preferable to effectively utilize the action of fluorine ions and hydrogen ions in such a manner because separation is performed along the fragile layer which is formed to release a thin semiconductor layer from the semiconductor substrate by utilization of change in volume of the microvoids which are formed in the fragile layer.

Irradiation may be performed with ions of one atom or the same kind atoms with different masses. For example, in the case of irradiation with hydrogen ions, it is preferable that $H^+$, $H_2^+$, and $H_3^+$ ions be contained and the proportion of $H_3^+$ ions be high. In the case of irradiation with hydrogen ions, if $H^+$, $H_2^+$, and $H_3^+$ ions are contained and the proportion of $H_3^+$ ions is high, irradiation efficiency can be increased and irradiation time can be shortened. Such a structure facilitates release of the thin single crystal semiconductor layer.

A supporting substrate may be provided with a silicon nitride film or a silicon nitride oxide film, which prevents diffusion of an impurity element, as a blocking layer (also referred to as a barrier layer). Further, a silicon oxynitride film may be combined as an insulating film which has a function of relieving a stress. Note that a silicon oxynitride film herein means a film which contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film which contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges described above, when the total number of atoms contained in the silicon oxynitride film or the silicon nitride oxide film is defined as 100 at. %.

In addition, a protective layer may be formed between a semiconductor substrate and an insulating layer which is bonded to the semiconductor layer. The protective layer can be formed of a single layer selected from a silicon nitride layer, a silicon oxide layer, a silicon nitride oxide layer, or a silicon oxynitride layer, or can be formed to have a stacked structure which is formed of a plurality of the layers. Any of these layers can be formed over the semiconductor substrate before the fragile layer is formed in the semiconductor substrate. Further, the layers may be formed over the semiconductor substrate after the fragile layer is formed in the semiconductor substrate.

Because there is a need for irradiation with ions at a high dose for forming the fragile layer, the surface of the semiconductor substrate 108 may be roughened. Therefore, a protective layer against ion irradiation, such as a silicon nitride film, a silicon nitride oxide film, or a silicon oxide film may be formed to have a thickness of from 50 to 200 nm, may be provided on the surface which is irradiated with ions.

For example, a stacked layer of a silicon oxynitride film (with a thickness of from 5 to 300 nm, preferably from 30 to 150 nm (e.g., 50 nm)) and a silicon nitride oxide film (with a thickness of from 5 to 150 nm, preferably from 10 to 100 nm (e.g., 50 nm)) is formed by a plasma CVD method as the protective layer over the semiconductor substrate 108. As an example, a silicon oxynitride film is formed over the semiconductor substrate 108 to have a thickness of 50 nm, and a silicon nitride oxide film is formed thereover to have a thickness of 50 nm. A silicon oxynitride film may be a silicon oxide film which is manufactured by a chemical vapor deposition method using an organosilane gas.

Further, degreasing and cleaning may be performed on the semiconductor substrate 108 and an oxide film on the surface may be removed and thermal oxidation may be performed. As thermal oxidation, general dry oxidation may be performed; however, oxidation in an oxidizing atmosphere to which halogen-containing gas is added is preferably performed. For example, heat treatment is performed at a temperature of 700° C. or higher in an atmosphere containing HCl at from 0.5 to 10 volume % (preferably 3 volume %) with respect to oxygen. The thermal oxidation is preferably performed in a temperature range of from 950 to 1100° C. The processing time may be from 0.1 to 6 hours, preferably from 0.5 to 3.5 hours. The film thickness of the oxide film which is to be formed is from 10 to 1000 nm (preferably, from 50 to 200 nm), for example, 100 nm.

As a substance including a halogen, one or more kinds selected from HF, $NF_3$, HBr, $Cl_2$, $ClF_3$, $BCl_3$, $F_2$, or $Br_2$ can be employed besides HCl.

When heat treatment is performed within such a temperature range, a gettering effect by a halogen element can be obtained. Gettering particularly has an effect of removing a metal impurity. That is, an impurity such as metal is changed into a volatile metal chloride, evaporated into the air, and removed by action of halogen. The heat treatment is effective for the semiconductor substrate 108 which is surface subjected to chemical mechanical polishing (CMP) treatment. Further, hydrogen has an effect of compensating defects at an interface between the semiconductor substrate 108 and the oxide film which is to be formed so as to reduce a local level density of the interface, and the interface between the semiconductor substrate 108 and the oxide film is inactivated and thus electric characteristics are stabilized.

A halogen can be contained in the oxide film formed by this heat treatment. A halogen element is contained at a concentration of from $1\times10^{17}$ to $5\times10^{20}$ atoms/cm$^3$, so that the oxide film can serve as a protective film which captures an impurity such as metal and prevents contamination of the semiconductor substrate 108.

For forming the fragile layer 110, an accelerating voltage and the total number of ions can be controlled in accordance with the thickness of a film deposited over the semiconductor substrate, the thickness of the semiconductor layer which is to be separated from the semiconductor substrate and transferred to the supporting substrate, and ion species which are used for irradiation.

For example, a hydrogen gas is used for a material, and irradiation with ions is performed at an accelerating voltage of 40 kV with the total number of ions of $2\times10^{16}$ ions/cm$^2$ by an ion doping method, so that the fragile layer can be formed. In the case where the thickness of the protective layer is increased and irradiation with ions is performed under the same condition to form the fragile layer, the thickness of a semiconductor layer which is separated from the semiconductor substrate and transferred to the supporting substrate can be decreased. For example, although it depends on the ratio of ion species ($H^+$ ions, $H_2^+$ ions, and $H_3^+$ ions), the above-described condition for the formation of the fragile layer in the semiconductor substrate on which a silicon oxynitride film (with a thickness of 50 nm) and a silicon nitride oxide film (with a thickness of 50 nm) are stacked as a protective layer gives a semiconductor layer, which is transferred to the supporting substrate, with a thickness of approximately 120 nm. When a silicon oxynitride film (with a thickness of 100 nm) and a silicon nitride oxide film (with a thickness of 50 nm) are stacked as a protective layer over the semiconductor substrate, the thickness of the semiconductor layer which is transferred to the supporting substrate is approximately 70 nm.

When helium (He) or hydrogen is used as a source gas, irradiation is performed with an accelerating voltage in the range of from 10 to 200 kV and with a dose in the range of from $1\times10^{16}$ to $6\times10^{16}$ ions/cm$^2$ to form the fragile layer. When helium is used as a source gas, irradiation can be performed with He$^+$ ions as main ions without mass separation. Further, if hydrogen is used as a source gas, irradiation can be performed with $H_3^+$ ions or $H_2^+$ ions as main ions. Ion species change depending on a plasma generation method, pressure, the supply of a source gas, and an accelerating voltage.

As an example of formation of the fragile layer, a silicon oxynitride film (with a thickness of 50 nm), a silicon nitride oxide film (with a thickness of 50 nm), and a silicon oxide film (with a thickness of 50 nm) are stacked as a protective layer over the semiconductor substrate, and irradiation with hydrogen is performed at an acceleration voltage of 40 kV and a dose of $2\times10^{16}$ ions/cm$^2$ to form the fragile layer in the semiconductor substrate. Then, a silicon oxide film (with a thickness of 50 nm) is formed as an insulating layer over the silicon oxide film, which is the top layer of the protective layer. As another example of formation of the fragile layer, a silicon oxide film (with a thickness of 100 nm) and a silicon nitride oxide film (with a thickness of 50 nm) are stacked as a protective layer over the semiconductor substrate, and irradiation with hydrogen is performed at an acceleration voltage of 40 kV and a dose of $2\times10^{16}$ ions/cm$^2$ to form the fragile layer in the semiconductor substrate. Then, a silicon oxide film (with a thickness of 50 nm) is formed as an insulating layer over the silicon nitride oxide film, which is the top layer of the protective layer. Note that the silicon oxynitride film and the silicon nitride oxide film may be formed by a plasma CVD method, and the silicon oxide film may be formed by a CVD method using an organosilane gas.

When a glass substrate which is used in the electronics industry, such as an aluminosilicate glass substrate, an aluminoborosilicate glass substrate, or a barium borosilicate glass substrate is used as the supporting substrate 101, the glass substrate contains a slight amount of alkali metal such as sodium, and this slight amount of impurity may adversely affect the characteristics of a semiconductor element such as a transistor. The silicon nitride oxide film prevents such metal impurities contained in the supporting substrate 101 from diffusing from the supporting substrate 101 to the semiconductor substrate side. Note that a silicon nitride film may be formed as an alternative to the silicon nitride oxide film. A stress relieving layer such as a silicon oxynitride film or a silicon oxide film is preferably provided between the semiconductor substrate and the silicon nitride oxide film. When a stacked structure of the silicon nitride oxide film and the silicon oxynitride film is provided, diffusion of impurities to the semiconductor substrate can be prevented and stress distortion can be reduced.

Figure 3B:
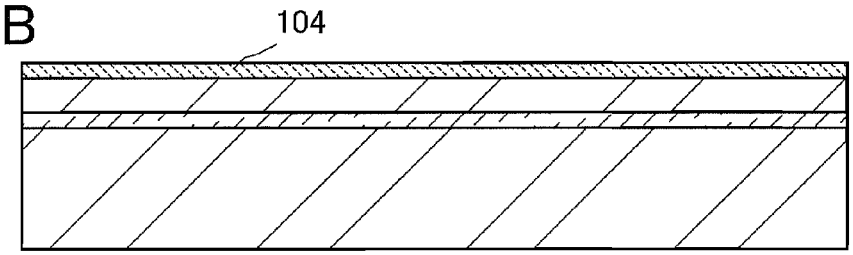

Next, as illustrated in FIG. 3B, a silicon oxide film is formed as the insulating layer 104 over a surface which is to form a bond with a supporting substrate. As the silicon oxide film, a silicon oxide film formed by a chemical vapor deposition method using an organosilane gas is preferable. Alternatively, a silicon oxide film formed by a chemical vapor deposition method using a silane gas can be employed. Film formation by a chemical vapor deposition method is performed at a temperature, for example, 350° C. or lower (specifically 300° C.) at which the fragile layer 110 that is formed in a single-crystal semiconductor substrate is not degassed. In addition, heat treatment which releases allows a single-crystal semiconductor layer or a polycrystalline semiconductor layer to be separated from a single-crystal semiconductor substrate or a polycrystalline semiconductor substrate employs a temperature which is higher than a temperature for formation of the insulating layer 104.

The insulating layer 104 has a smooth surface and forms a hydrophilic surface. As this insulating layer 104, a silicon oxide film is preferable. In particular, a silicon oxide film which is formed by a chemical vapor deposition method using an organosilane gas is preferable. Examples of organosilane gas that can be used are silicon-containing compounds, such as tetraethoxysilane (TEOS) (chemical formula: Si(OC$_2$H$_5$)$_4$), trimethylsilane (TMS) ((CH$_3$)$_3$SiH), tetramethylsilane (chemical formula: Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), and trisdimethylaminosilane (SiH(N(CH$_3$)$_2$)$_3$). Note that when the silicon oxide film is formed by a chemical vapor deposition method using organosilane as a source gas, a gas which provides oxygen is preferably mixed. As a gas which provides oxygen, oxygen, nitrous oxide, nitrogen dioxide, or the like can be used. Further, an inert gas such as argon, helium or nitrogen, or a hydrogen gas can be mixed.

Alternatively, the insulating layer 104 can be a silicon oxide film which is formed by a chemical vapor deposition method using silane such as monosilane, disilane, or trisilane as a source gas. Also in this case, a gas which provides oxygen, an inert gas, or the like is preferably mixed. In addition, a silicon oxide film which is to be an insulating layer which is bonded with a semiconductor layer may include chlorine. Film formation by a chemical vapor deposition method is performed at a temperature, for example, 350° C. or lower at which the fragile layer 110 that is formed in the semiconductor substrate 108 is not degassed. In addition, heat treatment which releases a semiconductor layer from a single-crystal semiconductor substrate or a polycrystalline semiconductor substrate employs a temperature which is higher than a temperature for film formation. Note that a chemical vapor deposition method herein includes a plasma CVD method, a thermal CVD method, and a photo-CVD method.

Alternatively, as the insulating layer 104, silicon oxide can be formed by heat treatment of the semiconductor 108 in an oxidizing atmosphere by reacting the semiconductor substrate 108 with oxygen radicals, by chemically oxidizing the semiconductor substrate 108 with an oxidizing reagent, or the like. Further, the insulating layer 104 may be formed by reaction between the organosilane gas and oxygen radicals or nitrogen radicals.

The insulating layer 104 which has a smooth and hydrophilic surface is formed to have a thickness of from 5 to 500 nm, preferably from 10 to 200 nm. With this thickness, it is possible to smooth surface roughness of the semiconductor substrate 108 and also to ensure smoothness of the insulating layer 104. In addition, a distortion of the insulating layer 104 and the supporting substrate that are bonded can be eased. The surface of the insulating layer 104 is preferably set as follows: an arithmetic mean roughness Ra is less than 0.8 nm and a root-mean-square roughness Rms is less than 0.9 nm; more preferably, Ra is 0.4 nm or less and Rms is 0.5 nm or less; and still more preferably, Ra is 0.3 nm or less and Rms is 0.4 nm or less. For example, Ra is 0.27 nm and Rms is 0.34 nm. In this specification, Ra is arithmetic mean roughness, Rms is root-mean-square roughness, and the measurement area is 2 $\mu m^2$ or 10 $\mu m^2$.

The supporting substrate 101 may be provided with a silicon oxide film similar to the insulating layer 104. In other words, in bonding the semiconductor layer 102 to the supporting substrate 101, a strong bond can be formed when the insulating layer 104 formed of a silicon oxide film preferably using organosilane as a material is provided over one or both surfaces which are bonded.

Figure 3C:
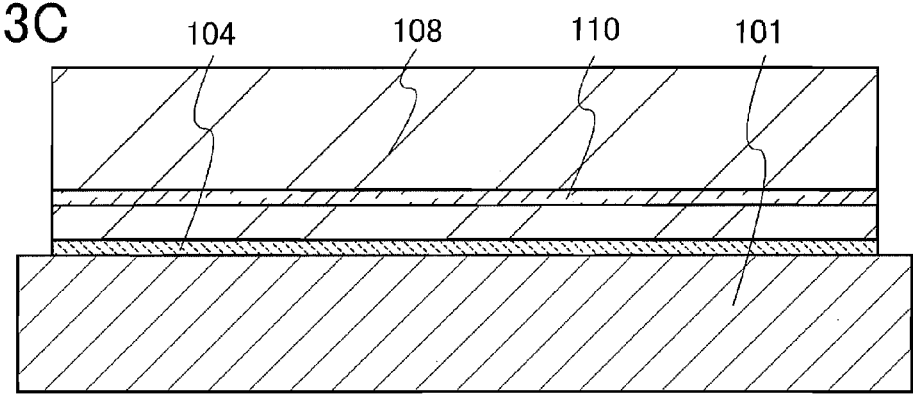

FIG. 3C illustrates a mode in which the supporting substrate 101 and a surface of the semiconductor substrate 108 which is provided with the insulating layer 104 are disposed in close contact with each other and bonded. The surfaces that are bonded to each other are sufficiently cleaned. The surfaces of the supporting substrate 101 and the insulating layer 104 over the semiconductor substrate 108 may be cleaned by megasonic cleaning or the like. Further, the surfaces may be cleaned with ozone water after the megasonic cleaning to remove an organic substance and improve the hydrophilicity of the surfaces.

By allowing the supporting substrate 101 and the insulating layer 104 face each other and pressing a part thereof from the outside, the supporting substrate 101 and the insulating layer 104 attract each other by increase in van der Waals forces or contribution of hydrogen bonding due to local reduction in distance between the bonding surfaces. Further, since the distance between the supporting substrate 101 and the insulating layer 104, which face each other, in a region which is adjacent to the pressed part is reduced, a region which is strongly influenced by van der Waals forces or a region to which hydrogen bonding contributes is widened. Accordingly, bonding proceeds and spreads to the entire bonding surfaces. For example, a pressure of approximately from 100 to 5000 kPa may be used.

In order to form a strong bond, the surfaces may be activated. For example, the surfaces which are to form a bond are irradiated with an atomic beam or an ion beam. In the case of using an atomic beam or an ion beam, a neutral atom beam of an inert gas or ion beam of an inert gas such as argon or the like can be used. Further, plasma irradiation or radical treatment is performed. Such a surface treatment facilitates a bond between different kinds of materials even in a temperature range of from 200 to 400° C.

Further, in order to improve bonding strength at a bond interface between the supporting substrate and the insulating layer, heat treatment is preferably performed. For example, heat treatment is performed in a temperature condition of from 70 to 350° C. (e.g., at 200° C. for 2 hours) with an oven, a furnace, or the like.

Figure 3D:
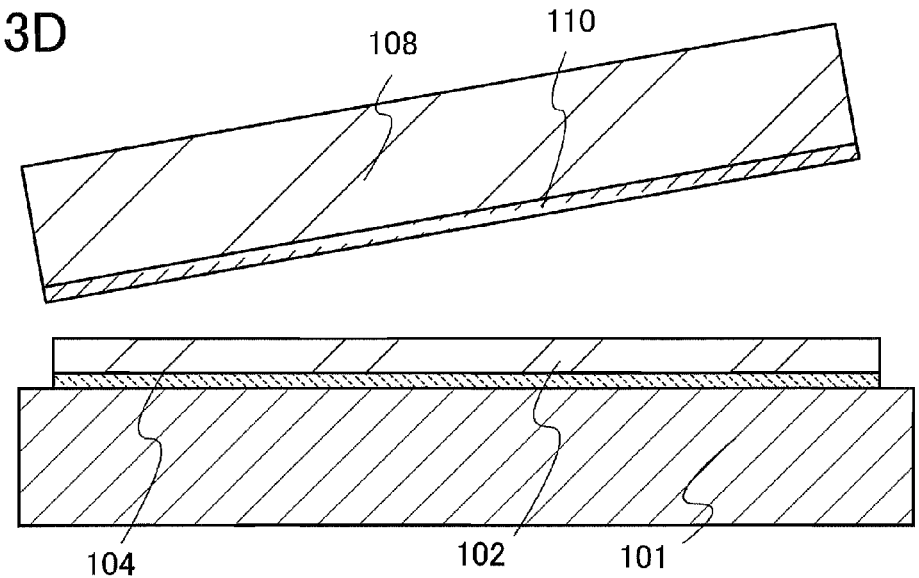

In FIG. 3D, after the supporting substrate 101 and the semiconductor substrate 108 are attached to each other, heat treatment is performed to release the semiconductor substrate 108 from the supporting substrate 101 with the fragile layer 110 serving as a separation plane. When the heat treatment is performed at, for example, from 400 to 700° C., the volume of minute voids formed in the fragile layer 110 is changed, which enables separation along the fragile layer 110. Since the insulating layer 104 is bonded to the supporting substrate 101, the semiconductor layer 102 having the same crystallinity as the semiconductor substrate 108 is left over the supporting substrate 101.

The heat treatment in the temperature range of from 400 to 700° C. may be successively performed with the same apparatus as the above-described heat treatment for improving the bonding strength or with a different apparatus. For example, after heat treatment in a furnace at 200° C. for 2 hours, the temperature is increased to near 600° C. and held for 2 hours, the temperature is decreased to a temperature ranging from 400° C. to room temperature, and then the substrates are taken out of the furnace. Alternatively, heat treatment may be performed with a temperature increasing from room temperature. Further alternatively, heat treatment may be performed in a furnace at 200° C. for 2 hours, and then, in a temperature range of from 600 to 700° C. with a rapid thermal annealing (RTA) apparatus for from 1 to 30 minutes (e.g., at 600° C. for 7 minutes or at 650° C. for 7 minutes).

By the heat treatment in the temperature range of from 400 to 700° C., bonding between the insulating layer and the supporting substrate shifts from hydrogen bonding to covalent bonding, the volume of the element which has been added to the fragile layer expands and the pressures of the microvoids rise, whereby the semiconductor layer can be released from the semiconductor substrate. After the heat treatment, the supporting substrate and the semiconductor substrate are in a state where one of them is placed over the other, and the supporting substrate and the semiconductor substrate can be separated from each other without application of large force. For example, one substrate provided over the other substrate is lifted by a vacuum chuck, so that the substrate can be easily separated. At this time, if the lower substrate is fixed with a vacuum chuck or a mechanical chuck, the supporting substrate and the semiconductor substrate can be separated from each other without horizontal deviation.

Note that although an example in which the semiconductor substrate 108 is smaller than the supporting substrate 101 is illustrated in FIGS. 3A to 3D and FIGS. 4A to 4D, the present invention is not limited thereto, and the semiconductor substrate 108 and the supporting substrate 101 may be the same size or the semiconductor substrate 108 may be larger than the supporting substrate 101.

Figure 4A:
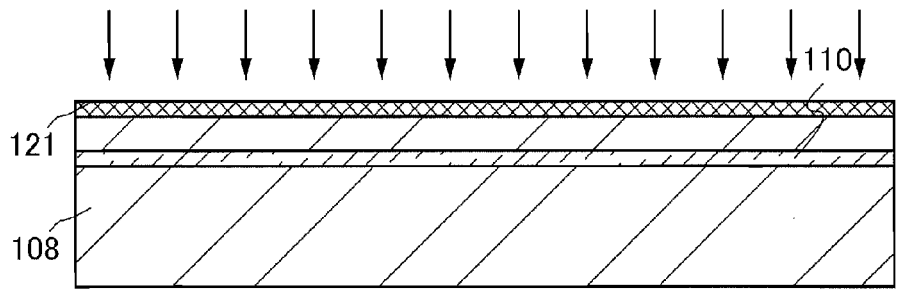
FIGS. 4A to 4D illustrate a method for manufacturing a semiconductor device of the present invention.

FIGS. 4A to 4D illustrate steps of forming a semiconductor layer with an insulating layer which is to be bonded to the semiconductor layer and which is provided on the supporting substrate 101. FIG. 4A illustrates a step in which the semiconductor substrate 108, which is provided with a silicon oxide film serving as the protective layer 121, is irradiated with ions that are accelerated by an electric field so as to reach a predetermined depth to form the fragile layer 110. Ion irradiation is performed similarly to the case of FIG. 3A. Formation of the protective layer 121 over the surface of the semiconductor substrate 108 can prevent the surface from being damaged and from losing its planarity due to ion irradiation. Further, the protective layer 121 has an effect of preventing diffusion of impurities into the semiconductor layer 102 which is formed using the semiconductor substrate 108.

Figure 4B:
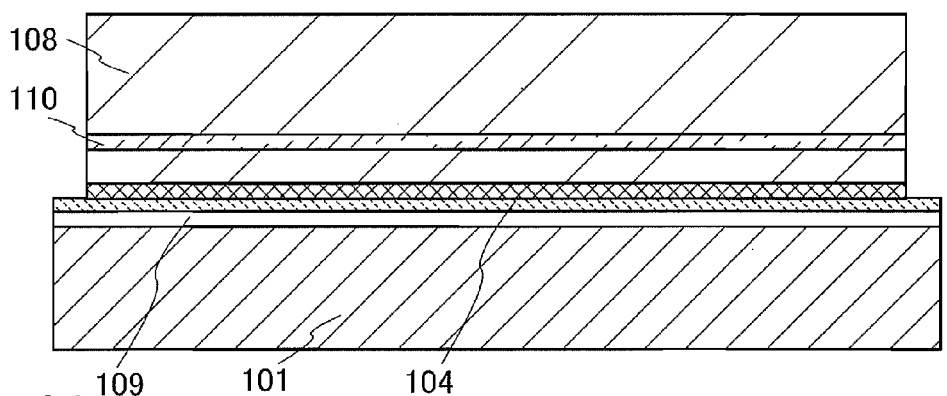

FIG. 4B illustrates a step in which the supporting substrate 101, over which the blocking layer 109 and the insulating layer 104 are formed, and a surface of the protective layer 121, which is formed over the semiconductor substrate 108, are disposed to be in close contact with each other and bonded. The insulating layer 104 over the supporting substrate 101 is disposed in close contact with the protective layer 121 of the semiconductor substrate 108 so that they are bonded to each other.

Figure 4C:
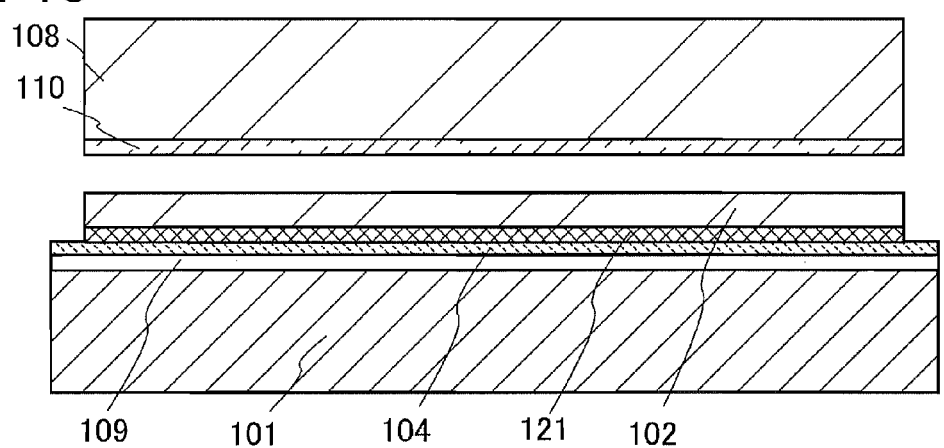
Figure 4D:
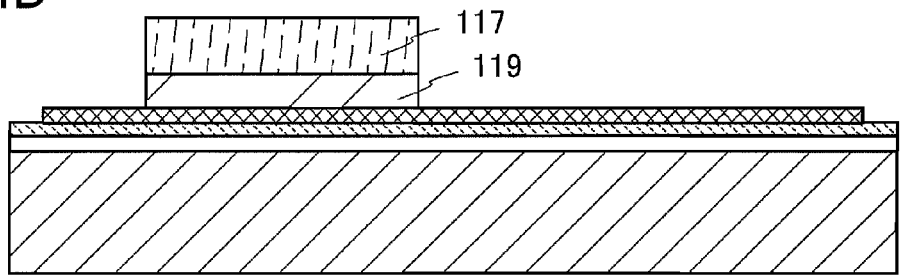

After that, the semiconductor substrate 108 is released as illustrated in FIG. 4C. Heat treatment for releasing the semiconductor layer is performed similarly to the case of FIG. 3D. In this manner, a semiconductor substrate illustrated in FIG. 4C can be obtained.

As the supporting substrate 101, a substrate having an insulating property or a substrate having an insulating surface can be used, and it is possible to employ any of a variety of glass substrates that are used in the electronics industry and referred to as non-alkali glass substrates, such as an aluminosilicate glass substrate, an aluminoborosilicate glass substrate, or a barium borosilicate glass substrate. Further, a quartz substrate, a ceramic substrate, a sapphire substrate, a metal substrate whose surface is coated with an insulating layer, or the like can be used.

Through the above-described process, as illustrated in FIG. 4C, the insulating layer 104 and the semiconductor layer 102, which is separated from the semiconductor substrate 108, are provided over the supporting substrate 101 having the insulating surface.

The semiconductor layer 102 provided over the supporting substrate 101 is etched into an island shape. A mask 117 is formed over the semiconductor layer 102. A semiconductor layer 119 having an island shape is formed by etching the semiconductor layer 102 using the mask 117. While FIGS. 4A to 4C illustrate an example in which the protective layer and the insulating layer below the semiconductor layer are not etched in the etching treatment for forming the semiconductor layer 119, the protective layer and the insulating layer may also be etched in the etching treatment for forming the semiconductor layer 119. In this case, the protective layer and the insulating layer reflect the shape of the semiconductor layer 119 having an island-shape and are provided only under the semiconductor layer 119.

The semiconductor layer which is separated from the semiconductor substrate and is transferred to the supporting substrate may have crystal defects due to the separation step and the ion irradiation step, and may lose surface planarity and have irregularities. When a transistor is formed as a semiconductor element using the semiconductor layer, it is difficult to form a thin gate insulating layer with high withstand voltage on the semiconductor layer with these irregularities. In addition, if the semiconductor layer has a crystal defect, performance and reliability of the transistor are adversely affected; for example, a local interface state density with the gate insulating layer is increased.

Therefore, the semiconductor layer is preferably irradiated with an electromagnetic wave such as laser light to reduce crystal defects. Irradiation with an electromagnetic wave can melt the semiconductor layer at least partially and can reduce crystal defects in the semiconductor layer. Note that an oxide film (a film that is formed by the spontaneous oxidation or a chemical oxidation) formed on the surface of the semiconductor layer may be removed with dilute hydrofluoric acid before irradiation with an electromagnetic wave.

Any electromagnetic wave may be used as long as they provide high energy to the semiconductor layer, and laser light can be preferably used.

The energy supply to the semiconductor layer can be performed by a method mainly utilizing heat conduction, which can be achieved by colliding particles having high energy with the semiconductor layer. As a heat source for supplying particles having high energy, plasma such as normal-pressure plasma, high-pressure plasma, or a thermal plasma jet, or flame of a gas burner or the like can be used. Alternatively, an electron beam or the like can be used as a heat source.

A wavelength of an electromagnetic wave is set so that it is absorbed by the semiconductor layer. The wavelength can be determined in consideration of the skin depth and the like of the electromagnetic wave. For example, the wavelength of electromagnetic wave can be from 190 to 600 nm. Further, electromagnetic wave energy can be determined by considering the wavelength of the electromagnetic wave, the skin depth of the electromagnetic wave, the thickness of the semiconductor layer to be irradiated, or the like.

A laser emitting laser light can be a continuous wave laser, a quasi-continuous wave laser, or a pulsed laser. A pulsed laser is preferable for partial melting. For example, a gas laser such as an excimer laser such as a KrF laser, an Ar laser, a Kr laser, or the like can be used. Alternatively, as a solid state laser, a YAG laser, a YVO$_4$ laser, a YLF laser, a YAlO$_3$ laser, a GdVO$_4$ laser, a KGW laser, a KYW laser, an Alexandrite laser, a Ti:sapphire laser, a Y$_2$O$_3$ laser, or the like can be used. While an excimer laser is a pulsed laser, some solid lasers such as a YAG laser can also be used as a continuous laser, a quasi-continuous laser, and a pulsed laser. Note that in a solid state laser, any of the second harmonic to the fifth harmonic of a fundamental wave is preferably used. In addition, a semiconductor laser such as GaN, GaAs, GaAlAs, InGaAsP, or the like can be used.

As long as the semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. Flash annealing with the above-described lamp light may be used. Since flash annealing which is performed by preferably using a halogen lamp, a xenon lamp, or the like requires only a very short treatment time, increase in temperature of the supporting substrate can be suppressed.

A shutter; a reflector such as a mirror, a half mirror, or the like; an optical system including a cylindrical lens, a convex lens, or the like may be provided to adjust the shape or path of the electromagnetic wave.

Note that, as for an irradiation method of the electromagnetic wave, the semiconductor layer can be selectively irradiated with light (the electromagnetic wave) or the semiconductor layer can be irradiated with light (the electromagnetic wave) by scanning the light (the electromagnetic wave) in the XY directions. In this case, a polygon mirror or a galvanometer mirror is preferably used for the optical system.

Irradiation with the electromagnetic wave can be performed in an atmosphere which contains oxygen, such as an atmospheric atmosphere or in an inert atmosphere such as a nitrogen atmosphere. To perform irradiation with the electromagnetic wave in an inert atmosphere, irradiation with the electromagnetic wave may be performed in an airtight chamber, and the atmosphere in this chamber may be controlled. In the case where a chamber is not used, a nitrogen atmosphere can be formed by spraying an inert gas such as nitrogen gas or the like on a surface to be irradiated with the electromagnetic wave.

Further, polishing treatment may be performed on the surface of the semiconductor layer to which high energy is supplied by electromagnetic wave irradiation or the like and whose crystal defects of the surface is reduced. Polishing treatment can enhance the planarity of the surface of the semiconductor layer.

For the polishing treatment, a chemical mechanical polishing (CMP) method or a liquid jet polishing method can be used. Note that the surface of the semiconductor layer is cleaned and purified before the polishing treatment. The cleaning may be megasonic cleaning, two-fluid jet cleaning, or the like and dust or the like of the surface of the semiconductor layer is removed by cleaning. In addition, it is preferable to remove a film that is formed by spontaneous oxidation or the like on the surface of the semiconductor layer by using dilute hydrofluoric acid to expose the semiconductor layer.

In addition, the surface of the semiconductor layer may be subjected to polishing treatment (or etching treatment) before the electromagnetic wave irradiation.

In this embodiment mode, when a single-crystal silicon substrate is used as the semiconductor substrate 108, a single-crystal silicon layer can be obtained as the semiconductor layer 119. Further, since a method for manufacturing an SOI substrate of a semiconductor device in this embodiment mode allows a process temperature to be 700° C. or lower, a glass substrate can be used as the supporting substrate 101. That is, a transistor in this embodiment mode can be formed over a glass substrate and a single-crystal silicon layer can be employed as the semiconductor layer. Accordingly, a transistor with high performance and high reliability which can, for example, operate at high speed and low driving voltage and have a low subthreshold swing and high electron field-effect mobility can be manufactured over a supporting substrate such as a glass substrate.

Next, a method for manufacturing the semiconductor device illustrated in FIG. 1A which employs the above-described SOI substrate is described with reference to FIGS. 7A to 7F and FIGS. 8A to 8D.

Figure 7A:
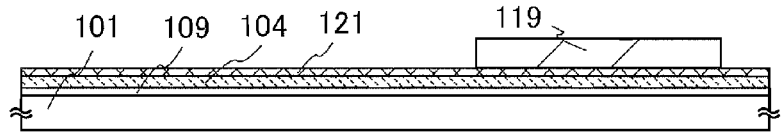
FIGS. 7A to 7F illustrate a method for manufacturing a semiconductor device of the present invention.

In FIG. 7A, the blocking layer 109, the insulating layer 104, the protective layer 121, and the semiconductor layer 119 are formed over the supporting substrate 101. The semiconductor layer 119, the blocking layer 109, the insulating layer 104, and the protective layer 121 correspond to those in FIGS. 4A to 4D. Note that while an example in which the SOI substrate having the structure illustrated in FIG. 7A is employed is given here, the SOI substrate having another structure described in this specification can be employed.

To the semiconductor layer 119, a p-type impurity such as boron, aluminum, or gallium or an n-type impurity such as phosphorus or arsenic may be added to a region where an n-channel field-effect transistor or a p-channel field-effect transistor is to be formed in order to control a threshold voltage.

The semiconductor layer 119 may be further etched to have an island shape in accordance with arrangement of the semiconductor elements.

An oxide film over the semiconductor layer is removed and a gate insulating layer 205 is formed to cover the semiconductor layer 119.

The gate insulating layer 205 may be formed using silicon oxide, or may be formed with a stacked structure of silicon oxide and silicon nitride. The gate insulating layer 205 may be formed by depositing an insulating film by a plasma CVD method or a low-pressure CVD method. Alternatively, the gate insulating layer 205 may be formed by solid-phase oxidation or solid-phase nitridation with plasma treatment because a gate insulating layer formed by oxidizing or nitriding a semiconductor layer by plasma treatment is dense, has high withstand voltage, and is highly reliable.

Further, as the gate insulating layer 205, a high dielectric constant material such as zirconium dioxide, hafnium oxide, titanium dioxide, or tantalum pentoxide may be used. When a high dielectric constant material is used for the gate insulating layer 205, gate leak current can be reduced.

Figure 7B:
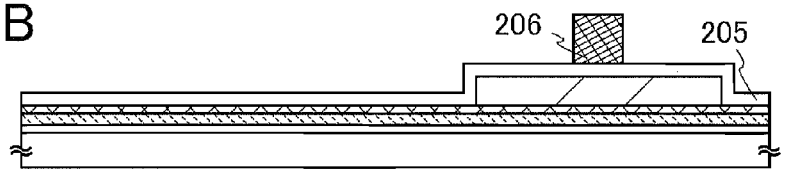
Figure 7C:
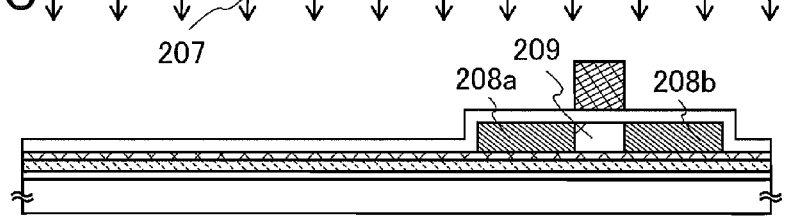
Figure 7D:
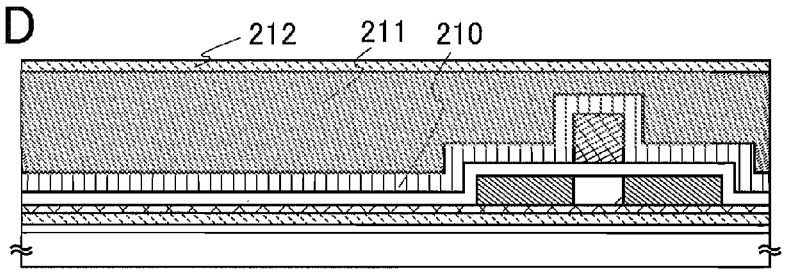

The gate electrode layer 206 is formed over the gate insulating layer 205 (see FIG. 7B). The gate electrode layer 206 can be formed by a sputtering method, an evaporation method, a CVD method, or the like. The gate electrode layer 206 may be formed using an element selected from tantalum (Ta), tungsten (W), titanium (Ti), molybdenum (Mo), aluminum (Al), copper (Cu), chromium (Cr), or neodymium (Nd), or an alloy material or compound containing any of those elements as its main component. Further, as the gate electrode layer 206, a semiconductor film typified by a polycrystalline silicon film doped with an impurity element such as phosphorus can be used, or an AgPdCu alloy may be used.

The impurity regions 208a and 208b, which are n-type impurity regions, are formed by adding an impurity element 207 imparting n-type conductivity using the gate electrode layer 206 as a mask. In this embodiment mode, phosphine ($PH_3$) is used as a doping gas containing an impurity element. Here, doping is performed such that the impurity regions 208a and 208b contain the impurity element imparting n-type conductivity at a concentration of approximately from $5\times10^{19}$ to $5\times10^{20}$ atoms/cm$^3$. In addition, the channel formation region 209 is formed in the semiconductor layer 119 (see FIG. 7C).

The impurity regions 208a and 208b are n-type high-concentration impurity regions and serve as a source and a drain.

Heat treatment, intense light irradiation, or laser light irradiation may be performed to activate the impurity element, which can repair plasma damage to the gate insulating layer and to the interface between the gate insulating layer and the semiconductor layer as well as activate the impurity element.

Subsequently, an interlayer insulating layer which covers the gate electrode layer and the gate insulating layer is formed. In this embodiment mode, the insulating film 210 and the interlayer insulating layer 211 are laminated to form a stacked structure. The insulating film 210 contains hydrogen and serves as a protective film. Further, the insulating film 210 can cause a distortion to the channel formation region of the semiconductor layer 119.

Further, heat treatment is performed in a nitrogen atmosphere at from 300 to 550° C. for 1 to 12 hours to hydrogenate the semiconductor layer. Preferably, this heat treatment is performed at from 400 to 500° C. This step terminates dangling bonds of the semiconductor layer with hydrogen which is contained in the insulating film 210, which is the interlayer insulating layer. In this embodiment mode, the heat treatment is performed at 410° C. for one hour.

In the present invention, the interlayer insulating layer 211 is formed to relieve irregularities on the surface which are generated by the semiconductor layer, the gate electrode layer, and the like and to obtain a planarized surface. Accordingly, the interlayer insulating layer 211 is formed to have a thickness with which the surface thereof is planarized. Note that the surface may be planarized by chemical mechanical polishing (CMP).

The interlayer insulating layer 211 may be formed of a silicon nitride film, a silicon nitride film including oxygen (a silicon nitride oxide film), a silicon oxide film including nitride (a silicon oxynitride film), or a silicon oxide film by using a sputtering method or a plasma CVD method. Alternatively, a single layer or a stacked structure of three or more layers which include another insulating film containing silicon may be used.

The interlayer insulating layer 211 can be formed of a material selected from inorganic insulating substances, such as aluminum nitride (AlN), aluminum oxynitride (AlON), aluminum nitride oxide (AlNO) containing more nitrogen than oxygen, aluminum oxide, diamond-like carbon (DLC), nitrogen-containing carbon (CN), or the like. Further, a siloxane resin may be used. Note that a siloxane resin refers to a resin including an Si—O—Si bond. Siloxane is composed of a skeleton formed by the bond of silicon (Si) and oxygen (O), in which an organic group containing at least hydrogen (such as an alkyl group and an aryl group) is used as a substituent. Alternatively, a fluoro group may be included in the organic group.

Alternatively, an organic insulating material which can withstand subsequent heat treatment may be used. As such an organic insulating material, polyimide, acrylic polymer, polyamide, polyimide amide, benzocyclobutene-based resin, or polysilazane can be given. A coated film which is formed by a coating method and has favorable planarity may be used as the interlayer insulating layer 211.

Dip coating, spray coating, a doctor knife, a roll coater, a curtain coater, a knife coater, a CVD method, an evaporation method, or the like can be used for forming the interlayer insulating layer 211. The interlayer insulating layer 211 may be formed by a droplet discharge method. If a droplet discharge method is used, a material solution can be saved. In addition, a method capable of transferring or drawing a pattern like a droplet discharge method, for example, a printing method (a method for forming a pattern, such as screen printing or offset printing) can be used.

The insulating layer 212 is formed over the interlayer insulating layer 211 as an insulating layer which is bonded to a second semiconductor layer. The material and forming step of the insulating layer 212 may be similar to those for the insulating layer 104. The insulating layer 212 can be a smooth layer (an arithmetic mean roughness Ra is less than 0.3 nm (a measurement area 10 μm$^2$)) and a silicon oxide film or silicon oxynitride film, a laminate of a silicon nitride film and a silicon oxide film stacked in that order over the interlayer insulating layer 211, or a laminate of a silicon oxynitride film and a silicon oxide film stacked in that order over the interlayer insulating layer 211. The insulating layer 212 is preferably formed by a PECVD method at a low temperature of 350° C. or less. For example, in this embodiment mode, a silicon oxide film is formed as the insulating layer 212, using tetraethoxysilane as an organosilane gas by a chemical vapor deposition method. A silicon nitride film or a silicon oxynitride film prevents impurities from diffusing from the interlayer insulating layer 211 through the insulating layer 212 to the semiconductor layer 216 and the gate insulating layer 217 which are formed thereover.

Figure 7E:
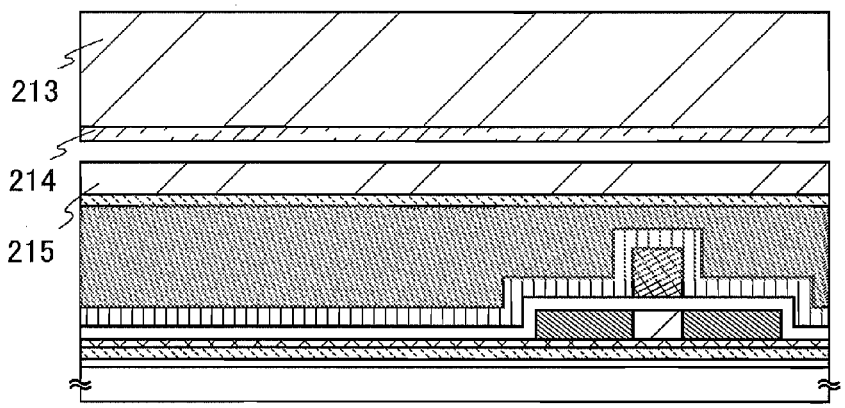

A semiconductor layer 215 is bonded to the insulating layer 212 to form the semiconductor layer 215 over the interlayer insulating layer 211 as the semiconductor layer 102 is bonded to the insulating layer 104 and is separated from the semiconductor substrate 108 (see FIG. 7E). The semiconductor layer 215 is separated from the semiconductor substrate 213 provided with a fragile layer 214 and is bonded to the insulating layer 212 with heat treatment. Note that it is preferable that this heat treatment be performed at a temperature lower than the temperature for the above-described hydrogenation step of the semiconductor layer 119.

The semiconductor layer 215 may be irradiated with laser light to reduce crystal defects. The surface of the semiconductor layer 215 may be subjected to polishing treatment. Polishing treatment can enhance the planarity of the surface of the semiconductor layer 215.

Note that in n-channel and p-channel semiconductor layers, it is preferable that a plane orientation of a surface which is parallel to an insulating surface be {110} and a crystal axis in a channel length direction be <110>. This is because difference in mobility between the n-channel field-effect transistor and the p-channel field-effect transistor can be reduced.

Figure 7F:
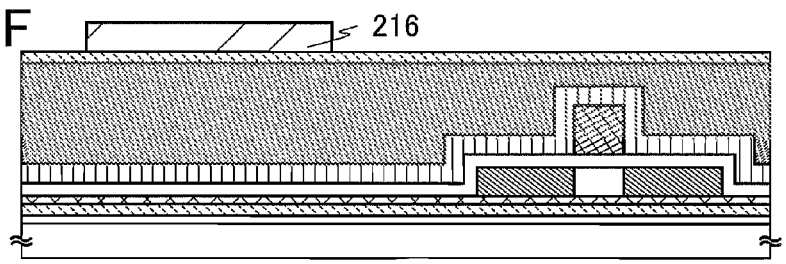

Then, the semiconductor layer 215, which is a thin film, is selectively etched to form the semiconductor layer 216 having an island shape over the insulating layer 212 (see FIG. 7F).

Figure 8A:
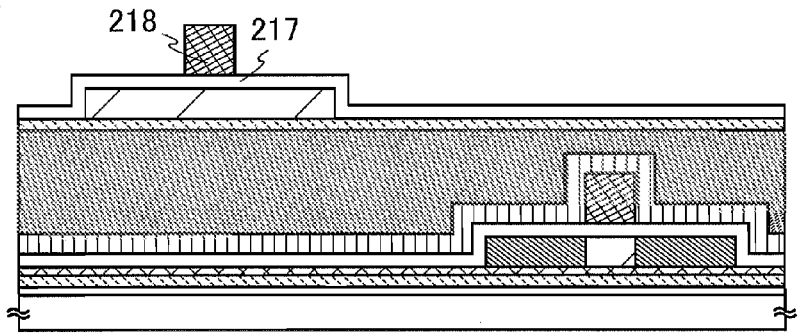
FIGS. 8A to 8D illustrate a method for manufacturing a semiconductor device of the present invention.
Figure 8B:
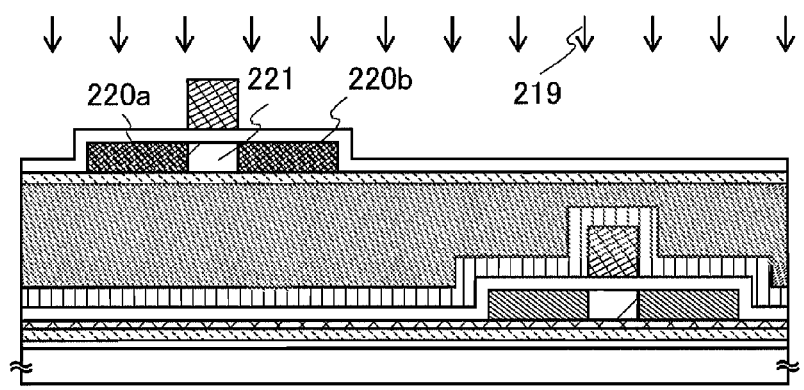

The gate insulating layer 217 and the gate electrode layer 218 are formed over the semiconductor layer 216 (see FIG. 8A).

The impurity regions 220a and 220b, which are p-type impurity regions, are formed by adding an impurity element 219 imparting p-type conductivity using the gate electrode layer 218 as a mask. Doping is performed such that the impurity regions 220a and 220b contain the impurity element imparting p-type conductivity at a concentration of approximately from $1\times10^{20}$ to $5\times10^{21}$ atoms/cm$^3$. In addition, the channel formation region 221 is formed in the semiconductor layer 216 (see FIG. 8B). The impurity regions 220a and 220b are p-type high-concentration impurity regions and serve as a source and a drain.

Subsequently, an interlayer insulating layer which covers the gate electrode layer and the gate insulating layer is formed. In this embodiment mode, the interlayer insulating layer has a stacked structure of the insulating film 222 which contains hydrogen and serves as a protective film and the interlayer insulating layer 223.

Further, heat treatment is performed in a nitrogen atmosphere at from 300 to 550° C. for 1 to 12 hours to hydrogenate the semiconductor layer. Preferably, this heat treatment is performed at from 400 to 500° C. This step terminates dangling bonds of the semiconductor layer with hydrogen which is contained in the insulating film 222, which is the interlayer insulating layer. In this embodiment mode, the heat treatment is performed at 410° C. for one hour. This heat treatment may also serve as the heat treatment for the semiconductor layer 119 and the insulating film 210.

In the present invention, the interlayer insulating layer 223 is formed to relieve irregularities on the surface which are generated by the semiconductor layer, the gate electrode layer, and the like and to obtain a planarized surface. Accordingly, the interlayer insulating layer 223 is formed to have a thickness with which the surface thereof is planarized. Note that the surface may be planarized by chemical mechanical polishing (CMP).

The gate insulating layer 217, the gate electrode layer 218, the insulating film 222, and the interlayer insulating layer 223 correspond to the gate insulating layer 205, the gate electrode layer 206, the insulating film 210, and the interlayer insulating layer 211, respectively, and they can be formed of similar materials and by similar steps.

Then, contact holes (openings) which reach the semiconductor layer 119 or the semiconductor layer 216 are formed in the gate insulating layer 205, the insulating film 210, the interlayer insulating layer 211, the insulating layer 212, the gate insulating layer 217, the insulating film 222, and the interlayer insulating layer 223 using a mask Mimed of a resist. Etching may be performed once or plural times in accordance with a selectivity of a material which is used. The gate insulating layer 205, the insulating film 210, the interlayer insulating layer 211, the insulating layer 212, the gate insulating layer 217, the insulating film 222, and the interlayer insulating layer 223 are selectively removed by etching to form openings which reach the impurity regions 208a and 208b or the impurity regions 220a and 220b, which are source regions and drain regions.

A method and a condition of the etching may be set as appropriate depending on the materials of the gate insulating layer 205, the insulating film 210, the interlayer insulating layer 211, the insulating layer 212, the gate insulating layer 217, the insulating film 222, and the interlayer insulating layer 223 in which the contact holes are formed. Wet etching, dry etching, or both of them can be used as appropriate. In this embodiment mode, dry etching is used. As an etching gas, a chlorine-based gas typified by $Cl_2$, $BCl_3$, $SiCl_4$ or $CCl_4$; a fluorine-based gas typified by $CF_4$, $SF_6$ or $NF_3$; or $O_2$ can be used as appropriate. Further, an inert gas may be added to an etching gas to be used. As an inert element to be added, one or a plurality of elements selected from He, Ne, Ar, Kr, or Xe can be used.

As an etchant of wet etching, a hydrofluoric acid-based solution such as a mixed solution of ammonium hydrogen fluoride and ammonium fluoride may be used.

A conductive film is formed to cover the openings, and the conductive film is etched to form the wiring layers 224, 225, and 226, which are electrically connected to portions of source regions and drain regions and serve as source electrode layers and drain electrode layers. The wiring layers can be formed by forming a conductive film by a PVD method, a CVD method, an evaporation method, or the like and then etching the conductive film into a desired shape. Alternatively, conductive layers can be selectively formed in predetermined positions by a droplet discharge method, a printing method, an electroplating method, or the like. Further, a reflow method or a damascene method may be used. The wiring layers are formed of a metal such as Ag, Au, Cu, Ni, Pt, Pd, Ir, Rh, W, Al, Ta, Mo, Cd, Zn, Fe, Ti, Zr, or Ba; and Si or Ge; or an alloy or nitride thereof. Further, a laminate thereof may be employed.

Figure 8C:
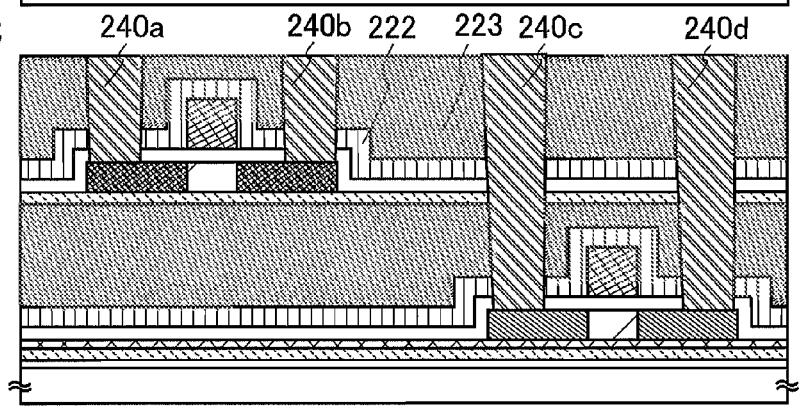

In this embodiment mode, the wiring layers 240a and 240b are formed as embedded wiring layers to fill contact holes formed in the gate insulating layer 217, the insulating film 222, and the interlayer insulating layer 223; and the wiring layers 240c and 240d are formed as embedded wiring layers to fill contact holes formed in the gate insulating layer 205, the insulating film 210, the interlayer insulating layer 211, the insulating layer 212, the gate insulating layer 217, the insulating film 222, and the interlayer insulating layer 223 (see FIG. 8C). The wiring layers 240a, 240b, 240c, and 240d, which are the embedded wiring layers, are formed by forming a conductive film having an enough thickness to fill the contact holes and polishing the conductive film by a CMP method or the like so that the conductive film can remain only in contact hole portions and an unnecessary part of the conductive film are removed.

As lead wiring layers, the wiring layers 241a, 241b, and 241c are formed over the wiring layers 240a, 240b, 240c, and 240d which are embedded, whereby the wiring layers 224, 225, and 226 are formed.

Figure 8D:
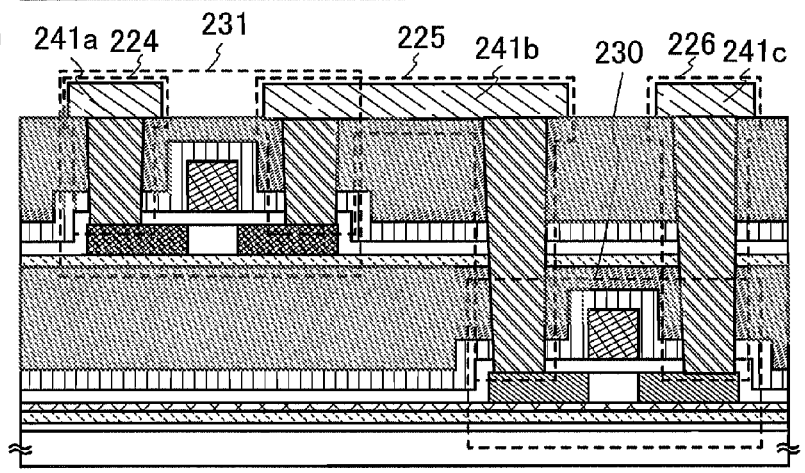

Through the above-described steps, a semiconductor device having a CMOS structure, including the field-effect transistor 230, which is an n-channel field-effect transistor, and the field-effect transistor 231, which is a p-channel field-effect transistor, can be manufactured (see FIG. 8D). Note that the field-effect transistor 230 and the field-effect transistor 231 are electrically connected by the wiring layer 225.

The field-effect transistor 230 is bonded to the insulating layer 104 and is provided over the supporting substrate 101, while the field-effect transistor 231 is bonded to the insulating layer 212 which is formed over the interlayer insulating layer 211 covering the field-effect transistor 230 and is provided over the interlayer insulating layer 211. The field-effect transistor 230 and the field-effect transistor 231 are stacked.

In the present invention, since a high performance semiconductor element can have a stacked structure, a semiconductor device can be more highly integrated. The circuit area of the more highly integrated semiconductor device is smaller and wiring capacitance is reduced. Therefore, low power consumption can be realized.

In addition, in attaching the semiconductor layers to the supporting substrate, the semiconductor layers are formed over different planarized insulating layers; therefore, the insulating layers and the semiconductor layers can be easily bonded to each other.

As in this embodiment mode, when semiconductor layers which form field-effect transistors of different conductivity types are formed over different insulating layers, parasitic capacitance between the semiconductor layers of the field-effect transistors of different conductivity types and parasitic capacitance between the gate electrode layers of the field-effect transistors of different conductivity types can be reduced. Accordingly, a high performance semiconductor device can be manufactured.

The field-effect transistor is not limited to the one described in this embodiment mode, and may have a single gate structure, in which one channel formation region is formed, a double gate structure, in which two channel formation regions are formed, or a triple gate structure, in which three channel formation regions are formed.

In addition, while this embodiment mode describes a CMOS structure in which the field-effect transistors which are stacked have different conductivity types, field-effect transistors of a single conductivity type may be stacked.

As described above, in this embodiment mode, semiconductor devices including more highly integrated and higher performance semiconductor elements can be manufactured.

Note that in the present invention, a semiconductor device refers to a device which can function by utilizing the semiconductor characteristics. According to the present invention, a device having a circuit including semiconductor elements (e.g., transistors, memory elements, or diodes) or a semiconductor device such as a chip including a processor circuit can be manufactured.

(Embodiment Mode 2)

This embodiment mode describes an example of a step for bonding a semiconductor layer from a semiconductor substrate to a supporting substrate, which is different from that in Embodiment Mode 1. Therefore, repetitive descriptions for the same components as or components having similar functions to the components in Embodiment Mode 1 are omitted.

In this embodiment mode, when a semiconductor layer is transferred from a semiconductor substrate, the semiconductor substrate is selectively etched (this step is also referred to as a groove processing), and a plurality of semiconductor layers which are divided to have the size of semiconductor elements to be manufactured are transferred to a supporting substrate. Thus, a plurality of island-shaped semiconductor layers can be formed over the supporting substrate. The semiconductor layers which are processed into an element size in advance are transferred; therefore, the semiconductor layers can be transferred to the supporting substrate in units of the semiconductor layers. Therefore, the size and shape of the semiconductor substrate are not limited. Accordingly, semiconductor layers can be more efficiently transferred to a large-sized supporting substrate.

The semiconductor layer which is thus formed over the supporting substrate may be etched so that the shape of the semiconductor layer is processed, modified, and controlled precisely. Accordingly, it is possible to repair an error in a formation position and a defect in the shape of the semiconductor layer which are caused by the diffraction of the exposed light in the formation of a resist mask or by positional misalignment in the bonding step of the transferring process.

Accordingly, a plurality of semiconductor layers having desired shapes can be formed over the supporting substrate with a high yield. Therefore, a semiconductor device which includes high performance semiconductor elements and integrated circuit which are more precise can be manufactured over a large-sized substrate with high throughput and high productivity.

Figure 5A:
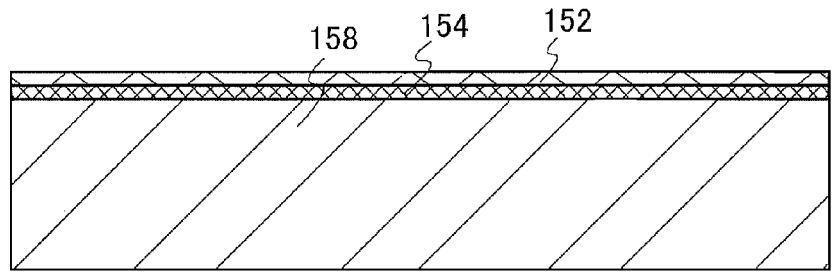
FIGS. 5A to 5E illustrate a method for manufacturing a semiconductor device of the present invention.

FIG. 5A illustrates a state in which a protective layer 154 and a silicon nitride film 152 are formed over a semiconductor substrate 158. The silicon nitride film 152 is used as a hard mask in performing groove processing on the semiconductor substrate 158. The silicon nitride film 152 may be formed by depositing silane and ammonia by a vapor deposition method.

Figure 5B:
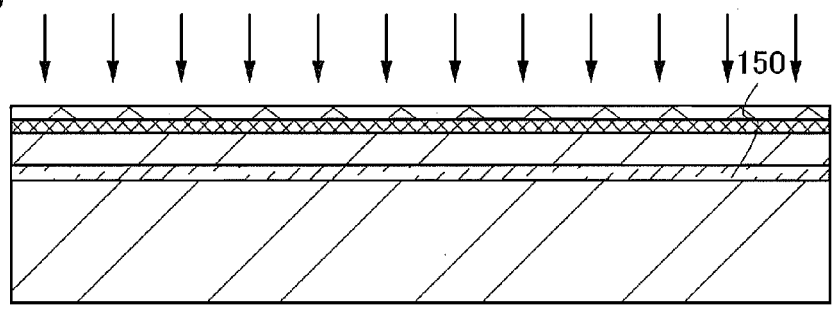
Figure 5C:
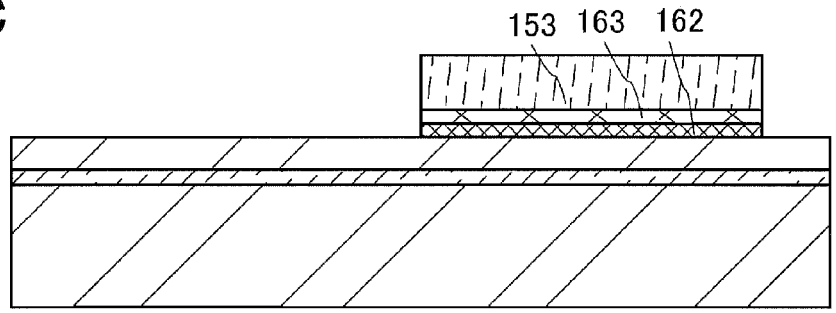

Next, ion irradiation is performed to form a fragile layer 150 in the semiconductor substrate 158 (see FIG. 5B). The ion irradiation is performed in consideration of the thickness of a semiconductor layer which is to be transferred to a supporting substrate. An accelerating voltage for irradiating the semiconductor substrate 158 with ions is determined taking such a thickness into consideration, so that a deep part of the semiconductor substrate 158 is irradiated. With this treatment, the fragile layer 150 is formed in a region at a certain depth from the surface of the semiconductor substrate 158.

The groove processing is performed in consideration of the shapes of semiconductor layers of semiconductor elements. That is, in order to transfer the semiconductor layer of the semiconductor element to the supporting substrate, the groove processing is performed on the semiconductor substrate 158 such that a semiconductor layer which is to be transferred remains as a convex portion.

A mask 153 is formed of photoresist. The silicon nitride film 152 and the protective layer 154 are etched using the mask 153, whereby a protective layer 162 and a silicon nitride layer 163 are formed (see FIG. 5C).

Figure 5D:
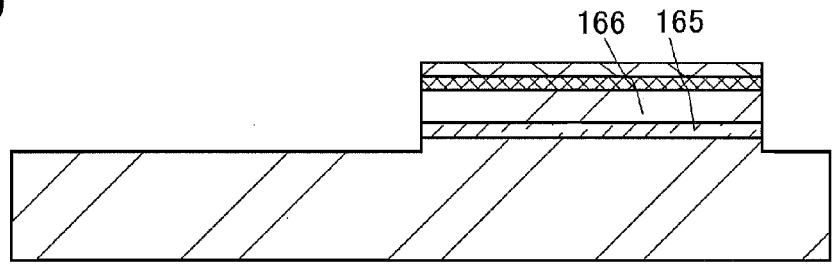

Next, the semiconductor substrate 158 is etched using the silicon nitride layer 163 as a hard mask to form the semiconductor substrate 158 having a fragile layer 165 and a semiconductor layer 166 (see FIG. 5D). In the present invention, a semiconductor region which is interposed between the fragile layer 165 and the protective layer 162 and is processed into a convex shape is referred to as the semiconductor layer 166, as illustrated in FIG. 5D.

The depth of etching the semiconductor substrate 158 is determined as appropriate in consideration of the thickness of the semiconductor layer 166 which is transferred to the supporting substrate. The thickness of the semiconductor layer 166 can be determined according to the depth where hydrogen ions reach by irradiation. The surface of the groove in the semiconductor substrate 158 is preferably lower than the fragile layer. In this groove processing, if the surface of the groove in the semiconductor substrate 158 is set to be lower than the fragile layer, the fragile layer can be left only under a region of the semiconductor layer 166 which is to be released.

Figure 5E:
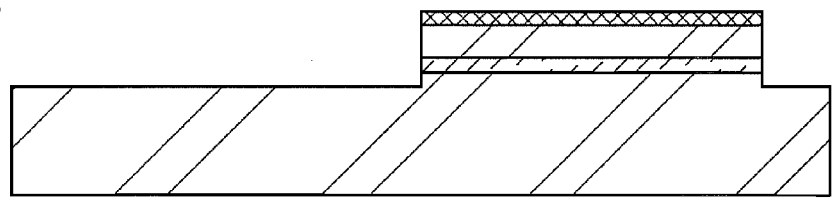

The silicon nitride layer 163 on the surface is removed (see FIG. 5E). Then, the surface of the protective layer 162 and a supporting substrate 151 are bonded to each other (see FIG. 6A).

The surface of the supporting substrate 151 is provided with a blocking layer 159 and an insulating layer 157. The blocking layer 159 is provided so as to prevent impurities such as sodium ions from diffusing from the supporting substrate 151 and contaminating the semiconductor layer. Note that, in the case where it is negligible that diffusion of impurities from the supporting substrate 151 may cause adverse effects on the semiconductor layer, the blocking layer 159 can be omitted. Meanwhile, the insulating layer 157 is provided to form a bond with the protective layer 162.

The bond can be formed by disposing the protective layer 162 of the semiconductor substrate 158 and the insulating layer 157 of the supporting substrate, the surfaces of which are cleaned, in close contact with each other. The bond can be formed at room temperature. This bond is performed at an atomic level, and a strong bond is formed at room temperature by van der Waals forces. Since groove processing is performed on the semiconductor substrate 158, a convex portion which includes the semiconductor layer 166 comes into contact with the supporting substrate 151.

Figure 6A:
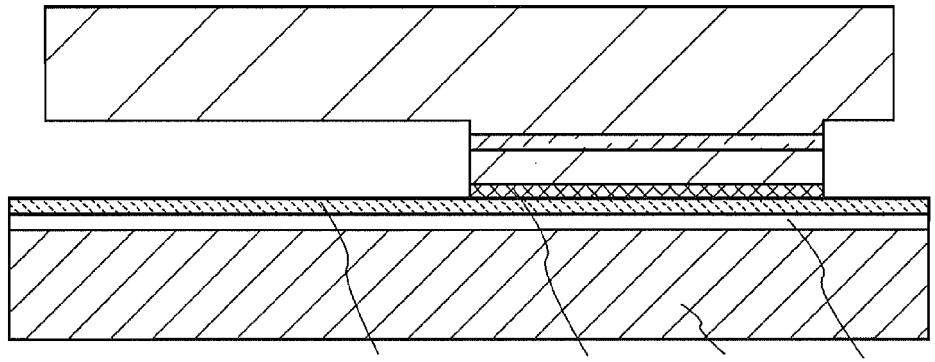
FIGS. 6A to 6D illustrate a method for manufacturing a semiconductor device of the present invention.
Figure 6B:
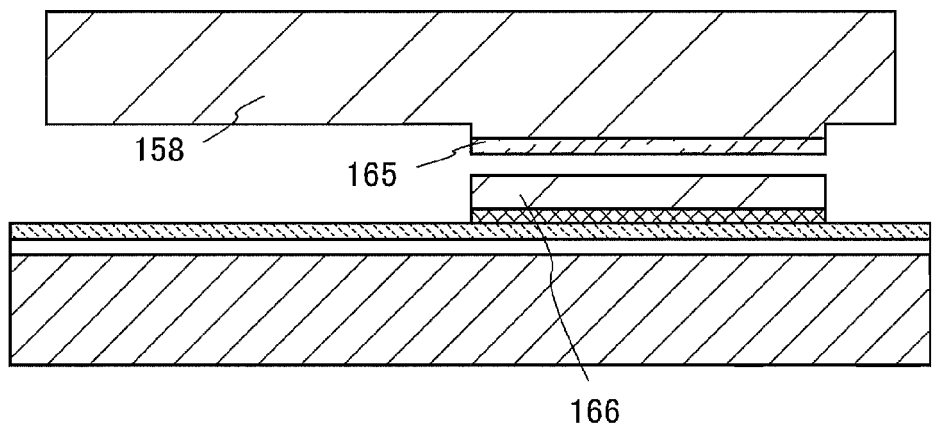

After a bond is formed between the semiconductor substrate 158 and the supporting substrate 151, heat treatment is performed to release a semiconductor layer 166 from the semiconductor substrate 158 and to fasten the semiconductor layer 166 to the supporting substrate 151, as illustrated in FIG. 6B. The volume of microvoids formed in the fragile layer 150 is changed and then a cleavage section is generated along the fragile layer 150, whereby the semiconductor layer is released. After that, heat treatment is preferably performed to further strengthen the bond. Thus, the semiconductor layer is formed over the insulating surface. FIG. 6B illustrates a state in which the semiconductor layer 166 is bonded to the supporting substrate 151.

In this embodiment mode, since the semiconductor layers which are processed into an element size in advance are transferred, transfer to the supporting substrate can be performed in units of the semiconductor layers; therefore, the size and shape of the semiconductor substrate are not limited. Accordingly, semiconductor layers having various shapes can be formed over the semiconductor substrate. For example, the shapes of the semiconductor layers can be freely formed in accordance with a mask of a light-exposure apparatus which is used for etching, a stepper of the light-exposure apparatus for forming a mask pattern, and a panel or chip size of a semiconductor device which is cut from a large-sized substrate.

The semiconductor layer 166 may be directly used as a semiconductor layer of a semiconductor element, or may be etched to process the shape.

Figure 6C:
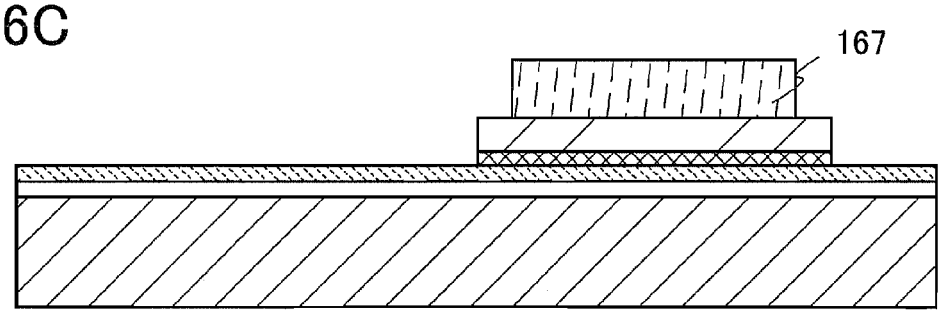
Figure 6D:
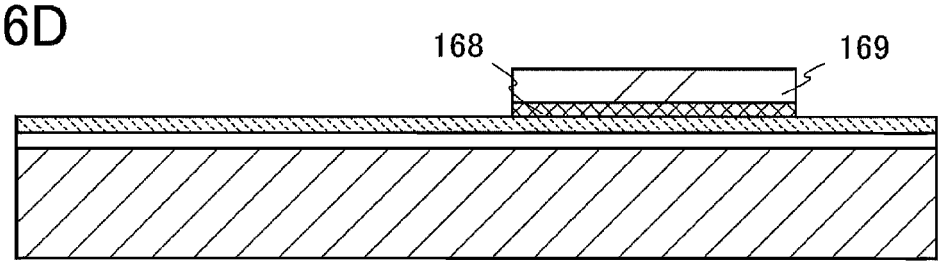

FIGS. 6C and 6D illustrate an example in which the semiconductor layer 166 which is transferred is etched to process the shape. A mask 167 is formed to expose a periphery of the semiconductor layer 166, which is an unnecessary part.

The semiconductor layer 166 is etched using the mask 167 to form a semiconductor layer 169. In this embodiment mode, a part of the protective layer 162 under the semiconductor layer is etched together with the semiconductor layer, resulting in a protective layer 168 (see FIG. 6D). In this manner, when the shape of the semiconductor layer is further processed after the semiconductor layer is transferred to the supporting substrate, misalignment of a region where the semiconductor layer is formed, defects in shape, or the like which occur in a manufacturing process can be repaired.

FIGS. 5A to 5E and FIGS. 6A to 6D illustrate an example in which a semiconductor layer is transferred to an insulating layer over the supporting substrate. Note that this embodiment mode can be employed for forming a semiconductor layer over the insulating layer which is over an interlayer insulating layer, as a semiconductor layer of a semiconductor element which is in the upper layer.

This embodiment mode can be implemented in combination with Embodiment Mode 1, as appropriate.

(Embodiment Mode 3)

This embodiment mode describes an example of a step for bonding a semiconductor layer from a semiconductor substrate to a supporting substrate, which is different from that in Embodiment Mode 1. Therefore, repetitive descriptions for the same components as or components having similar functions to the components in Embodiment Mode 1 are omitted.

This embodiment mode describes an example in which after a semiconductor layer is separated from a semiconductor substrate, the semiconductor layer is bonded to a supporting substrate.

Figure 15A:
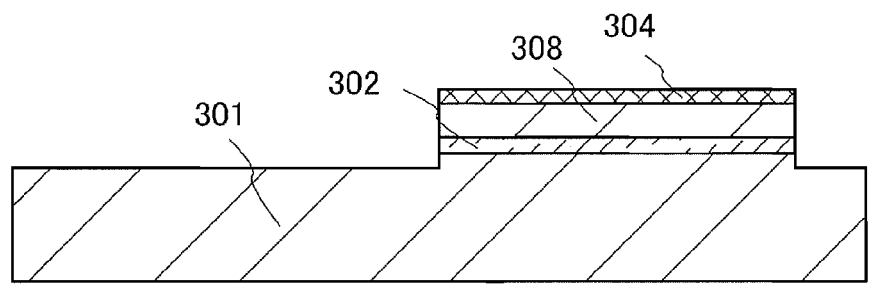
FIGS. 15A to 15D illustrate a method for manufacturing a semiconductor device of the present invention.

As described in Embodiment Mode 2 with reference to FIGS. 5A to 5E, the fragile layer is formed in the semiconductor substrate, and a groove is formed. The groove processing is performed in consideration of the shape of a semiconductor layer of a semiconductor element. That is, in order to transfer the semiconductor layer of the semiconductor element to the supporting substrate, the groove processing is performed on a semiconductor substrate 301 such that a portion which is transferred as the semiconductor layer remains as a convex portion. In FIG. 15A, the semiconductor substrate 301, a fragile layer 302, a semiconductor layer 308 which is a part of the semiconductor substrate 301, and an insulating film 304 are formed. In this embodiment mode, silicon oxide is used for the insulating film 304.

Next, heat treatment is performed, whereby microvoids in the fragile layer 302 are increased in volume. As a result, the semiconductor substrate 301 is separated at the fragile layer 302; thus, the semiconductor layer 308 is released with the insulating film 304 from the semiconductor substrate 301. For example, the heat treatment may be performed in a temperature range of from 400° C. to 600° C.

Note that the heat treatment may be performed using dielectric heating with high frequency waves such as microwaves. The heat treatment using the dielectric heating can be performed by irradiating the semiconductor substrate 301 with high frequency waves in the range of from 300 MHz to 3 THz which is generated at a high-frequency generator.

Specifically, for example, irradiation is performed with a microwave of 2.45 GHz at 900 W for 14 minutes to expand the volume of the microvoids in the fragile layer; thus, the semiconductor substrate 301 is finally separated.

Figure 15B:
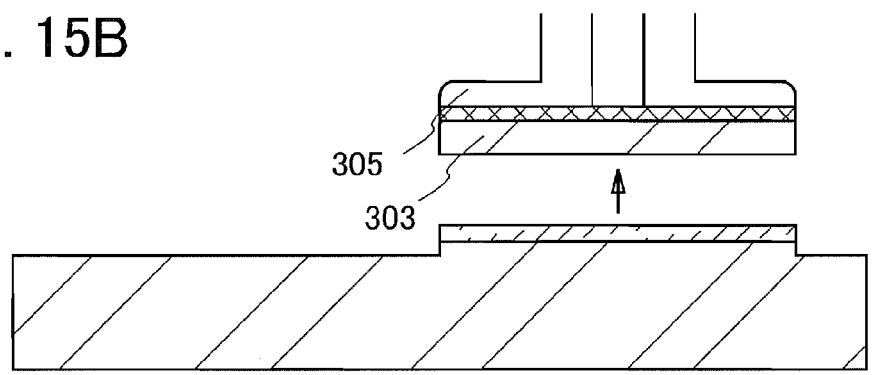

Then, as illustrated in FIG. 15B, a collet 305 is fixed to the insulating film 304 formed over the semiconductor layer 308, and the semiconductor layer 308 is pulled apart from the semiconductor substrate 301. Even if separation of the semiconductor substrate 301 by the above heat treatment is incomplete, force is applied using the collet 305, whereby the semiconductor layer 308 is completely released from the semiconductor substrate 301 and a semiconductor layer 303 can be obtained. The collet 305 can be a means that can be selectively fixed to one of the semiconductor layers 308, such as a chuck such as a vacuum chuck or a mechanical chuck, or a microneedle tipped with an adhesive. FIG. 15B illustrates a case where a vacuum chuck is used as the collet 305.

As the adhesive which is adhered to a microneedle, an epoxy-based adhesive, a ceramic-based adhesive, a silicone-based adhesive, a low temperature coagulant, or the like can be used. As the low temperature coagulant, for example, MW-1 (made by Eminent Supply Corporation) can be used. MW-1 has a freezing point of 17° C. and has a bonding effect at a temperature less than or equal to the freezing point (preferably at 10° C. or less) and does not have a bonding effect at a temperature of 17° C. or more (preferably approximately 25° C.).

Note that hydrogenation may be performed on the semiconductor substrate 301 before the separation of the semiconductor substrate 301. The hydrogenation is performed, for example, at 350° C. in a hydrogen atmosphere for approximately two hours.

Figure 15C:
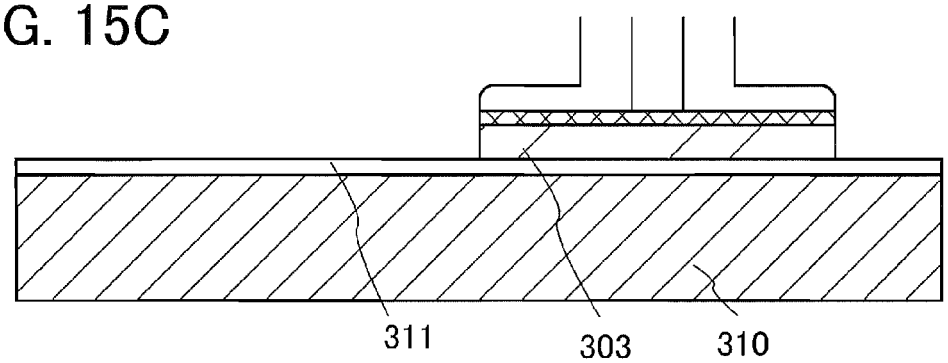

Next, as illustrated in FIG. 15C, the semiconductor layer 303 and a supporting substrate 310 are attached to each other so that a surface exposed by the release of the semiconductor layer 303 faces the supporting substrate 310. In this embodiment mode, because an insulating film 311 is formed over the supporting substrate 310, the insulating film 311 and the semiconductor layer 303 are bonded to each other, whereby the semiconductor layer 303 and the supporting substrate 310 can be attached to each other. After the semiconductor layer 303 and the insulating film 311 are bonded to each other, heat treatment in a temperature range of from 400° C. to 600° C. is preferably performed in order to further strengthen the bond.

The bonding is formed by van der Waals forces, so that a strong bond can be formed even at room temperature. Note that, since the above-described bonding can be formed at low temperature, various substrates can be used as the supporting substrate 310. As the supporting substrate 310, for example, a substrate such as a quartz substrate or a sapphire substrate can be used as well as a glass substrate made of aluminosilicate glass, barium borosilicate glass, aluminoborosilicate glass, or the like. Further, as the supporting substrate 310, a semiconductor substrate formed of silicon, gallium arsenide, indium phosphide, or the like can be used. Alternatively, a metal substrate such as a stainless steel substrate may be used as the supporting substrate 310.

Note that the insulating film 311 is not necessarily formed on the surface of the supporting substrate 310. In the case where the insulating film 311 is not formed, the supporting substrate 310 and the semiconductor layer 303 can be bonded to each other. Note that by formation of the insulating film 311 on the surface of the supporting substrate 310, impurities such as an alkali metal or an alkaline-earth metal can be prevented from entering the semiconductor layer 303 from the supporting substrate 310.

In the case where the insulating film 311 is formed, not the supporting substrate 310 but the insulating film 311 is bonded to the semiconductor layer 303; therefore, kinds of substrates which can be used as the supporting substrate 310 are further increased. A substrate formed from a flexible synthetic resin, such as plastic, generally tends to have a low upper temperature limit, but can be used as the supporting substrate 310 as long as the substrate can withstand processing temperatures in the manufacturing process.

Note that, before or after the semiconductor layer 303 is attached to the supporting substrate 310, thermal annealing which is conducted by irradiation with laser light may be performed on a surface exposed by the release of the semiconductor layer 303. If thermal annealing is performed before the semiconductor layer 303 is attached to the supporting substrate 310, the surface exposed by the release is planarized and bonding strength can be further increased. If thermal annealing is performed after the semiconductor layer 303 is attached to the supporting substrate 310, a part of the semiconductor layer 303 is melted and bonding strength can be further increased.

Not only the heat treatment, but application of a high frequency wave of approximately 10 MHz to 1 THz to the semiconductor layer 303 may be performed to improve the bond strength between the semiconductor layer 303 and the supporting substrate 310. The application of the high frequency wave generates frictional heat between the semiconductor layer 303 and the supporting substrate 310, and the frictional heat allows a part of the semiconductor layer 303 to be melted so that the semiconductor layer 303 is more strongly attached to the supporting substrate 310.

When MW-1 is used as the low temperature coagulant, first, the low temperature coagulant with which a microneedle is tipped is made in contact with the insulating film 304 at a temperature (e.g., approximately 25° C.) where the low temperature coagulant does not have a bonding effect. Next, a temperature is lowered to a temperature (e.g., approximately 5° C.) where the low temperature coagulant has a bonding effect to solidify the low temperature coagulant, whereby the microneedle and the insulating film 304 are fixed to each other. After the semiconductor layer 303 pulled apart from the semiconductor substrate 301 is attached to the supporting substrate 310, the temperature of the low temperature coagulant is raised to a temperature (e.g., approximately 25° C.) where the low temperature coagulant does not have a bonding effect again, whereby the microneedle can be pulled apart from the semiconductor layer 303.

Figure 15D:
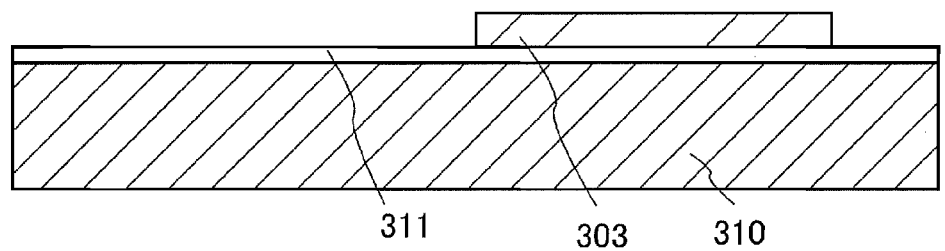

The insulating film 304 over the semiconductor layer 303 is removed, and the semiconductor layer 303 having an island shape is formed over the supporting substrate 310 and the insulating film 311 (see FIG. 15D). The semiconductor layer 303 may be etched to process the shape.

As illustrated in FIGS. 15A to 15D, when the surface of the semiconductor layer which is exposed by the separation faces the supporting substrate, a surface with higher flatness is in contact with a gate insulating film; therefore, an interface state density between the semiconductor layer and the gate insulating film can be low and uniform. Accordingly, polishing for planarizing the surface of the semiconductor layer which comes into contact with the gate insulating film can be omitted, or polishing time can be shortened, whereby cost can be suppressed and throughput can be improved.

Note that the semiconductor layer can be attached to the supporting substrate so that the surface of the semiconductor layer exposed by the separation comes into contact with the gate insulating film. This example is described with reference to FIGS. 16A to 16D and FIGS. 17A to 17C.

Figure 16A:
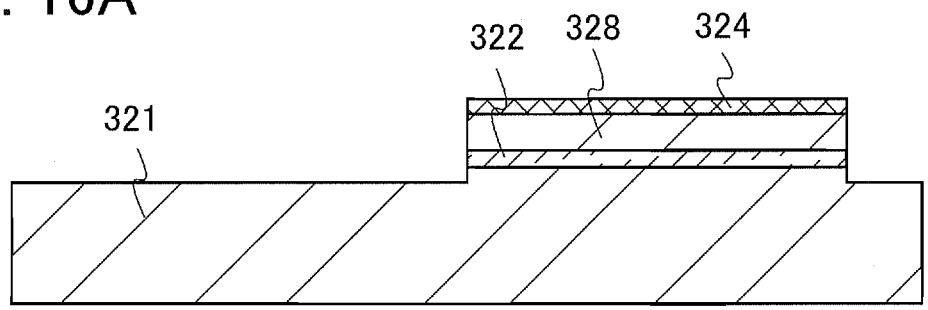
FIGS. 16A to 16D illustrate a method for manufacturing a semiconductor device of the present invention.

In FIG. 16A, a semiconductor substrate 321, a fragile layer 322, a semiconductor layer 328 which is a part of the semiconductor substrate, and an insulating film 324 are formed as in FIG. 15A. In this embodiment mode, silicon oxide is used as the insulating film 324.

Figure 16B:
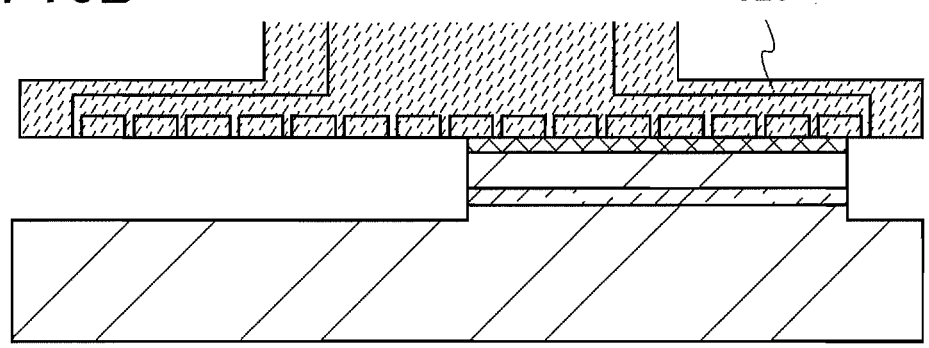

Next, as illustrated in FIG. 16B, the semiconductor substrate 321 is fixed to a holding means 325. The semiconductor substrate 321 is fixed so that the semiconductor layer 328 faces the holding means 325. The holding means 325 can be a large-sized vacuum chuck or mechanical chuck which can withstand heat treatment in a later step and be fixed with a plurality of semiconductor layers (in FIG. 16B, the semiconductor layer 328), specifically, a porous vacuum chuck, a noncontact vacuum chuck, or the like. This embodiment mode describes an example in which a vacuum chuck is used as the holding means 325.

Figure 16C:
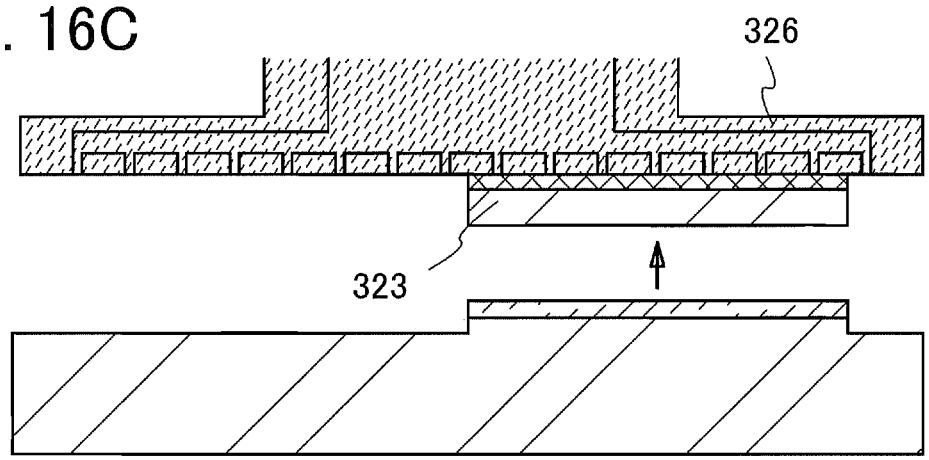

Next, heat treatment is performed, whereby microvoids in the fragile layer 322 are increased in volume. As a result, as illustrated in FIG. 16C, the semiconductor substrate 321 is separated at the fragile layer 322; thus, the semiconductor layer 328, which is a part of the semiconductor substrate 321 is released, as a semiconductor layer 323, with the insulating film 324 from the semiconductor substrate 321. The heat treatment may be performed in a temperature range of from 400° C. to 600° C., for example.

Note that the heat treatment may be performed using dielectric heating with high frequency waves such as microwaves.

Before separation of the semiconductor substrate 321, hydrogenation may be performed on the semiconductor substrate 321.

Figure 16D:
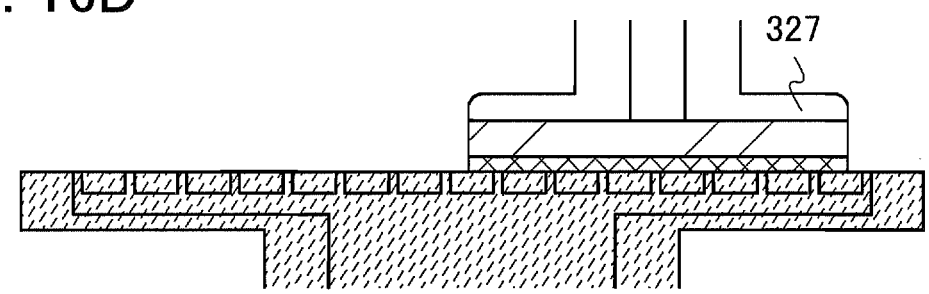
Figure 17A:
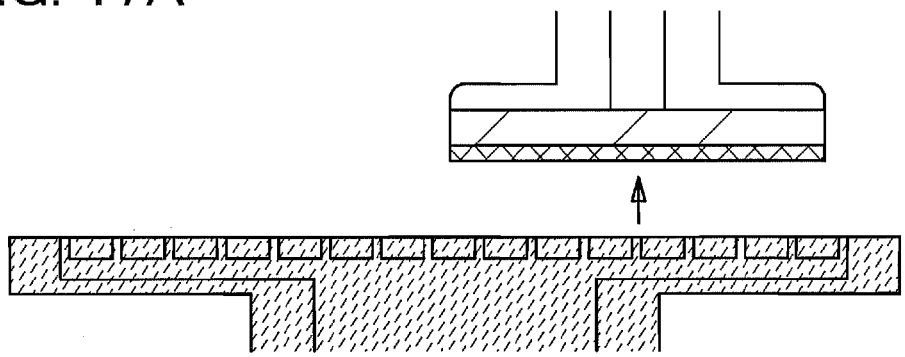
FIGS. 17A to 17C illustrate a method for manufacturing a semiconductor device of the present invention.

Then, as illustrated in FIG. 16D and FIG. 17A, a collet 327 is fixed to the surface of the semiconductor layer 323 which is exposed by the separation, and the semiconductor layer 323 is pulled apart from the holding means 325. The collet 327 can be a means that can be selectively fixed to the semiconductor layer 323, such as a chuck such as a vacuum chuck or a mechanical chuck, or a microneedle tipped with an adhesive. FIG. 16D and FIG. 17A illustrate a case where a vacuum chuck is used as the collet 327.

Note that this embodiment mode describes an example in which the collet 327 is fixed to the surface of the semiconductor layer 323 which is exposed by the separation; however, a protective film such as an insulating film may be formed so as to prevent the semiconductor layer 323 from being damaged by the collet 327. Note that the above-described protective film is removed after the semiconductor layer 323 is attached to a supporting substrate 330 in a later step.

As the adhesive which is adhered to a microneedle, an epoxy-based adhesive, a ceramic-based adhesive, a silicone-based adhesive, a low temperature coagulant, or the like can be used.

Figure 17B:
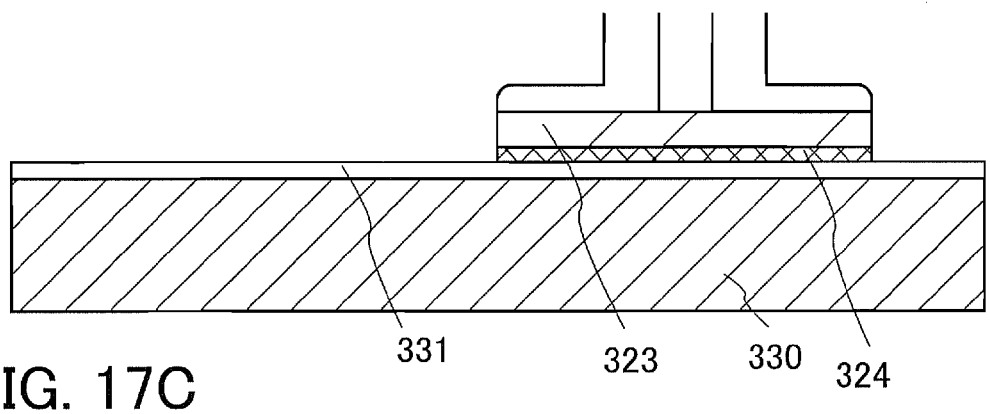
Figure 17C:
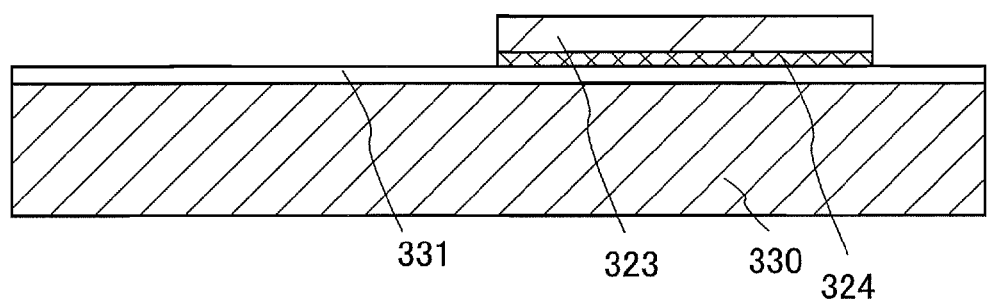

Next, as illustrated in FIG. 17B, the semiconductor layer 323 and the supporting substrate 330 are attached to each other so that the insulating film 324 faces the supporting substrate 330, that is, a surface opposite to the surface exposed by the separation faces the supporting substrate 330. In this embodiment mode, because an insulating film 331 is formed over the supporting substrate 330, the insulating film 324 and the insulating film 331 are bonded to each other, whereby the semiconductor layer 323 and the supporting substrate 330 can be attached to each other (see FIG. 17C). After the insulating film 324 and the insulating film 331 are bonded to each other, heat treatment in a temperature range of from 400° C. to 600° C. is preferably performed in order to further strengthen the bond.

The bonding is formed by van der Waals forces, so that a strong bond can be formed even at room temperature. Since the above-described bonding can be performed at a low temperature, various substrates can be used as the supporting substrate 330.

Note that the insulating film 331 is not necessarily formed on the surface of the supporting substrate 330.

There are a case where the semiconductor substrate is warped or deformed and a case where an end portion of the semiconductor substrate is slightly rounded. Further, there are cases where, in order to release a semiconductor layer from the semiconductor substrate, even if a semiconductor substrate is irradiated with hydrogen or a rare gas, or their ions, the irradiation is not sufficiently performed on the end portion of the semiconductor substrate, and it is difficult to release a portion of the semiconductor layer which is at the end portion of the semiconductor substrate. Accordingly, in the case where a semiconductor substrate is attached to a supporting substrate, and then the semiconductor substrate is separated to form semiconductor layers, the distance between the semiconductor layers may be from several millimeters to several centimeters. However, in this embodiment mode, before the semiconductor substrate is attached to the supporting substrate, the semiconductor substrate is separated to form the semiconductor layer with desired size. Thus, when the semiconductor layers are attached to the supporting substrate, the distance between the semiconductor layers can be suppressed as small as approximately several tens of micrometers, and it is easy to form a semiconductor device including adjacent semiconductor layers.

In a method for manufacturing a semiconductor device of this embodiment mode, since a plurality of semiconductor layers can be attached to one supporting substrate by using a plurality of semiconductor substrates, processing can be performed with high throughput. In addition, a plane orientation of the semiconductor layer can be selected as appropriate in accordance with the polarity of a semiconductor element; therefore, mobility of the semiconductor element can be increased, and a semiconductor device that can operate at higher speed can be provided.

In addition, a plurality of semiconductor layers can be formed by separating the semiconductor substrate at a plurality of points of the semiconductor substrate and attached to a supporting substrate. Therefore, a plurality of semiconductor layers can be bonded at arbitrary position on a supporting substrate in accordance with polarity and layout of semiconductor elements in a semiconductor device.

This embodiment mode can be implemented in combination with Embodiment Mode 1, as appropriate.

(Embodiment Mode 4)

This embodiment mode describes a structure of a manufacturing apparatus of a semiconductor device which can be applied to the present invention (in particular, to Embodiment Mode 3).

Figure 18A:
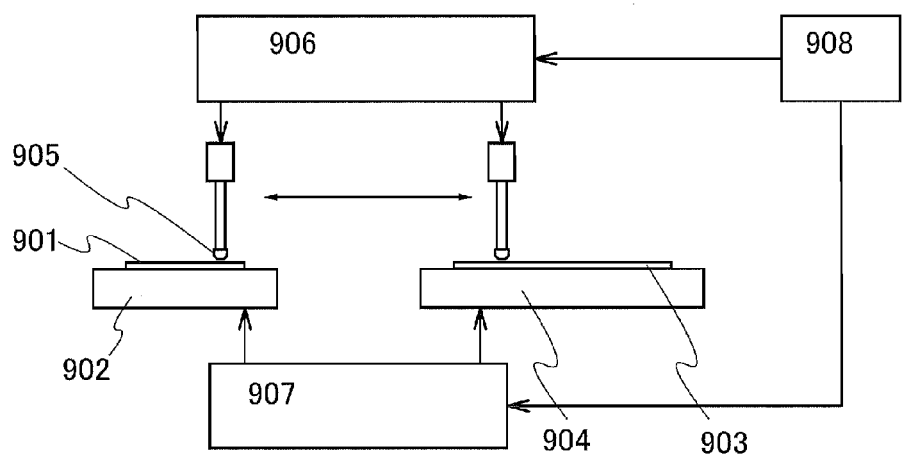
FIGS. 18A and 18B illustrate a manufacturing apparatus of a semiconductor device which can be applied to the present invention.

FIG. 18A illustrates a structure of a manufacturing apparatus which can be applied to the present invention (in particular, to Embodiment Mode 3) as an example. The manufacturing apparatus illustrated in FIG. 18A includes a stage 902 over which a semiconductor substrate 901 is placed, and a stage 904 over which a supporting substrate 903 is placed. Note that FIG. 18A illustrates an example in which the semiconductor substrate 901 and the supporting substrate 903 are placed over different stages; however, the present invention is not limited to this structure. The semiconductor substrate 901 and the supporting substrate 903 can be placed over one stage.

FIG. 18A illustrates one stage 902 over which one semiconductor substrate 901 is placed; however, the present invention is not limited to this structure. For example, a manufacturing apparatus which can be applied to the present invention may include a plurality of the stages 902 over which one semiconductor substrate 901 is placed. Alternatively, a plurality of the semiconductor substrates 901 may be placed over the stage 902.

The manufacturing apparatus illustrated in FIG. 18A includes a collet 905 which is fixed to a semiconductor layer formed by separation of the semiconductor substrate 901 and attaches the semiconductor layer to a predetermined position of the supporting substrate 903. The collet 905 can be a means that can be selectively fixed to one of the semiconductor layers, such as a chuck such as a vacuum chuck or a mechanical chuck, or a microneedle tipped with an adhesive.

In addition, the manufacturing apparatus illustrated in FIG. 18A at least includes a collet driving portion 906 which controls the position of the collet 905, a stage driving portion 907 which controls positions of the stage 902 and the stage 904, and a CPU 908 which controls operations of the collet driving portion 906 and the stage driving portion 907 in accordance with positional information of the collet or positional information of the stage.

The positional information of the collet or the positional information of the stage can be obtained based on positional information where a semiconductor layer is formed in the semiconductor substrate 901 and where the semiconductor layer is attached to the supporting substrate 903. Note that the manufacturing apparatus illustrated in FIG. 18A may be provided with a camera having an image sensor such as a charge coupled device (CCD) in order to position the semiconductor substrate 901 or the supporting substrate 903.

When a heat sink for absorbing and dissipating heat of the semiconductor substrate 901 is provided over the stage 902 and a microneedle tipped with a low temperature coagulant is provided as the collet 905, the temperature of the semiconductor substrate 901 can be efficiently lowered by using the heat sink.

Figure 18B:
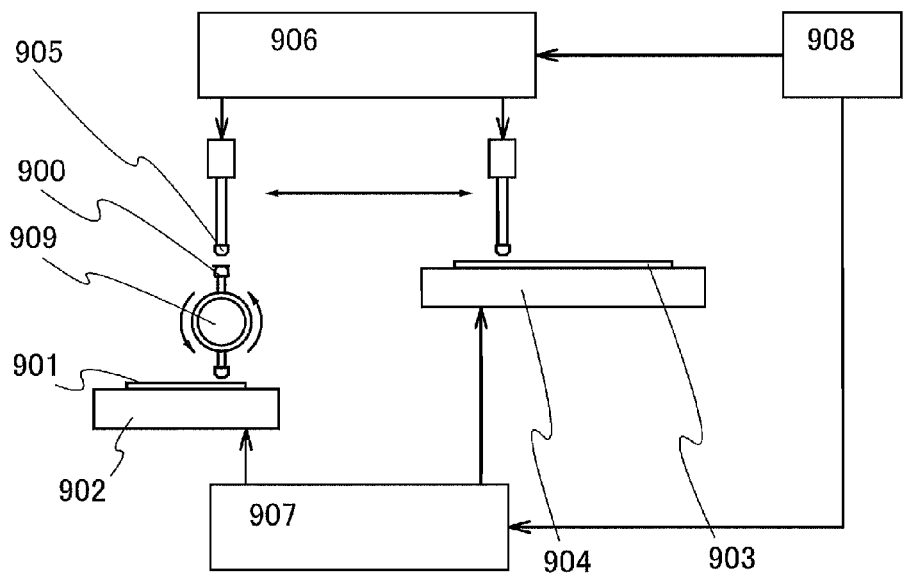

In addition, a manufacturing apparatus which can be applied to the present invention may have a reversing device for picking up a semiconductor layer from the semiconductor substrate 901 and then reversing the semiconductor layer. FIG. 18B illustrates a mode in which a reversing device 909 is added to the manufacturing apparatus illustrated in FIG. 18A. The reversing device 909 includes a reverse collet 900 and can pick up a semiconductor layer and temporarily hold it by using the reverse collet 900. The collet 905 is fixed to a side of a semiconductor layer which is opposite to the side fixed to the reverse collet 900, whereby the collet 905 can receive the semiconductor layer from the reverse collet 900.

Figure 19:
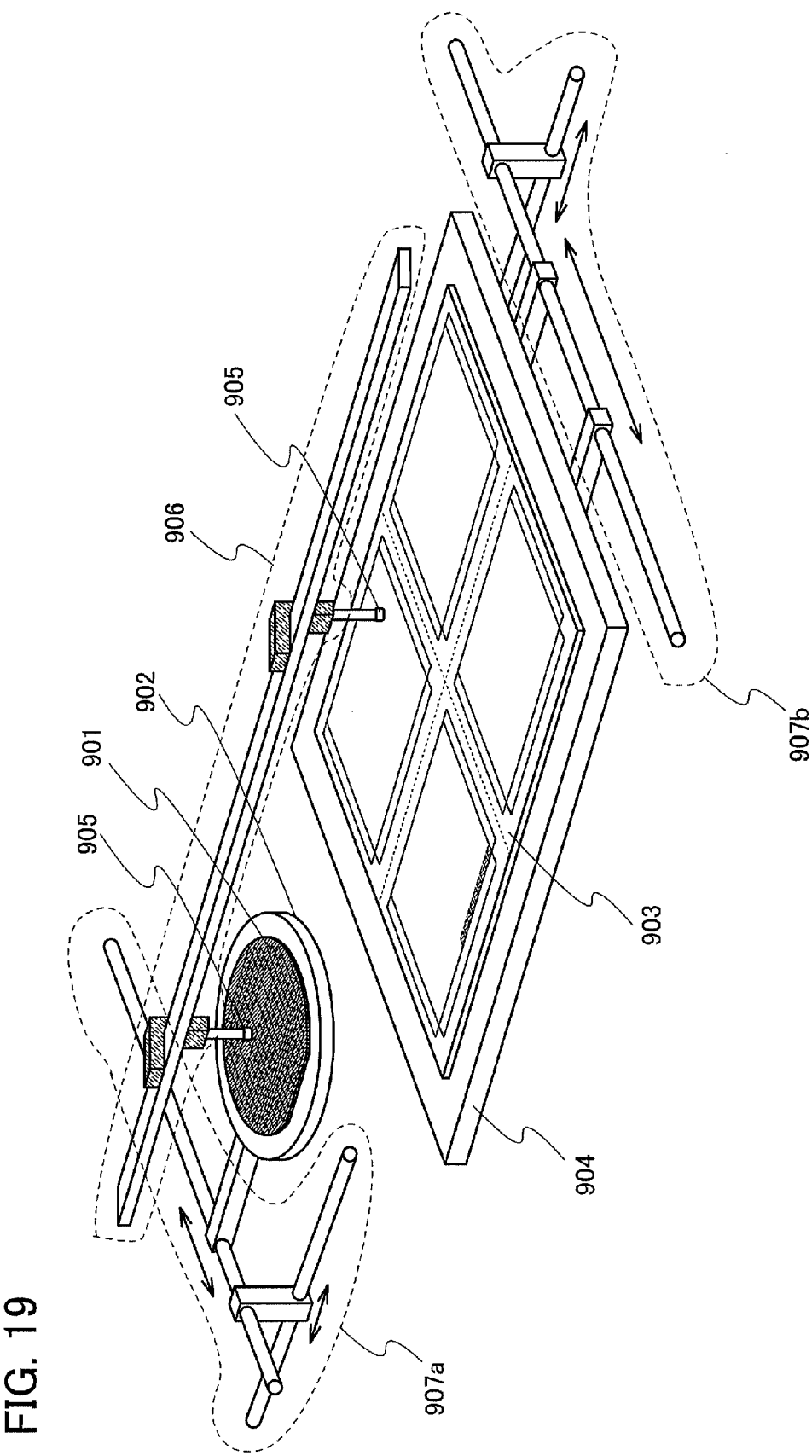
FIG. 19 illustrates a manufacturing apparatus of a semiconductor device which can be applied to the present invention.

Next, in order to show a positional relationship and specific structures of the semiconductor substrate 901, the stage 902, the supporting substrate 903, the stage 904, the collet 905, the collet driving portion 906, and the stage driving portion 907 illustrated in FIG. 18A, a perspective diagram of them is illustrated in FIG. 19. Note that FIG. 19 illustrates an example in which a stage driving portion 907*a* which controls the operation of the stage 902 and a stage driving portion 907*b* which controls the operation of the stage 904 are used.

In accordance with instructions from the CPU 908, the stage driving portion 907*a* moves the stage 902 in the X direction or the Y direction intersecting the X direction. Note that the stage driving portion 907*a* may move the stage 902 in the Z direction, as well as the X direction or the Y direction. The Z direction exists on a plane different from the plane formed by the X direction and the Y direction. Similarly, the stage driving portion 907*b* moves the stage 904 in the X direction or the Y direction intersecting the X direction. The stage driving portion 907b may move the stage 904 in the Z direction, as well as the X direction or the Y direction. The Z direction exists on a plane different from the plane formed by the X direction and the Y direction.

The collet 905 picks up one of a plurality of semiconductor layers formed by separation of the semiconductor substrate 901. Then, the collet driving portion 906 transfers the collet 905 from the semiconductor substrate 901 to the supporting substrate 903, while the collet 905 holds the semiconductor layer. Note that FIG. 19 illustrates an example in which one collet 905 comes and goes between the semiconductor substrate 901 and the supporting substrate 903; however, a plurality of the collets 905 may be used. When a plurality of the collets 905 are used, a plurality of the collet driving portions 906 for independently controlling the operation of each of the plurality of the collets 905 may be prepared, or all the collets 905 may be controlled by one collet driving portion 906.

Figure 20:
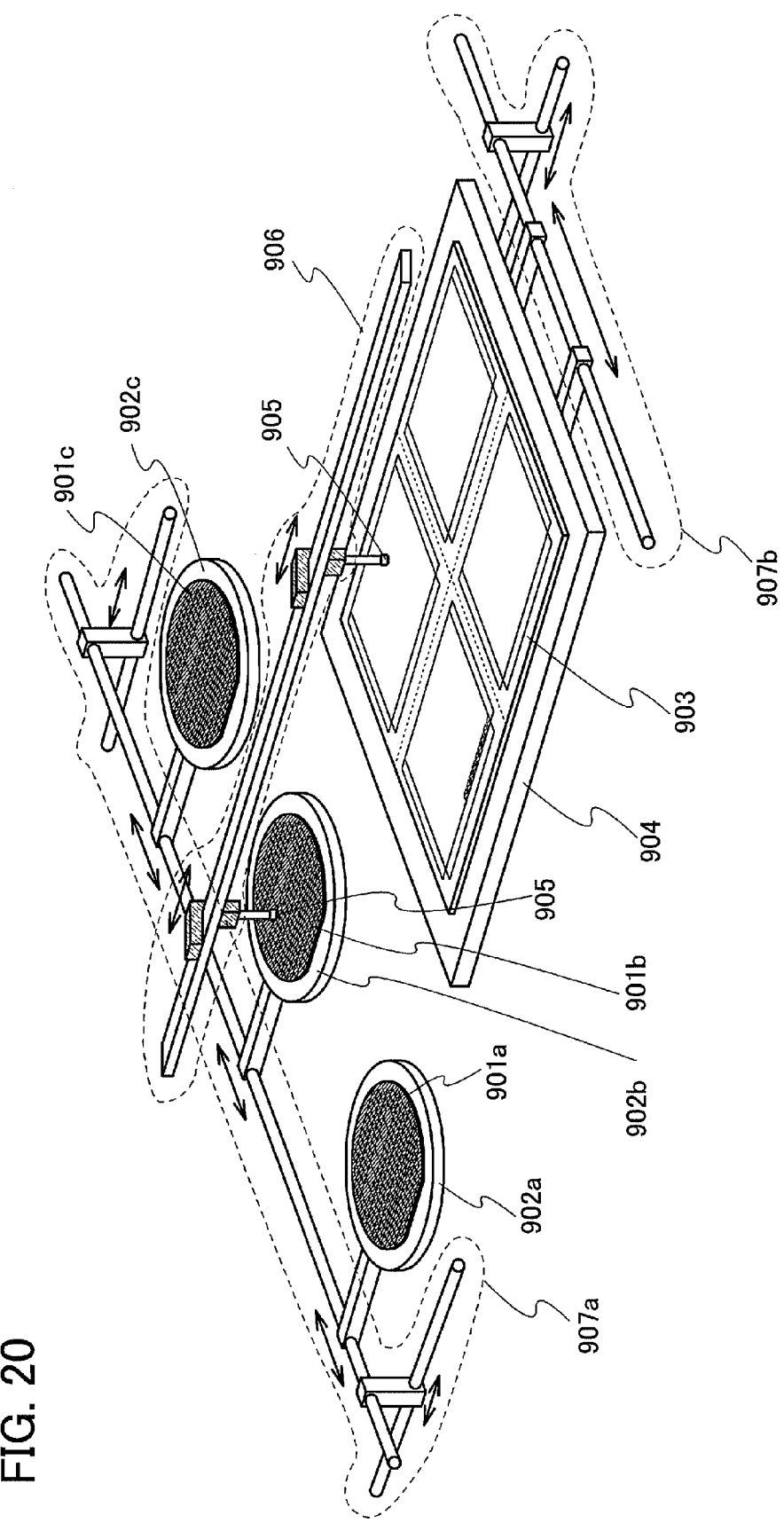
FIG. 20 illustrates a manufacturing apparatus of a semiconductor device which can be applied to the present invention.

Next, FIG. 20 illustrates a mode in which a plurality of the stages 902 are used in FIG. 19. FIG. 20 illustrates an example in which a stage 902a, a stage 902b, and a stage 902c are used, and all of the stage 902a, the stage 902b, and the stage 902c are controlled by the stage driving portion 907a. Note that a plurality of the stage driving portions 907a may be prepared in order to independently control the operation of the stage 902a, the stage 902b, and the stage 902c.

FIG. 20 illustrates a state in which a semiconductor substrate 901a, a semiconductor substrate 901b, and a semiconductor substrate 90k are placed over the stage 902a, the stage 902b, and the stage 901c, respectively. The crystal plane orientations of the semiconductor substrate 901a, the semiconductor substrate 901b, and the semiconductor substrate 901c may be the same or different from one another.

In FIG. 20, the collet 905 picks up one of a plurality of semiconductor layers formed by separation of the semiconductor substrate 901a, the semiconductor substrate 901b, and the semiconductor substrate 901c. Then, the collet driving portion 906 transfers the collet 905 from the semiconductor substrate 901a, the semiconductor substrate 901b, or the semiconductor substrate 901c to the supporting substrate 903, while the collet 905 holds the semiconductor layer. Note that FIG. 20 illustrates an example in which one collet 905 comes and goes between the semiconductor substrate 901a, the semiconductor substrate 901b and the semiconductor substrate 901c, and the supporting substrate 903. However, a plurality of the collets 905 may be used so that at least one collet 905 is used for each of the semiconductor substrate 901a, the semiconductor substrate 901b, and the semiconductor substrate 901c.

The manufacturing apparatus which can be applied to the present invention can transfer and attach a plurality of semiconductor layers formed from one semiconductor substrate 901 to desired positions over the supporting substrate 903, as appropriate.

This embodiment mode can be implemented in combination with Embodiment Mode 3, as appropriate.
(Embodiment Mode 5)

This embodiment mode takes an application example of the crystal plane orientation of the semiconductor layer and the crystal axis of a channel length direction, which are used for field-effect transistors.

As described in Embodiment Modes 1 to 4, in the semiconductor device of the present invention, since the semiconductor layer which is separated and transferred from the semiconductor substrate is used, a crystal plane orientation of the semiconductor layer can be selected by selecting a semiconductor substrate.

In this embodiment mode, a p-channel field-effect transistor is a p-channel distortion field-effect transistor in which a compression distortion is caused to a channel formation region of a semiconductor layer.

In this embodiment mode, in both of an n-channel field-effect transistor and the p-channel field-effect transistor, a semiconductor substrate with a {110} cryystal plane orientation is used and a channel length direction is set to be parallel to a <110> crystal axis.

In the n-channel field-effect transistor, a crystal plane orientation of a semiconductor layer may be {110} and a channel length direction may be set to be parallel to a <100> crystal axis.

As in this embodiment mode, by controlling a distortion caused to a channel formation region of a semiconductor layer, a plane orientation of the semiconductor layer, and a crystal axis in a channel length direction, difference in mobility between an n-channel field-effect transistor and a p-channel field-effect transistor which are included in a semiconductor device is reduced, and current driving capabilities and switching speeds of the n-channel field-effect transistor and the p-channel field-effect transistor can be more comparable to each other. Therefore, an area occupied by the n-channel field-effect transistor and an area occupied by the p-channel field-effect transistor can be nearly comparable, whereby efficiency of circuit design is improved and smaller semiconductor devices with higher integration and higher performance can be provided. The circuit area can be smaller by being highly integrated and wiring capacitance can be reduced. Therefore, low power consumption can be realized.

This embodiment can be implemented in combination with any of Embodiment Modes 1 to 4 as appropriate.
(Embodiment Mode 6)

This embodiment mode describes another application example of a crystal plane orientation of a semiconductor layer and a crystal axis of a channel length direction, which are used for field-effect transistors.

As described in Embodiment Modes 1 to 4, in the semiconductor device of the present invention, since the semiconductor layer which is separated and transferred from the semiconductor substrate is used, a crystal plane orientation of the semiconductor layer can be selected by selecting a semiconductor substrate.

In this embodiment mode, a p-channel field-effect transistor is a p-channel distortion field-effect transistor in which a compression distortion is caused to a channel formation region of a semiconductor layer.

This embodiment mode takes an example in which the semiconductor layers which have different crystal plane orientations are used in the n-channel field-effect transistor and the p-channel field-effect transistor. In the p-channel field-effect transistor, a channel length direction is set to be parallel to a <110> crystal axis by using a semiconductor substrate of which crystal plane orientation is {110}.

On the other hand, in the n-channel field-effect transistor, the crystal plane orientation of the semiconductor layer is set to {100}, and the channel length direction is set to be parallel to a <110> crystal axis.

As in this embodiment mode, by controlling a distortion caused to a channel formation region of the semiconductor layer, a plane orientation of the semiconductor layer, and a crystal axis in a channel length direction, difference in mobility between the n-channel field-effect transistor and the p-channel field-effect transistor which are included in a semiconductor device is reduced, and current driving capabilities and switching speeds of the n-channel field-effect transistor and the p-channel field-effect transistor are more comparable to each other. Therefore, an area occupied by the n-channel field-effect transistor and an area occupied by the p-channel field-effect transistor can be nearly comparable, whereby efficiency of circuit design is improved and smaller semiconductor devices with higher integration and higher performance can be provided. Further, the circuit area can be smaller by being highly integrated and wiring capacitance can be reduced. Therefore, low power consumption can be realized.

This embodiment can be implemented in combination with any of Embodiment Modes 1 to 4 as appropriate.

(Embodiment Mode 7)

This embodiment mode describes an example of a semiconductor device having high performance and high reliability. Specifically, as an example of the semiconductor device, examples of a microprocessor and a semiconductor device which has an arithmetic function and can transmit and receive data without contact are described.

Figure 9:
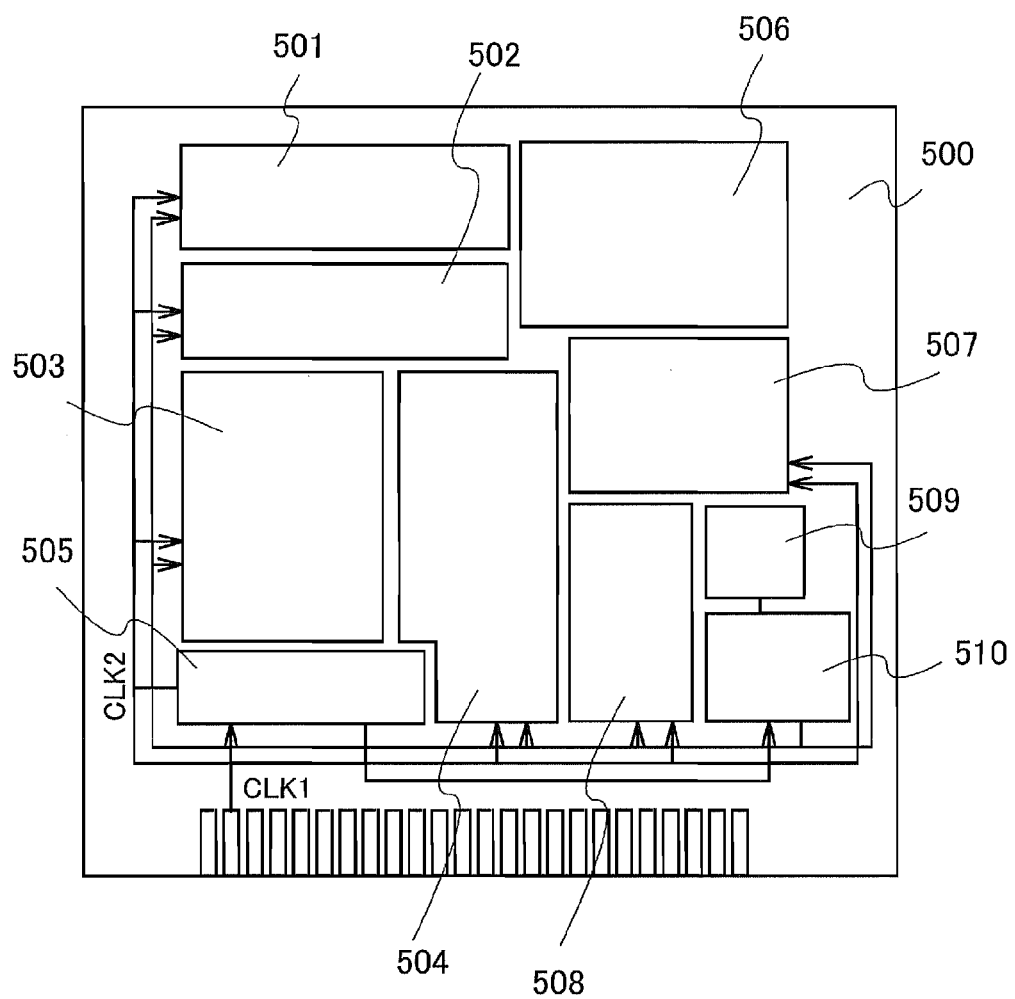
FIG. 9 is a block diagram illustrating a structure of a microprocessor which can be obtained using a semiconductor device of the present invention.

FIG. 9 illustrates an example of a microprocessor 500 as an example of a semiconductor device. The microprocessor 500 is manufactured using the semiconductor device formed according to the above embodiment mode. The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 via the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input and output device or a peripheral circuit based on its priority or a mask state, and processes the request while a program is executed in the microprocessor 500. The register controller 507 generates an address of the register 506, and reads and writes data from and to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the internal clock signal CLK2 to each of the above-described circuits. Note that the microprocessor 500 illustrated in FIG. 9 is just an example of the simplified structure, and practical microprocessors have various structures depending on usage.

Since an integrated circuit is formed using a semiconductor layer with uniform crystal orientation which is bonded to a glass substrate in the microprocessor 500, higher processing speed and lower power consumption can be achieved.

Figure 10:
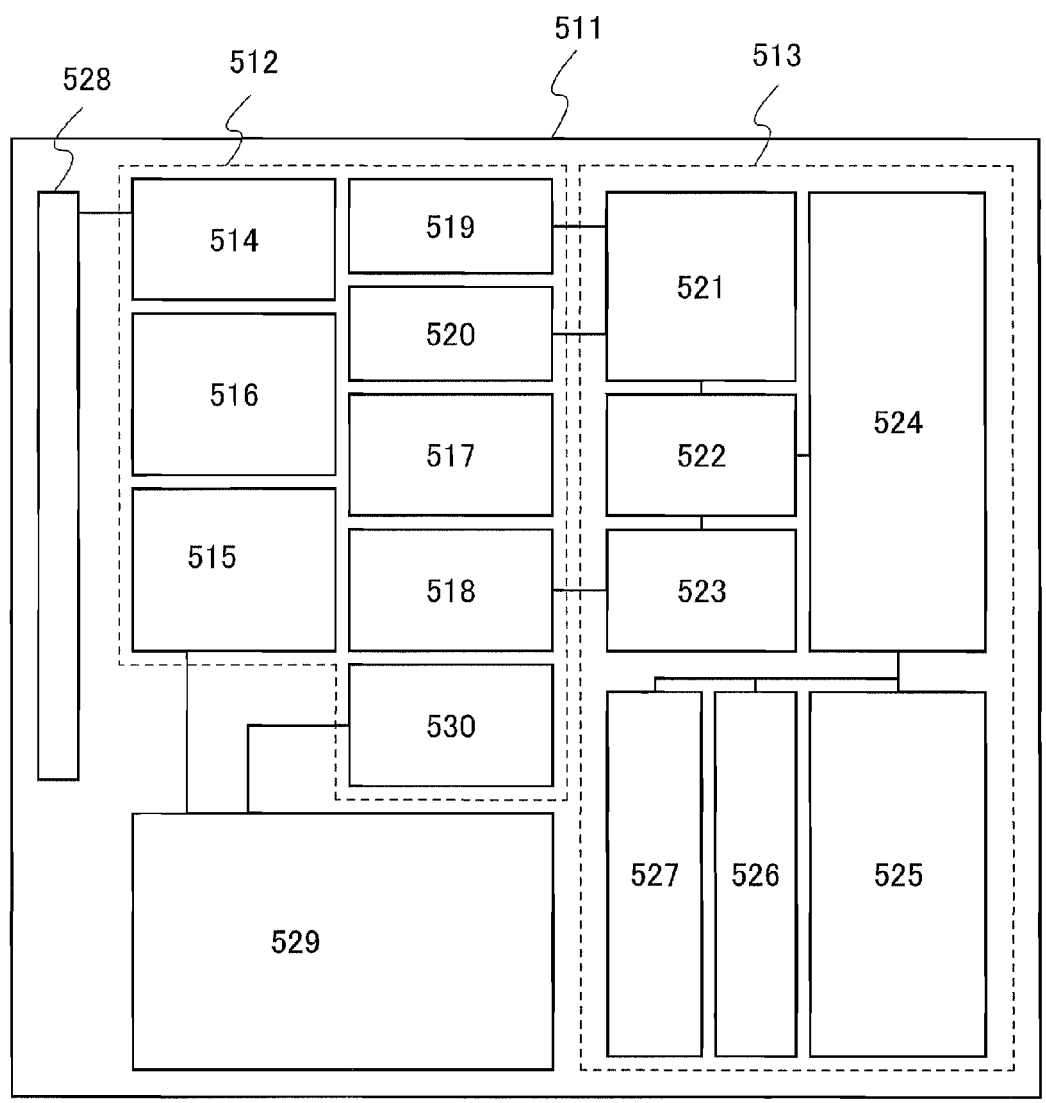
FIG. 10 is a block diagram illustrating a structure of an RFCPU which can be obtained using a semiconductor device of the present invention.
Figure 11A:
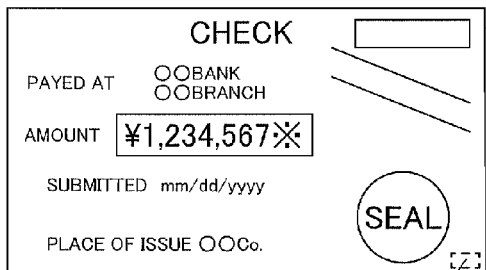
FIGS. 11A to 11G illustrate application examples of a semiconductor device of the present invention.
Figure 11B:
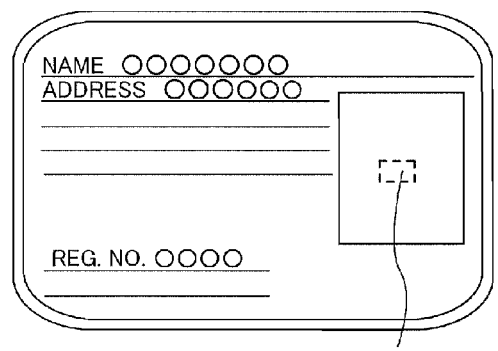
Figure 11C:
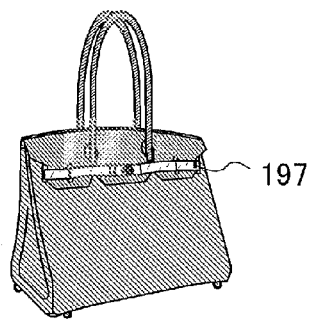
Figure 11D:
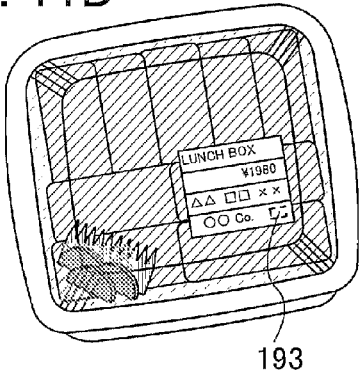
Figure 11E:
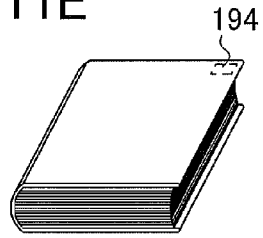
Figure 11F:
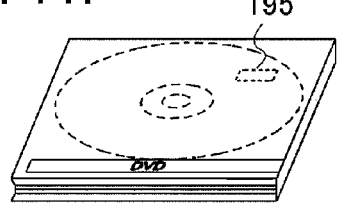
Figure 11G:
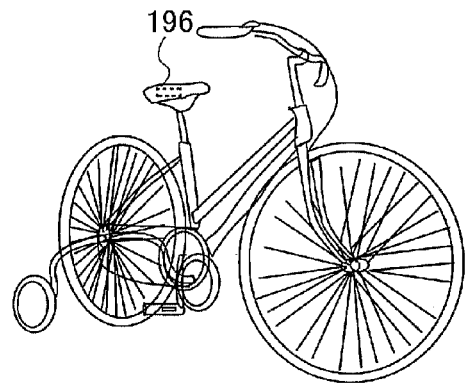

Next, an example of a semiconductor device provided with an arithmetic function by which data can be transmitted and received without contact is described with reference to FIG. 10. FIG. 10 illustrates an example of a computer which operates to transmit and receive signals to and from an external device by wireless communication (such a computer is hereinafter referred to as an RFCPU). An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over one substrate as the RFCPU 511 and may be attached as another component to a substrate having an insulating surface which is included in the RFCPU 511.

The reset circuit 517 generates a signal which resets the digital circuit portion 513 to be initialized. For example, a signal which rises after an increase in a power supply voltage is generated as the reset signal. The oscillator circuit 518 changes the frequency and the duty ratio of a clock signal in accordance with a control signal generated by the constant voltage circuit 516. The demodulation circuit 519 having a low pass filter, for example, binarizes changes in amplitude of received signals of an amplitude shift keying (ASK) system. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by the power supply control circuit 530.

A signal which is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method can be employed in which the read only memory 527 stores an operating system (OS) and a program is read and then executed at the time of starting operation. Alternatively, a method can be employed in which a circuit dedicated to arithmetic is formed as an arithmetic circuit and an arithmetic processing is conducted using hardware. In a method in which both hardware and software are used, a method can be employed in which a part of the process is conducted in the circuit dedicated to arithmetic and the other part of the arithmetic process is conducted by the central processing unit 525 using a program.

Since an integrated circuit is formed using semiconductor layers each of which has a certain crystal plane orientation which are bonded to a glass substrate in the RFCPU 511, higher processing speed and lower power consumption can be achieved. Accordingly, even when the capacitor portion 529 which supplies electric power is miniaturized, operation for a long period of time can be secured.

(Embodiment Mode 8)

This embodiment mode describes an example of a structure mounting a semiconductor device according to the present invention.

An integrated circuit according to the present invention can be formed in such a way that semiconductor elements are highly integrated in three dimensions. In such a highly integrated circuit, it is preferable to mount a heat sink which efficiently dissipates heat generated by the integrated circuit.

Figure 22A:
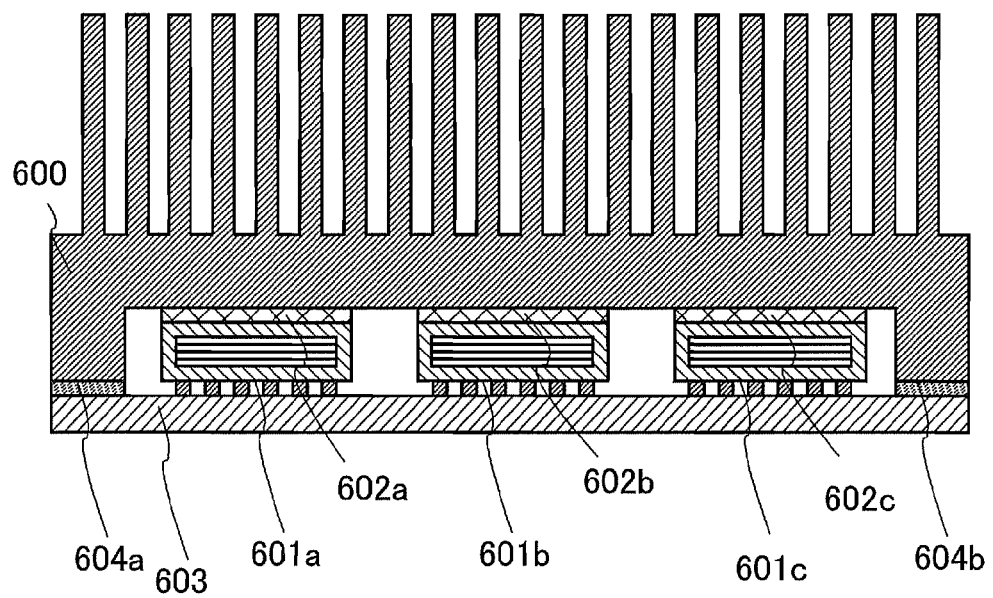
FIGS. 22A and 22B illustrate a semiconductor device of the present invention.

FIG. 22A illustrates a mode in which an integrated circuit is mounted on a printed circuit board as an example of a semiconductor device according to the present invention.

In FIG. 22A, integrated circuit packages 601a, 601b, and 601c in each of which an integrated circuit is packaged in an insulating chassis which are mounted on a printed circuit board 603 are provided in contact with a heat sink 600 via heat dissipation sheets 602a, 602b, and 602c which further improve a heat dissipation effect. The heat sink 600 is provided so as to cover the integrated circuit packages 601a, 601b, and 601c, and is electrically connected to the printed circuit board 603 via conductive metal layers 604a and 604b, and intercepts electromagnetic waves emitted from the integrated circuit packages 601a, 601b, and 601c. FIG. 22A illustrates a structure in which the heat sink which covers the integrated circuits can dissipate heat from the integrated circuits and can intercept electromagnetic waves to prevent electromagnetic interference.

Figure 22B:
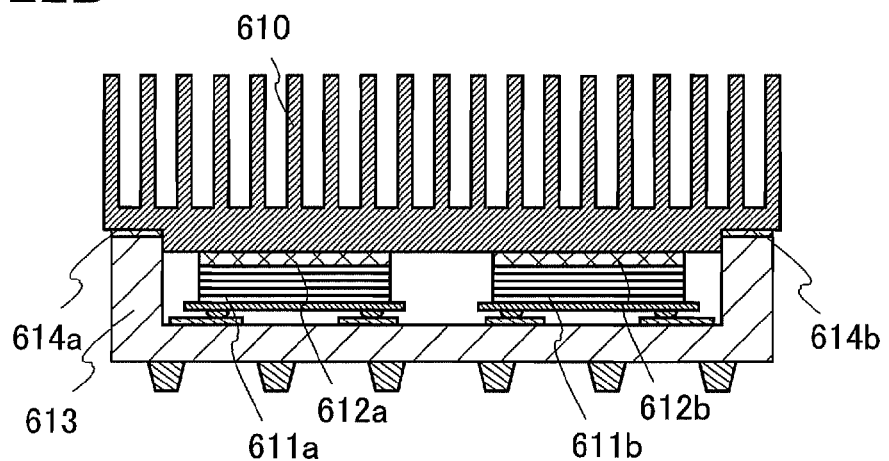

FIG. 22B illustrates an example in which a heat dissipation sheet and a heat sink are directly mounted on integrated circuits. In FIG. 22B, integrated circuits 611a and 611b are provided in contact with a heat sink 610 via heat dissipation sheets 612a and 612b, and are packaged by the heat sink 610 and a chassis 613 which adheres the heat sink 610 using adhesive layers 614a and 614b.

In this manner, when the heat sink is mounted, a semiconductor device with higher reliability and higher performance can be made by efficient heat dissipation and cooling.

This embodiment mode can be implemented in combination with any of the above embodiment modes, as appropriate.

(Embodiment Mode 9)

This embodiment mode describes an example of a usage mode of a semiconductor device described in the above embodiment modes. Specifically, an application example of a semiconductor device capable of inputting and outputting data without contact is described with reference to the drawings. The semiconductor device to and from which data can be input and output without contact is also referred to as an RFID tag, an ID tag, an IC tag, an IC chip, an RF tag, a wireless tag, an electronic tag, or a wireless chip depending on the uses.

Figure 12:
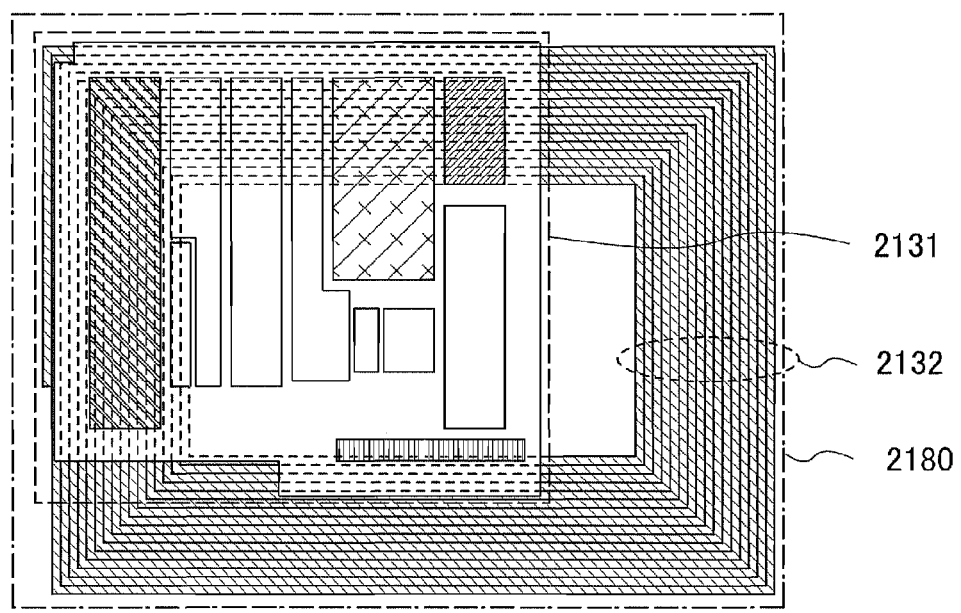
FIG. 12 illustrates a semiconductor device of the present invention.

An example of a top view structure of a semiconductor device of this embodiment mode is described with reference to FIG. 12. A semiconductor device 2180 illustrated in FIG. 12 includes a thin film integrated circuit 2131 including a plurality of elements such as transistors for forming a memory portion and a logic portion, and a conductive layer 2132 which serves as an antenna. The conductive layer 2132 which serves as an antenna is electrically connected to the thin film integrated circuit 2131. The field-effect transistor according to the present invention which is described in Embodiment Modes 1 to 3 can be applied to the thin film integrated circuit 2131. In the present embodiment mode, a plurality of semiconductor devices having a CMOS structure is employed in the integrated circuit 2131.

The structure of the semiconductor devices having the CMOS structure is described with reference to FIGS. 13A and 13B. The field-effect transistors included in CMOS structures 2140, 2141, 2142, and 2143 each have a sidewall structure in which a sidewall insulating layer 2150 is provided on the sidewall of the gate electrode layer 2151 in each of the field-effect transistors. These transistors also include low concentration impurity regions 2152 between a channel formation region 2153 and a source region and a drain region (2154a and 2154b), which are high concentration impurity regions, in a semiconductor layer. The CMOS structures 2140 and 2141 are formed of a distortion field-effect transistor in the lower layer and a distortion field-effect transistor in the upper layer which are stacked. The CMOS structures 2142 and 2143 are stacked and formed of distortion field-effect transistors, arrange in parallel, which are in contact with one insulating layer. The field-effect transistors included in the CMOS structures 2140 and 2141 are distortion field-effect transistors having high mobility in which distortion is caused to the channel formation region in the semiconductor layer by insulating films (2155, 2156) that covers the field-effect transistors.

In field-effect transistors which are included in the CMOS structure 2142 and the CMOS structure 2143, by controlling a distortion caused to a channel formation region of a semiconductor layer, a plane orientation of the semiconductor layer, and a crystal axis in a channel length direction, difference in mobility between an n-channel field-effect transistor and a p-channel field-effect transistor is reduced, and current driving capabilities and switching speeds of the n-channel field-effect transistor and the p-channel field-effect transistor become more comparable to each other. Therefore, an area occupied by the n-channel field-effect transistor and an area occupied by the p-channel field-effect transistor can be nearly comparable, whereby efficiency of circuit design is improved and smaller semiconductor devices with higher integration and higher performance can be provided.

Figure 13A:
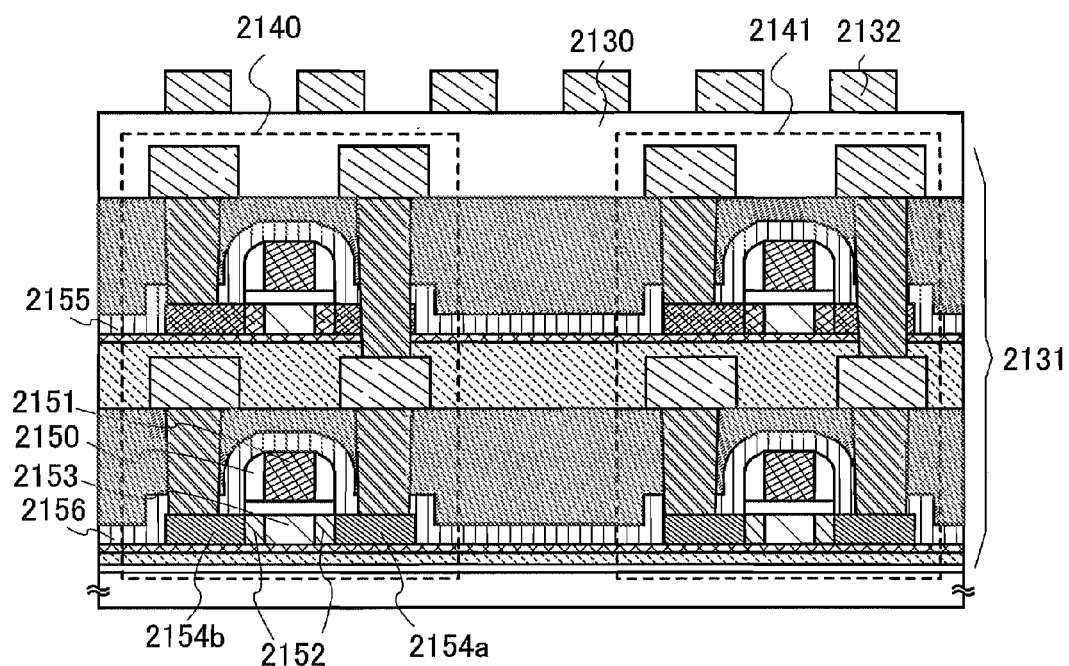
FIGS. 13A and 13B illustrate a semiconductor device of the present invention.
Figure 13B:
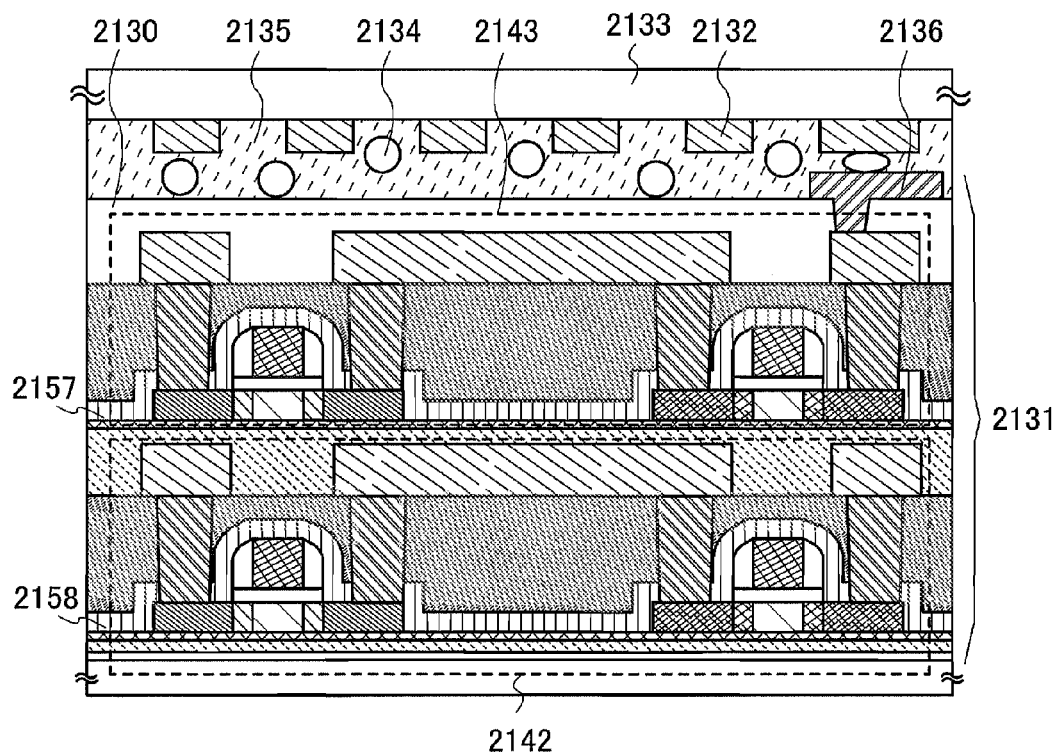

As shown in FIGS. 13A and 13B, since the semiconductor device of the present invention has a structure in which semiconductor elements are stacked three dimensionally and are highly integrated, the semiconductor elements can be aligned side by side and in contact with one insulating layer or they can be stacked vertically with an interlayer insulating layer interposed therebetween and be in contact with different insulating layers. Therefore, arrangement flexibility of semiconductor elements in the semiconductor device is high, which can lead to further integration and higher performance. As a semiconductor element, not to mention a field-effect transistor, a memory element which uses a semiconductor layer can be employed; accordingly, a semiconductor device which can satisfy functions required for various applications can be manufactured and provided.

As shown in FIGS. 13A and 13B, the conductive layer 2132 which serves as an antenna may be provided above the elements for forming the memory portion and the logic portion; for example, the conductive layer 2132 which serves as an antenna can be provided above the CMOS structures 2140 and 2141 which can be formed in a similar manner to the field-effect transistors described in the above embodiment modes with an insulating layer 2130 interposed therebetween (see FIG. 13A). Alternatively, the conductive layer 2132 which serves as an antenna may be provided by providing the conductive layer 2132 over a substrate 2133 and then attaching the substrate 2133 and the thin film integrated circuit 2131 each other so as to interpose the conductive layer 2132 (see FIG. 13B). FIG. 13B illustrates an example in which a conductive layer 2136 provided over the insulating layer 2130 and the conductive layer 2132 which serves as an antenna are electrically connected to each other with conductive particles 2134 contained in an adhesive resin 2135.

Note that, although this embodiment mode describes an example in which the conductive layer 2132 which serves as an antenna has a coil shape and either an electromagnetic induction method or an electromagnetic coupling method is employed, a semiconductor device of the present invention is not limited thereto, and a microwave method may be employed. In the case of a microwave method, the shape of the conductive layer 2132 which serves as an antenna may be decided as appropriate depending on the wavelength of an electromagnetic wave which is used.

For example, when a microwave method (e.g., with an UHF band (in the range of from 860 MHz to 960 MHz), a frequency band of 2.45 GHz, or the like) is employed as a signal transmission method of the semiconductor device 2180, the conductive layer which serves as an antenna can be formed into a linear shape (e.g., a dipole antenna), a flat shape (e.g., a patch antenna or an antenna having a ribbon shape), or the like. Further, the shape of the conductive layer 2132 which serves as an antenna is not limited to a straight line, and the conductive layer 2132 may be a curved line, in an S-shape, or in a shape combining them in consideration of the wavelength of the electromagnetic wave.

The conductive layer 2132 which serves as an antenna is formed of a conductive material by a CVD method, a sputtering method, a printing method such as screen printing or gravure printing, a droplet discharge method, a dispenser method, a plating method, or the like. The conductive material is any of a metal element selected from aluminum (Al), titanium (Ti), silver (Ag), copper (Cu), gold (Au), platinum (Pt), nickel (Ni), palladium (Pd), tantalum (Ta), molybdenum (Mo), or the like, or an alloy material or a compound containing the metal element. The conductive layer 2132 has a single layer structure or a stacked structure.

For example, in the case where the conductive layer 2132 which serves as an antenna is formed by a screen printing method, the conductive layer 2132 can be provided by selectively printing a conductive paste in which conductive particles with a grain diameter of several nanometers to several tens of micrometers are dissolved or dispersed in an organic resin. As the conductive particle, fine particles or dispersive nanoparticles of one or more metals of silver (Ag), gold (Au), copper (Cu), nickel (Ni), platinum (Pt), palladium (Pd), tantalum (Ta), molybdenum (Mo), titanium (Ti), or a silver halide can be used. In addition, as the organic resin contained in the conductive paste, one or a plurality of organic resins serving as a binder, a solvent, a dispersant, or a coating of the metal particle can be used. Typically, an organic resin such as an epoxy resin and a silicone resin can be given as examples. Further, in forming the conductive layer, baking may be preferably performed after the conductive paste is applied. For example, in the case of using fine particles (e.g., fine particles with a grain diameter of 1 nm or more and 100 nm or less) containing silver as a main component of the conductive paste, the conductive layer can be formed by baking the conductive paste in a temperature range of from 150 to 300° C. to solidify it. Alternatively, fine particles containing solder or lead-free solder as a main component may be used. In that case, fine particles having a grain diameter of 20 μm or less are preferably used. Solder or lead-free solder has advantages such as low cost.

Low power consumption and higher integration can be realized in the semiconductor device to which the present invention is applied. Therefore, the present invention is effective for a small semiconductor device to and from which data can be input and output without contact as described in this embodiment mode.

(Embodiment Mode 10)

This embodiment mode describes an example of application of the above-described semiconductor device capable of inputting and outputting data without contact, which is formed according to the present invention, with reference to the drawings. The semiconductor device to and from which data can be input and output without contact is also referred to as an RFID tag, an ID tag, an IC tag, an IC chip, an RF tag, a wireless tag, an electronic tag, or a wireless chip depending on the uses.

Figure 14A:
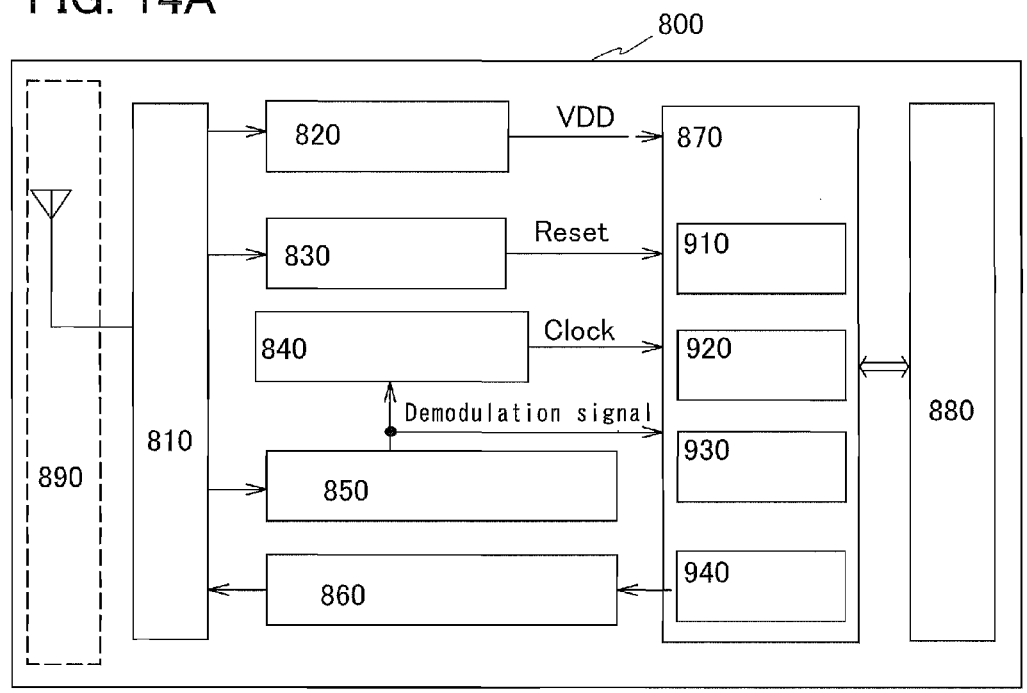
FIGS. 14A to 14C illustrate application examples of a semiconductor device of the present invention.

A semiconductor device 800 has a function of communicating data without contact, and includes a high-frequency circuit 810, a power supply circuit 820, a reset circuit 830, a clock generating circuit 840, a data demodulation circuit 850, a data modulation circuit 860, a control circuit 870 which controls another circuit, a memory circuit 880, and an antenna 890 (see FIG. 14A). The high-frequency circuit 810 receives a signal from the antenna 890, and outputs a signal, which is received from the data modulation circuit 860, from the antenna 890. The power supply circuit 820 generates a power supply potential from a received signal. The reset circuit 830 generates a reset signal. The clock generating circuit 840 generates various clock signals based on a received signal input from the antenna 890. The data demodulation circuit 850 demodulates a received signal and outputs the demodulated signal to the control circuit 870. The data modulation circuit 860 modulates a signal received from the control circuit 870. In the control circuit 870, a code extraction circuit 910, a code determination circuit 920, a CRC determination circuit 930, and an output unit circuit 940 are included, for example. Note that the code extraction circuit 910 is a circuit which extracts a plurality of codes included in an instruction transmitted to the control circuit 870. The code determination circuit 920 is a circuit which judges the content of the instruction by comparing the extracted code with a reference code. The CRC determination circuit 930 is a circuit which detects the presence of transmission errors and the like based on the judged code.

Next, one example of an operation of the above-described semiconductor device is described. First, a radio signal is received by the antenna 890. When the radio signal is transmitted to the power supply circuit 820 through the high-frequency circuit 810, the power supply circuit 820 generates a high power supply potential (hereinafter referred to as VDD). The VDD is supplied to each circuit in the semiconductor device 800. A signal transmitted to the data demodulation circuit 850 through the high-frequency circuit 810 is demodulated (hereinafter, such a signal is referred to as a demodulated signal). Moreover, signals passed through the reset circuit 830 and the clock generating circuit 840 through the high-frequency circuit 810, and the demodulated signal are transmitted to the control circuit 870. The signal transmitted to the control circuit 870 is analyzed by the code extraction circuit 910, the code determination circuit 920, the CRC determination circuit 930, and the like. Then, based on the analyzed signals, information of the semiconductor device stored in the memory circuit 880 is output. The output information of the semiconductor device is encoded through the output unit circuit 940. Furthermore, the encoded infoimation of the semiconductor device 800 is transmitted by the antenna 890 as a radio signal through the data modulation circuit 860.

Note that a low power supply potential (hereinafter referred to as VSS) is common in the plurality of circuits included in the semiconductor device 800 and VSS can be GND.

In this manner, data in the semiconductor device can be read by transmitting a signal to the semiconductor device 800 from a communication device and by receiving a signal which is transmitted from the semiconductor device 800 with the communication device.

The semiconductor device 800 may be either a type where no power supply (battery) is built-in but an electromagnetic wave is used to supply a power supply voltage to each circuit, or a type where both an electromagnetic wave and a power supply (battery) are used to generate a power supply voltage for each circuit.

Figure 14B:
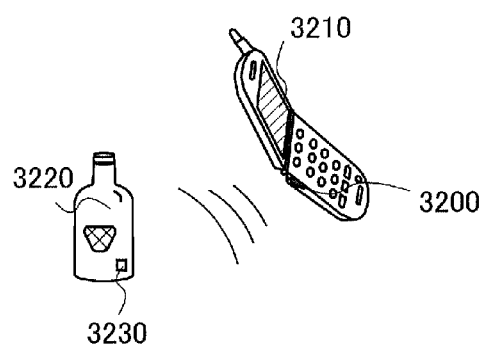
Figure 14C:
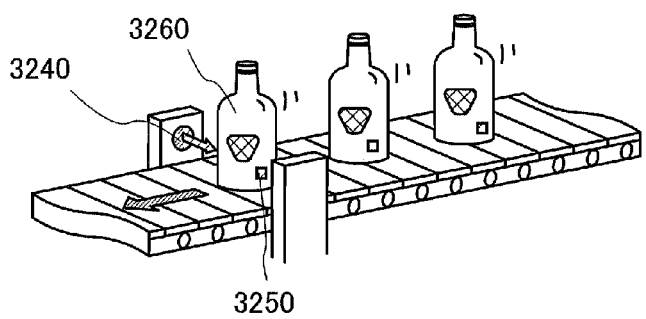

Next, an example of usage of a semiconductor device in which data can be input and output without contact is described. A side surface of a mobile terminal which includes a display portion 3210 is provided with a communication device 3200. A side surface of a product 3220 is provided with a semiconductor device 3230 (see FIG. 14B). When the communication device 3200 is held up to the semiconductor device 3230 included in the product 3220, the display portion 3210 displays information about the product, such as its materials, its place of production, inspection results for each production step, a history of the distribution process, and a description of the product. Further, when a product 3260 is conveyed by a conveyer belt, the product 3260 can be inspected by using a communication device 3240 and a semiconductor device 3250 with which the product 3260 is provided (see FIG. 14C). By application of a semiconductor device to such a system, acquisition of information can be performed easily, and high function and high added value can be realized. Further, since a semiconductor device according to the present invention can realize lower power consumption and high integration, a semiconductor device provided for a product can be miniaturized.

As described above, a semiconductor device of the present invention has a very wide range of application, and can be used in electronic devices in various kinds of fields.

(Embodiment Mode 11)

According to the present invention, a semiconductor device serving as a chip having a processor circuit (hereinafter also referred to as a processor chip, a wireless chip, a wireless processor, a wireless memory, or a wireless tag) can be formed. The semiconductor device of the present invention has a wide range of uses. The semiconductor device can be applied to any product of which information such as history is clarified without contact and made use of in production, management, and so on of the product. For example, a semiconductor device of the present invention can be provided and used for bills, coins, securities, certificates, bearer bonds, packing containers, books, storage media, personal belongings, vehicles, groceries, garments, health products, daily commodities, chemicals, electronic devices, or the like. Examples of them are described with reference to FIGS. 11A to 11G.

Bills and coins are currency in the market and include notes which are circulating as the real money in specific areas (cash vouchers), memorial coins, and the like. The securities refer to checks, certificates, promissory notes, and the like, and can be provided with a chip 190 including a processor circuit (see FIG. 11A). The certificates refer to driver's licenses, certificates of residence, and the like, and can be provided with a chip 191 including a processor circuit (see FIG. 11B). The personal belongings refer to bags, a pair of glasses, and the like, and can be provided with a chip 197 including a processor circuit (see FIG. 11C). The bearer bonds refer to stamps, rice coupons, various gift certificates, and the like. The packing containers refer to wrapping paper for food containers and the like, plastic bottles, and the like, and can be provided with a chip 193 including a processor circuit (see FIG. 11D). The books refer to hardbacks, paperbacks, and the like, and can be provided with a chip 194 including a processor circuit (see FIG. 11E). The storage media refer to DVD software, video tapes, and the like, and can be provided with a chip 195 including a processor circuit (see FIG. 11F). The vehicles refer to wheeled vehicles such as bicycles, ships, and the like, and can be provided with a chip 196 including a processor circuit (see FIG. 11G). The groceries refer to food goods, drinks, and the like. The garments refer to clothes, shoes, and the like. The health products refer to medical appliances, health appliances, and the like. The daily commodities refer to furniture, lighting apparatuses, and the like. The chemicals refer to medical drugs, agrochemicals, and the like. The electronic devices refer to liquid crystal display devices, EL display devices, television devices (television receivers and flat-screen television receivers), cellular phones, and the like.

Such a semiconductor device can be provided by being attached to the surface of goods or being embedded in goods. For example, in the case of a book, the semiconductor device may be embedded in a piece of paper; in the case of a package made from an organic resin, the semiconductor device may be embedded in the organic resin.

As described above, the efficiency of an inspection system, a system used in a rental shop, or the like can be improved by providing the semiconductor device for packing containers, storage media, personal belongings, groceries, garments, daily commodities, electronic devices, or the like. Further, the semiconductor device being provided for vehicles can prevent forgery or theft of the vehicles. By implanting the semiconductor devices in creatures such as animals, identification of the individual creature can be easily carried out. For example, by implanting or attaching the semiconductor device with a sensor in or to a creature such as livestock, its health condition such as a current body temperature as well as its birth year, sex, breed, or the like can be easily managed.

Note that this embodiment mode can be implemented in combination with any of Embodiment Modes 1 to 10, as appropriate.

This application is based on Japanese Patent Application serial No. 2007-244821 filed with Japan Patent Office on Sep. 21, 2007, the entire contents of which are hereby incorporated by reference.

What is claimed is:

1. A semiconductor device comprising:
   a conductive layer functioning as an antenna;
   a first CMOS structure over a substrate; and
   a second CMOS structure over the substrate,
   wherein each of the first CMOS structure and the second CMOS structure comprises:
   a first transistor having a first semiconductor layer over the substrate;
   a first insulating film over the first transistor;
   a first interlayer insulating layer over the first insulating film;
   a second transistor having a second semiconductor layer over the first interlayer insulating layer;
   a second insulating film over the second transistor; and
   a second interlayer insulating layer over the second insulating film,
   wherein the first semiconductor layer is bonded to the substrate with a first insulating layer interposed between the substrate and the first semiconductor layer, wherein the second semiconductor layer is bonded to the first interlayer insulating layer with a second insulating layer interposed between the second semiconductor layer and the first interlayer insulating layer,
wherein the first transistor is an n-channel transistor and the second transistor is a p-channel transistor, and
wherein the second insulating film has a compressive stress, and
wherein the conductive layer functioning as an antenna is provided over at least one of the first CMOS structure and the second CMOS structure with a third insulating layer interposed therebetween.

2. The semiconductor device according to claim 1,
wherein the first semiconductor layer and the second semiconductor layer are overlapped with each other with the first interlayer insulating layer interposed therebetween, and the first transistor and the second transistor are electrically connected to each other by a wiring which is formed in an opening which penetrates the second insulating film, the second semiconductor layer, the second insulating layer, the first interlayer insulating layer, the first insulating film, and reaches the first semiconductor layer.

3. The semiconductor device according to claim 1,
wherein crystal plane orientations of surfaces of the first semiconductor layer and the second semiconductor layer, which are parallel to the substrate surface, are {110}.

4. The semiconductor device according to claim 3,
wherein crystal axes of a channel length direction of the first semiconductor layer and the second semiconductor layer are <110>.

5. The semiconductor device according to claim 1,
wherein a channel formation region of the first semiconductor layer is distorted due to a stress of the first insulating film.

6. The semiconductor device according to claim 1,
wherein the first insulating film and the second insulating film are silicon nitride films or silicon nitride oxide films.

7. The semiconductor device according to claim 1,
wherein each of the first interlayer insulating layer and the second interlayer insulating layer comprises a silicon oxide film or a silicon oxynitride film.

8. The semiconductor device according to claim 1,
wherein the first insulating layer and the second insulating layer are silicon oxide films which are formed by a chemical vapor deposition method using an organosilane gas.

9. The semiconductor device according to claim 1,
wherein the substrate is a glass substrate.

10. The semiconductor device according to claim 1,
wherein each of the first semiconductor layer and the second semiconductor layer is a single-crystal semiconductor layer.

11. The semiconductor device according to claim 1,
wherein difference in mobility between the first transistor and the second transistor is reduced by causing a distortion in a channel length direction of the second semiconductor layer of the second transistor.

12. A semiconductor device comprising:
a conductive layer functioning as an antenna;
a first CMOS structure over a substrate; and
a second CMOS structure over the substrate,
wherein each of the first CMOS structure and the second CMOS structure comprises:

a first transistor having a first semiconductor layer over the substrate;
a first insulating film over the first transistor;
a first interlayer insulating layer over the first insulating film;
a second transistor having a second semiconductor layer over the first interlayer insulating layer;
a second insulating film over the second transistor; and
a second interlayer insulating layer over the second insulating film,
wherein the first semiconductor layer is bonded to the substrate with a first insulating layer interposed between the substrate and the first semiconductor layer,
wherein the second semiconductor layer is bonded to the first interlayer insulating layer with a second insulating layer interposed between the second semiconductor layer and the first interlayer insulating layer,
wherein the first transistor is a p-channel transistor and the second transistor is an n-channel transistor, and
wherein the first insulating film has a compressive stress, and
wherein the conductive layer functioning as an antenna is provided over at least one of the first CMOS structure and the second CMOS structure with a third insulating layer interposed therebetween.

13. The semiconductor device according to claim 12,
wherein crystal plane orientations of surfaces of the first semiconductor layer and the second semiconductor layer, which are parallel to the substrate surface, are {110}.

14. The semiconductor device according to claim 13,
wherein crystal axes of a channel length direction of the first semiconductor layer and the second semiconductor layer are <110>.

15. The semiconductor device according to claim 12,
wherein a channel formation region of the second semiconductor layer is distorted due to a stress of the second insulating film.

16. The semiconductor device according to claim 12,
wherein the first insulating film and the second insulating film are silicon nitride films or silicon nitride oxide films.

17. The semiconductor device according to claim 12,
wherein each of the first interlayer insulating layer and the second interlayer insulating layer comprises a silicon oxide film or a silicon oxynitride film.

18. The semiconductor device according to claim 12,
wherein the first insulating layer and the second insulating layer are silicon oxide films which are formed by a chemical vapor deposition method using an organosilane gas.

19. The semiconductor device according to claim 12,
wherein the substrate is a glass substrate.

20. The semiconductor device according to claim 12,
wherein each of the first semiconductor layer and the second semiconductor layer is a single-crystal semiconductor layer.

21. The semiconductor device according to claim 12,
wherein difference in mobility between the first transistor and the second transistor is reduced by causing a distortion in a channel length direction of the first semiconductor layer of the first transistor.

22. A semiconductor device comprising:
a conductive layer functioning as an antenna;
a first CMOS structure; and
a second CMOS structure, wherein each of the first CMOS structure and the second CMOS structure comprises:
a first transistor having a first semiconductor layer and a second transistor having a second semiconductor layer,
a first insulating film over the first transistor;
a second insulating film over the second transistor;
a first interlayer insulating layer over the first insulating film and the second insulating film;
a first wiring over the first interlayer insulating layer;
the first semiconductor layer and the second semiconductor layer are electrically connected by the first wiring, a second wiring in a first opening and a third wiring in a second opening in the first interlayer insulating layer,
a second interlayer insulating layer over the first wiring;
wherein the first transistor is an n-channel transistor and the second transistor is a p-channel transistor, and
wherein the second insulating film has a compressive stress,
wherein the first transistor and the second transistor of the first CMOS structure is bonded to a substrate,
wherein the first transistor and the second transistor of the second CMOS structure is bonded to the second interlayer insulating layer of the first CMOS structure, and
wherein the conductive layer functioning as an antenna is bonded to the second interlayer insulating layer of the second CMOS structure.

23. The semiconductor device according to claim 22,
wherein each of the first semiconductor layer and the second semiconductor layer is a single-crystal semiconductor layer.

24. The semiconductor device according to claim 22,
wherein difference in mobility between the first transistor and the second transistor is reduced by causing a distortion in a channel length direction of the second semiconductor layer of the second transistor.

* * * * *